United States Patent
Carroll

(10) Patent No.: US 10,566,536 B2
(45) Date of Patent: Feb. 18, 2020

(54) OPTOELECTRONIC DEVICES AND APPLICATIONS THEREOF

(75) Inventor: David L Carroll, Winston Salem, NC (US)

(73) Assignee: WAKE FORSET UNIVERSITY, Winston-Salem, NC (US)

( * ) Notice: Subject to any disclaimer, the term of this patent is extended or adjusted under 35 U.S.C. 154(b) by 1552 days.

(21) Appl. No.: 14/232,080

(22) PCT Filed: Jul. 12, 2012

(86) PCT No.: PCT/US2012/046412
§ 371 (c)(1),
(2), (4) Date: Apr. 29, 2014

(87) PCT Pub. No.: WO2013/009958
PCT Pub. Date: Jan. 17, 2013

(65) Prior Publication Data
US 2014/0252332 A1    Sep. 11, 2014

Related U.S. Application Data

(60) Provisional application No. 61/506,855, filed on Jul. 12, 2011, provisional application No. 61/591,721, filed on Jan. 27, 2012.

(51) Int. Cl.
*H01L 51/00*    (2006.01)
*H01L 51/50*    (2006.01)
(Continued)

(52) U.S. Cl.
CPC .......... *H01L 51/0035* (2013.01); *B82Y 10/00* (2013.01); *C09K 11/06* (2013.01);
(Continued)

(58) Field of Classification Search
None
See application file for complete search history.

(56) References Cited

U.S. PATENT DOCUMENTS 6,210,817 B1    4/2001    Igarashi
6,833,201 B2    12/2004   Czerw et al.
(Continued)

FOREIGN PATENT DOCUMENTS

GB    2 456 788 A    7/2009
JP    H0845669 A     2/1996
(Continued)

OTHER PUBLICATIONS

Aiamsen P. et al., "Synthesis and Electroluminescence properties of Polyfluorene derivatives for light-emitting diodes," Nano/Micro Engineered and Molecular Systems (NEMS), 2010 5th IEEE International Conference ON, IEEE, Piscataway, NJ, USA, Jan. 20, 2010, pp. 21-25 (5 pages), XP031918182, DOI: 10.1109/NEMS.2010.5592129; ISBN: 978-1-4244-6543-9.
(Continued)

*Primary Examiner* — Jay Yang
(74) *Attorney, Agent, or Firm* — J. Clinton Wimbish; Nexsen Pruet PLLC

(57) ABSTRACT

In one aspect, optoelectronic devices are described herein. In some embodiments, an optoelectronic device described herein comprises a first electrode, a second electrode and a light emitting composite layer disposed between the first electrode and the second electrode. A dielectric layer, in some embodiments, is disposed between the light emitting composite layer and the first electrode and/or second electrode.

19 Claims, 9 Drawing Sheets

(51) Int. Cl.
H05B 33/14 (2006.01)
C09K 11/06 (2006.01)
B82Y 10/00 (2011.01)

(52) U.S. Cl.
CPC ...... *H01L 51/5012* (2013.01); *H01L 51/5016* (2013.01); *H05B 33/14* (2013.01); *C08G 2261/1414* (2013.01); *C08G 2261/312* (2013.01); *C08G 2261/3142* (2013.01); *C08G 2261/3246* (2013.01); *C08G 2261/364* (2013.01); *C08G 2261/95* (2013.01); *C09K 2211/1466* (2013.01); *H01L 51/0039* (2013.01); *H01L 51/0043* (2013.01); *H01L 51/0048* (2013.01); *H01L 51/0085* (2013.01); *H01L 2251/5376* (2013.01); *H01L 2251/564* (2013.01)

(56) References Cited

U.S. PATENT DOCUMENTS

| | | |
|---|---|---|
| 2004/0018379 A1 | 1/2004 | Kinlen |
| 2005/0186106 A1 | 8/2005 | Li et al. |
| 2006/0105200 A1* | 5/2006 | Poplavskyy ........... B82Y 10/00 428/690 |
| 2008/0007157 A1 | 1/2008 | Carroll et al. |

FOREIGN PATENT DOCUMENTS

| | | |
|---|---|---|
| JP | 2004-531867 A | 10/2004 |
| JP | 2005-116503 A | 4/2005 |
| JP | 2005-535077 A | 11/2005 |
| JP | 2008-019415 A | 1/2008 |
| JP | 2009-094124 A | 4/2009 |
| WO | 03/020790 A2 | 3/2003 |
| WO | 2012009344 A1 | 1/2012 |

OTHER PUBLICATIONS

Hang Ken Lee et al., "White-light-emitting doides using miscible polymer blend doped with phosphorescent dye," Organic Electronics, Elsevier, Amsterdam, NL, vol. 12, No. 6, Mar. 5, 2011, pp. 891-896 (5 pages); XP028201847; ISSN: 1566-1199; DOI: 10.1016/J.ORGEL.2011.03.001.

Lee S-B et al., "Emission Mechanism of Double-Insulating Organic Electroluminescence Device Driven at AC Voltage," Japanese Journal of Applied Physics, The Japan Society of Applied Physics, Tokyo, JP, vol. 44, No. 9A, Sep. 1, 2005, pp. 6607-6611 (5 pages), XP001237051; ISSN: 0021-4922; DOI: 10.1143/JJAP.44.6607.

Japanese Office Action issued in corresponding Japanese Application No. 2014-520308, dated May 24, 2016.

Patent Examination Report No. 1 issued in corresponding Australian Application No. 2012281140, dated Feb. 21, 2015.

Aiamsen, P. et al., "Synthesis and Electroluminescence Properties of Polyfluorene Derivatives for Light-Emitting Diodes", Proceedings of the 2010 5th IEEE International Conference on Nano/Micro Engineered and Molecular Systems, Jan. 20-23, 2010, pp. 21-25.

Egbe, D., et al., "Effect of Styryl Side Groups on the Photophysical Properties and Hole Mobility of PPE-PPV Systems", Macromolecules, vol. 40, No. 22, Oct. 4, 2007, pp. 7786-7794.

International Preliminary Report on Patentability issued in corresponding International Application No. PCT/US2011/043690 dated Jan. 15, 2013.

Communication pursuant to Rules 161(1) and 162 EPC issued in corresponding European Application No. 12737455.1 dated Feb. 19, 2014.

Notification of the First Office Action issued in corresponding Chinese Application No. 2012800441484 dated Sep. 6, 2015.

Notification of the Second Office Action issued in corresponding Chinese Application No. 2012800441484 dated May 5, 2016.

* cited by examiner

OPTOELECTRONIC DEVICES AND APPLICATIONS THEREOF

RELATED APPLICATION DATA

The present application is the national stage application under 35 U.S.C. § 371 of International Application No. PCT/US2012/046412, filed Jul. 12, 2012, which claims priority pursuant to 35 U.S.C. § 119(e) to U.S. Provisional Patent Application 61/506,855, filed Jul. 12, 2011 and U.S. Provisional Patent Application 61/591,721, filed Jan. 27, 2012, each of which are hereby incorporated by reference in its entirety.

STATEMENT OF GOVERNMENT LICENSE RIGHTS

This invention was made through the support of the Department of Defense—United States Air Force Office of Scientific Research (AFOSR) Grant No. FA9550-04-1-0161. The Federal Government retains certain license rights in this invention.

FIELD

The present invention is related to optoelectronic devices and, in particular, to light emitting optoelectronic devices.

BACKGROUND

Organic thin films have been heavily investigated in recent years due to their application in optoelectronic devices such as organic light emitting devices (OLEDs), photovoltaic devices and organic photodetectors.

Optoelectronic devices based on organic materials, including organic thin films, are becoming increasingly desirable in a wide variety of applications for a number of reasons. For example, materials used to construct organic optoelectronic devices are relatively inexpensive in comparison to their inorganic counterparts, thereby providing cost advantages over optoelectronic devices produced with inorganic materials. Moreover, organic materials provide desirable physical properties such as flexibility, permitting their use in applications unsuitable for rigid inorganic materials.

Current devices based on light emitting organic materials, however, have several disadvantages that limit their application in certain fields. Some light emitting polymers, for example, have breakdown voltages at relatively low fields, limiting the charge injection and lifetime of some devices. In addition, some organic materials and device structures require complex and/or expensive fabrication methods to obtain sufficiently thin films of emitting material for lighting applications.

SUMMARY

In one aspect, optoelectronic devices are described herein. In some embodiments, an optoelectronic device described herein comprises a first electrode, a second electrode and a light emitting composite layer disposed between the first electrode and the second electrode. In some embodiments, the first electrode and/or second electrode is radiation transmissive. As described further herein, the light emitting composite layer can demonstrate a variety of constructions.

In some embodiments, an electrically insulating or dielectric layer is positioned between the light emitting composite layer and first electrode. A dielectric layer, in some embodiments, is positioned between the light emitting composite layer and the second electrode. In some embodiments, a first dielectric layer is positioned between the first electrode and the light emitting composite layer, and a second dielectric layer is deposited between the second electrode and the light emitting composite layer. In some embodiments, when one or more dielectric layers are positioned between the light emitting composite layer and first electrode and/or second electrode, the optoelectronic device is a field induced polymer electroluminescent device (FIPEL). Alternatively, in some embodiments wherein a dielectric layer is not disposed between the light emitting composite layer and first and/or second electrodes, the optoelectronic device is an organic light emitting diode (OLED).

In another aspect, an optoelectronic device described herein comprises a first electrode, a second electrode and a light emitting composite layer disposed between the first electrode and the second electrode, the light emitting composite layer comprising a luminescent phase disposed in a dielectric or electrically insulating host. In some embodiments, the luminescent phase comprises a conjugated polymer, a semiconducting polymer, small molecules or nanoparticles or mixtures thereof. Additionally, in some embodiments, a dielectric layer is positioned between the light emitting composite layer and first and/or second electrode. The first and/or second electrode can be radiation transmissive.

In another aspect, methods of making optoelectronic devices are described herein. In some embodiments, a method of making an optoelectronic device comprises providing a first electrode, providing a second electrode and disposing a composite light emitting layer between the first electrode and the second electrode. As described further herein, the light emitting composite layer can demonstrate a variety of constructions. In some embodiments, the first electrode and/or the second electrode is radiation transmissive. Additionally, in some embodiments, a method described herein further comprises disposing a dielectric layer between the first electrode and the light emitting composite layer, or disposing a dielectric layer between the second electrode and the light emitting composite layer. In some embodiments, a first dielectric layer is disposed between the light emitting composite layer and the first electrode, and a second dielectric layer is disposed between the second electrode and the light emitting composite layer.

In some embodiments, a method of making an optoelectronic device comprises disposing a luminescent phase in a dielectric or electrically insulating host to provide a light emitting composite layer and disposing the light emitting composite layer between a first electrode and a second electrode. In some embodiments, the first electrode and/or the second electrode is radiation transmissive. The luminescent phase, in some embodiments, comprises a conjugated polymer, a semiconducting polymer, small molecules or nanoparticles or mixtures thereof. Additionally, in some embodiments, a dielectric layer or electrically insulating layer is positioned between the light emitting composite layer and first and/or second electrode.

These and other embodiments are described in greater detail in the detailed description which follows.

DETAILED DESCRIPTION

Figure 1:
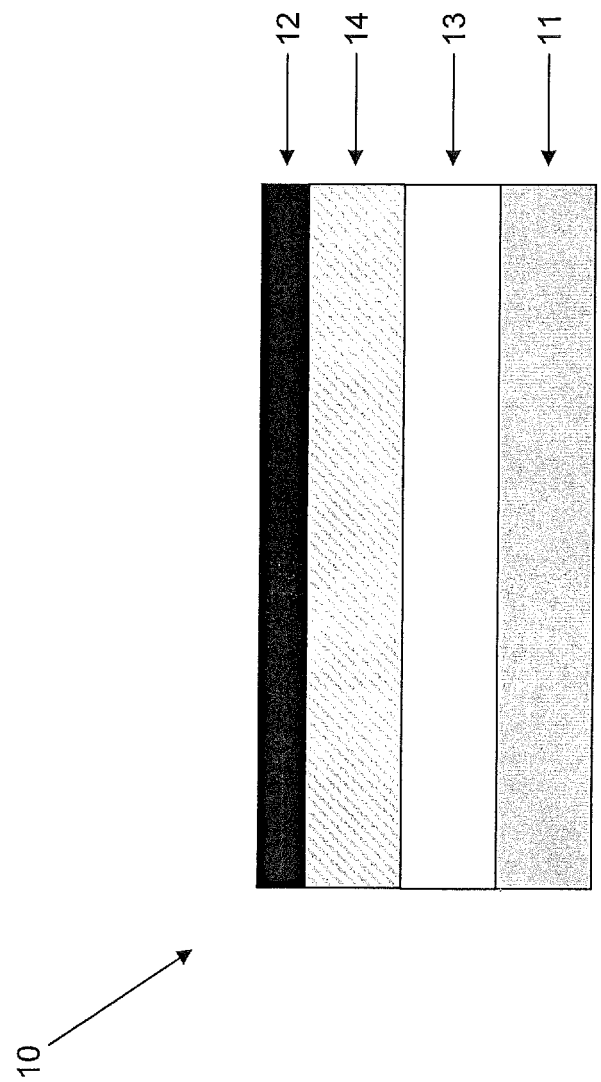
FIG. 1 illustrates a cross-sectional view of an optoelectronic device according to one embodiment described herein.

Embodiments described herein can be understood more readily by reference to the following detailed description, examples and drawings. Elements, apparatus, and methods described herein, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

In addition, all ranges disclosed herein are to be understood to encompass any and all subranges subsumed therein. For example, a stated range of "1.0 to 10.0" should be considered to include any and all subranges beginning with a minimum value of 1.0 or more and ending with a maximum value of 10.0 or less, e.g., 1.0 to 5.3, or 4.7 to 10.0, or 3.6 to 7.9.

The term "alkyl" as used herein, alone or in combination, refers to a straight or branched chain saturated hydrocarbon radical having from 1-20 carbon atoms. In some embodiments, for example, alkyl is $C_{8-12}$ alkyl.

The term "alkenyl" as used herein, alone or in combination, refers to a straight or branched chain hydrocarbon radical containing from 2-20 carbon atoms and at least one carbon-carbon double bond. In some embodiments, for example, alkenyl comprises $C_{8-12}$ alkenyl.

The term "aryl" as used herein, alone or in combination, refers to an aromatic ring system radical. Aryl is also intended to include partially hydrogenated derivatives of carbocyclic systems.

The term "heteroaryl" as used herein, alone or in combination, refers to an aromatic ring radical with for instance 5 to 7 member atoms, or to an aromatic ring system radical with for instance from 7 to 18 member atoms, containing one or more heteroatoms selected from nitrogen, oxygen, or sulfur heteroatoms, wherein N-oxides and sulfur monoxides and sulfur dioxides are permissible heteroaromatic substitutions; such as, e.g., furanyl, thienyl, thiophenyl, pyrrolyl, imidazolyl, pyrazolyl, triazolyl, tetrazolyl, thiazolyl, oxazolyl, isoxazolyl, oxadiazolyl, thiadiazolyl, isothiazolyl, pyridinyl, pyridazinyl, pyrazinyl, pyrimidinyl, quinolinyl, isoquinolinyl, benzofuranyl, benzothiophenyl, indolyl, and indazolyl, and the like. Heteroaryl is also intended to include the partially hydrogenated derivatives of the heterocyclic systems.

In one aspect, optoelectronic devices are described herein. In some embodiments, optoelectronic devices described herein display FIPEL architectures. Alternatively, in some embodiments, optoelectronic devices described herein demonstrate organic light emitting device (OLED) architectures.

I. Field Induced Polymer Electroluminescent Device (FIPEL)

In some embodiments, a FIPEL described herein comprises a first electrode and a second electrode and a light emitting composite layer disposed between the first electrode and the second electrode. An electrically insulating or dielectric layer is positioned between the light emitting composite layer and the first electrode or second electrode. Moreover, in some embodiments, a first dielectric layer is positioned between the first electrode and the light emitting composite layer, and a second dielectric layer is positioned between the second electrode and the light emitting composite layer. In some embodiments, the first electrode is radiation transmissive and the second electrode is non-radiation transmissive and/or reflective. Alternatively, in some embodiments, the first electrode and the second electrode are radiation transmissive.

In some embodiments, a FIPEL described herein comprises a plurality of light emitting composite layers positioned between the first and second electrodes. For example, in some embodiments, a plurality of light emitting layers, each having a construction described in Section(s) I(C)(i)-(ii) herein, are positioned between the first and second electrodes. The light emitting layers can have various emission profiles that, when combined, provide the desired emission profile characteristics from the FIPEL.

FIG. 1 illustrates a cross-sectional view of an optoelectronic device having a FIPEL architecture according to one embodiment described herein. The FIPEL (10) illustrated in FIG. 1 comprises a radiation transmissive first electrode (11) and a metal second electrode (12). A light emitting composite layer (13) is disposed between the radiation transmissive first electrode (11) and metal second electrode (12). The light emitting composite layer (13) can have any construction recited in Section I(C) herein. In the embodiment of FIG. 1, a dielectric layer (14) or electrically insulating layer (14) is disposed between the metal second electrode (12) and the light emitting composite layer (13).

Figure 2:
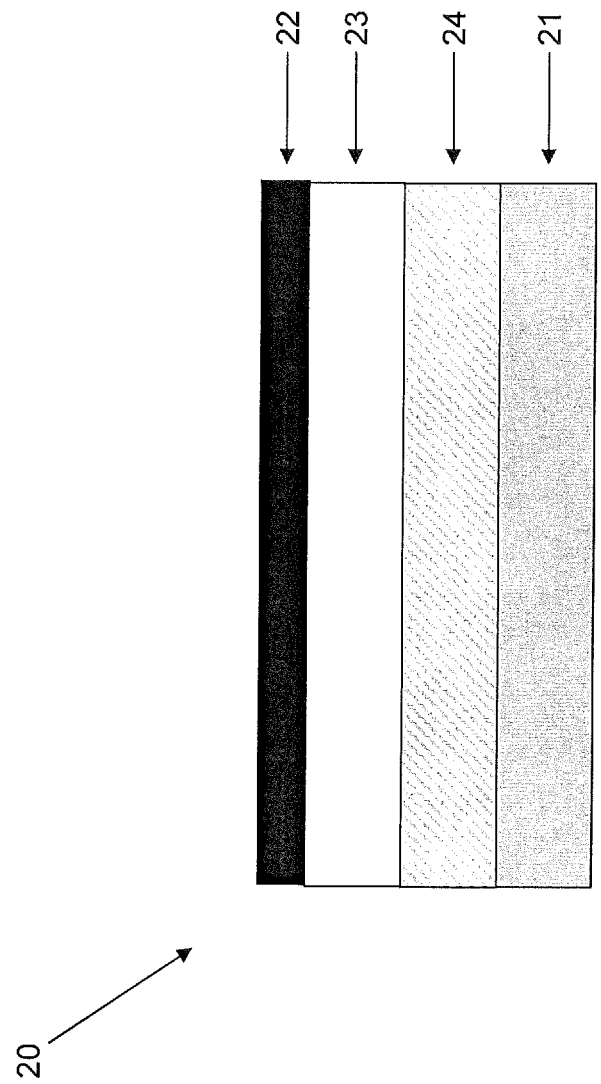
FIG. 2 illustrates a cross-sectional view of an optoelectronic device according to one embodiment described herein.

FIG. 2 illustrates a cross-sectional view of an optoelectronic device having a FIPEL architecture according to one embodiment described herein. The FIPEL (20) illustrated in FIG. 2 comprises a radiation transmissive first electrode (21) and a metal second electrode (22). A light emitting composite layer (23) is disposed between the radiation transmissive first electrode (21) and metal second electrode (22). The light emitting composite layer (23) can have any construction recited in Section I(C) herein. In the embodiment of FIG. 2, a dielectric layer (24) or electrically insulating layer (24) is disposed between the radiation transmissive first electrode (21) and the light emitting composite layer (23).

Figure 3:
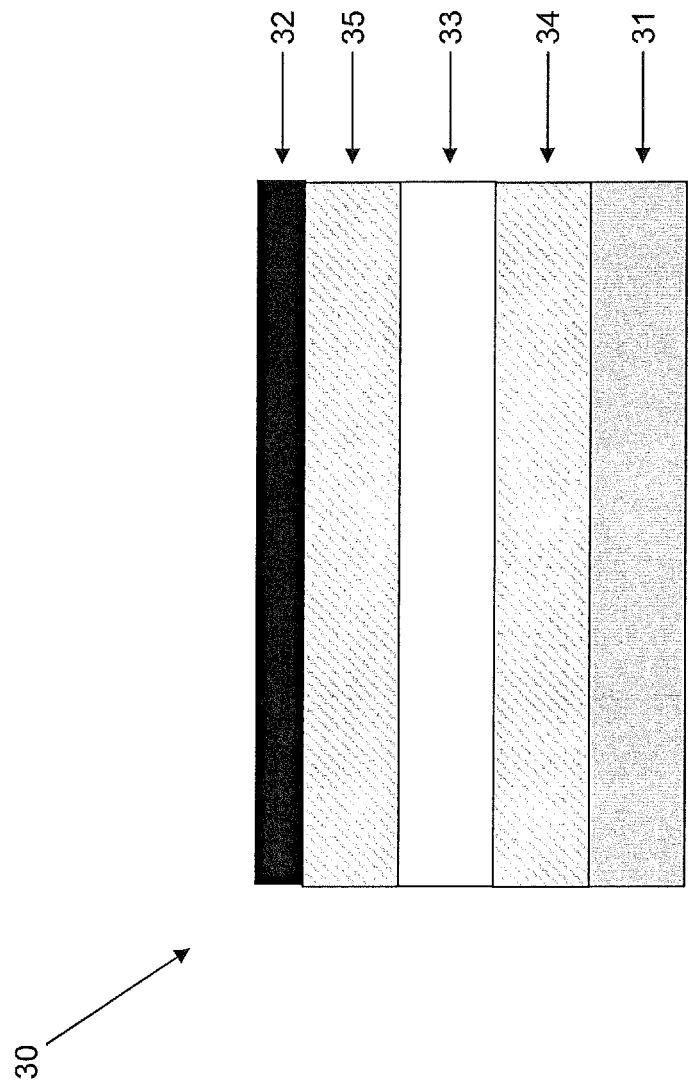
FIG. 3 illustrates a cross-sectional view of an optoelectronic device according to one embodiment described herein.

FIG. 3 illustrates a cross-sectional view of an optoelectronic device having a FIPEL architecture according to one embodiment described herein. The FIPEL (30) illustrated in FIG. 3 comprises a radiation transmissive first electrode (31) and a metal second electrode (32). A light emitting composite layer (33) is disposed between the radiation transmissive first electrode (31) and the metal second electrode (32). The light emitting composite layer (33) can have any construction recited in Section I(C) herein. A first dielectric layer (34) is disposed between the light emitting composite layer (33) and the radiation transmissive first electrode (31). Further, a second dielectric layer (35) is disposed between the light emitting composite layer (33) and the metal second electrode (32).

Specific components of optoelectronic devices of a FIPEL architecture are now described.

A. First Electrode

In some embodiments, the first electrode is radiation transmissive. Radiation transmissive, as used herein, refers to the ability of a material to at least partially pass or transmit radiation in the visible region of the electromagnetic spectrum. In some embodiments, radiation transmissive materials can pass electromagnetic radiation emitted by composite organic layers described herein with minimal absorbance or other interference.

Any radiation transmissive first electrode not inconsistent with the objectives of the present invention may be used. In some embodiments, a radiation transmissive first electrode comprises a radiation transmissive conducting oxide. Radiation transmissive conducting oxides, in some embodiments, can comprise one or more of indium tin oxide (ITO), gallium indium tin oxide (GITO), and zinc indium tin oxide (ZITO).

In some embodiments, a radiation transmissive first electrode comprises one or more radiation transmissive polymeric materials, such as polyanaline (PANI) and its chemical relatives. In some embodiments, a radiation transmissive first electrode comprises 3,4-polyethylenedioxythiophene (PEDOT). In some embodiments, a radiation transmissive first electrode comprises a carbon nanotube layer having a thickness operable to at least partially pass visible electromagnetic radiation. In some embodiments, a radiation transmissive first electrode comprises a composite material comprising a nanoparticle phase dispersed in a polymeric phase. The nanoparticle phase, in some embodiments, can comprise carbon nanotubes, fullerenes, or mixtures thereof. Moreover, in some embodiments, a radiation transmissive first electrode can comprise a metal layer having a thickness operable to at least partially pass visible electromagnetic radiation. In some embodiments, the metal layer can comprise elementally pure metals or alloys. Metals suitable for use as a radiation transmissive first electrode, in some embodiments, comprise high work function metals.

A radiation transmissive first electrode can have any thickness not inconsistent with the objectives of the present invention. In some embodiments, for example, a radiation transmissive first electrode has a thickness of at least about 10 nm. In some embodiments, a radiation transmissive first electrode has a thickness ranging from about 10 nm to about 1 μm. A radiation transmissive first electrode, in some embodiments, has a thickness ranging from about 20 nm to about 750 nm, from about 50 nm to about 500 nm, from about 30 nm to about 200 nm, or from about 50 nm to about 150 nm. In some embodiments, a radiation transmissive first electrode has a thickness greater than about 1 μm.

B. Second Electrode

A FIPEL described herein also comprises a second electrode. In some embodiments, a second electrode is non-radiation transmissive and/or reflective. In some embodiments, a second electrode is a metal. In some embodiments, a metal comprises elementally pure metals as well as metal alloys. In some embodiments, a second electrode comprises aluminum, nickel, copper, gold, silver, platinum, palladium or other transition metals or alloys thereof. In some embodiments, a second electrode is radiation transmissive. In some embodiments wherein a second electrode is radiation transmissive, the second electrode comprises any radiation transmissive material described herein for the radiation transmissive first electrode.

A second electrode can have any desired thickness. In some embodiments, a second electrode has a thickness ranging from about 10 nm to about 10 μm. In some embodiments, a second electrode has a thickness ranging from about 50 nm to about 750 nm. A second electrode, in some embodiments, has a thickness ranging from about 100 nm to about 500 nm.

C. Light Emitting Composite Layer

A light emitting composite layer of a FIPEL described herein can demonstrate a variety of structures. In some embodiments, a light emitting composite layer is a light emitting composite organic layer.

(i) In some embodiments, a light emitting composite organic layer of a FIPEL described herein comprises a nanoparticle phase disposed in a light emitting polymeric or oligomeric phase. In some embodiments, the nanoparticle phase is dispersed throughout the light emitting polymeric phase or oligomeric phase. In some embodiments, for example, the nanoparticle phase comprises nanoparticles uniformly or substantially uniformly distributed throughout the light emitting polymeric or oligomeric phase. In some embodiments, the nanoparticle phase comprises nanoparticles heterogeneously dispersed in the light emitting polymeric or oligomeric phase.

The nanoparticle phase, in some embodiments, is electrically isolated from both the first electrode and the second electrode. In some embodiments, nanoparticles of the nanoparticle phase are not in contact and/or direct contact with the radiation transmissive first electrode and/or second electrode. In some embodiments, the nanoparticles of the nanoparticle phase have a size in at least one dimension that is less than the thickness of the composite organic layer. In some embodiments, the nanoparticles of the nanoparticle phase have a size in every dimension that is less than the thickness of the composite organic layer. In some embodiments, for example, nanoparticles of the nanoparticle phase have a length and/or other dimension(s) sufficiently less than the thickness of the composite organic layer to inhibit or preclude contact with the radiation transmissive first electrode and/or second electrode.

In some embodiments, the light emitting polymeric or oligomeric phase comprises a conjugated polymer or oligomer and the nanoparticles of the nanoparticle phase are in direct contact with the light emitting conjugated polymer or oligomer. In some embodiments, nanoparticles of the nanoparticle phase are not coated and/or not dispersed in the conjugated polymeric or oligomeric phase by any secondary polymer or oligomer or dispersing agent.

In some embodiments, a nanoparticle phase is present in a composite organic layer in an amount in accordance with Table I.

TABLE I

Weight Percent of Nanoparticle Phase in Composite Organic Layer
Nanoparticle Phase (Wt. %)

0.001-20
0.01-15
0.1-10

TABLE I-continued

Weight Percent of Nanoparticle Phase in Composite Organic Layer
Nanoparticle Phase (Wt. %)

0.5-5
1-4
0.01-3
0.01-0.5
0.01-0.3
0.01-0.2
0.01-0.15

In some embodiments, a nanoparticle phase is present in a composite organic layer in an amount below the percolation threshold.

A nanoparticle phase disposed in a light emitting polymeric or oligomeric phase of a composite organic layer can comprise any type of nanoparticle not inconsistent with the objectives of the present invention. In some embodiments, the nanoparticle phase comprises one or more nanoparticle species suitable for application in a light emitting device. In some embodiments, the nanoparticle phase comprises nanotubes. In some embodiments, the nanotubes have a length shorter or substantially shorter than the thickness of the composite organic layer. In some embodiments, the nanotubes have a length not greater than about 200 nm.

In some embodiments, nanoparticles of the nanoparticle phase comprise carbon nanoparticles including, but not limited to, fullerenes, carbon nanotubes, carbon quantum dots, graphene particles or mixtures thereof. Fullerenes suitable for use in the nanoparticle phase, in one embodiment, can comprise 1-(3-methoxycarbonyl)propyl-1-phenyl (6,6)$C_{61}$ (PCBM), higher order fullerenes ($C_{70}$ and higher), and endometallofullerenes (fullerenes having at least one metal atom disposed therein). Carbon nanotubes for use in the nanoparticle phase, according to some embodiments, can comprise single-walled nanotubes (SWNT), multi-walled nanotubes (MWNT), cut nanotubes, nitrogen and/or boron doped carbon nanotubes or mixtures thereof.

In some embodiments wherein the nanoparticle phase comprises carbon nanotubes, the carbon nanotubes have a length ranging from about 5 nm to about 1 µm. In some embodiments, the carbon nanotubes have a length ranging from about 10 nm to about 600 nm or from about 20 nm to about 500 nm. In some embodiments, the carbon nanotubes have a length ranging from about 50 nm to about 300 nm or from about 100 nm to about 200 nm. In some embodiments, the carbon nanotubes have a length shorter or substantially shorter than the thickness of the composite organic layer.

In some embodiments, nanoparticles of the nanoparticle phase comprise metal nanoparticles such as gold nanoparticles, silver nanoparticles, copper nanoparticles, nickel nanoparticles, and other transition metal nanoparticles. In some embodiments, nanoparticles comprise semiconductor nanoparticles such as III/V and II/VI semiconductor nanoparticles, including cadmium selenide (CdSe) nanoparticles, cadmium telluride (CdTe) nanoparticles, gallium nitride (GaN) nanoparticles, gallium arsenide (GaAs) nanoparticles, indium phosphide (InP) nanoparticles or mixtures thereof. In some embodiments, semiconductor nanoparticles comprise quantum dots including, but not limited to, II/VI and/or III/V quantum dots.

Additionally, in some embodiments, nanoparticles of a nanoparticle phase are luminescent. The presence of luminescent nanoparticles in the nanoparticle phase, in some embodiments, can permit tuning of the emission profile of an emissive composite organic layer described herein. Any luminescent nanoparticles not inconsistent with the objectives of the present invention may be used. In some embodiments, luminescent nanoparticles comprise quantum dots described herein.

In some embodiments, the nanoparticle phase comprises at least one nanowhisker. Carbon nanoparticles operable to form nanowhiskers, according to some embodiments, can comprise single-walled carbon nanotubes, multi-walled carbon nanotubes, and fullerenes. In one embodiment, nanowhiskers comprise crystalline PCBM.

In some embodiments, a nanoparticle phase of a composite organic layer of an optoelectronic device comprises any combination or mixture of nanoparticle species described herein. In some embodiments, for example, a composite organic layer comprises a mixture of carbon nanotubes (SWNT and/or MWNT) with semiconductor nanocrystals, such as II/VI and/or III/V quantum dots.

In some embodiments of optoelectronic devices of FIPEL architecture described herein, the light emitting polymeric or oligomeric phase of the composite organic layer comprises one or a plurality of conjugated polymers or oligomers. In some embodiments, the light emitting polymeric or oligomeric phase comprises a blend of conjugated polymers or oligomers. In some embodiments, the blend of conjugated polymers or oligomers comprises a copolymer of the polymers or oligomers.

In some embodiments, a conjugated polymer or oligomer suitable for use in the light emitting polymeric or oligomeric phase comprises at least two repeating units selected from the group consisting of repeating units A, B and C:

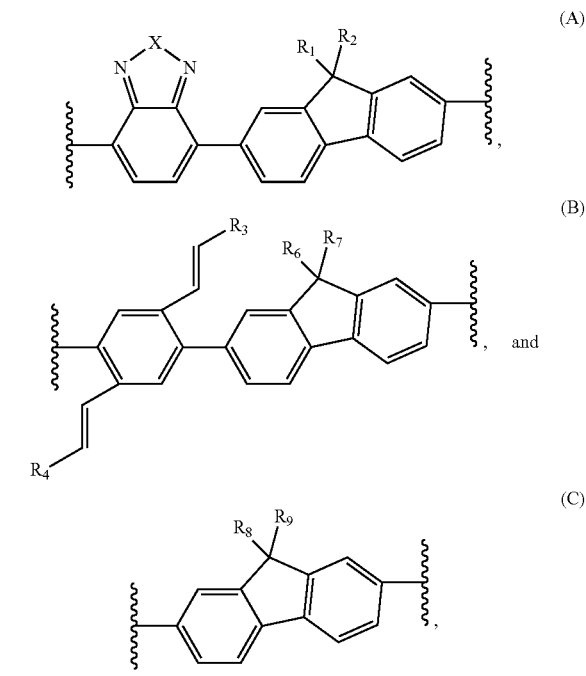

wherein $\xi$ represents points of attachment in the polymer chain or oligomer chain, X is selected from the group consisting of S, O, Se and $NR_5$ and $R_1$, $R_2$, $R_5$, $R_6$, $R_7$, $R_8$ and $R_9$ are independently selected from the group consisting of hydrogen, $C_{1-20}$ alkyl, $C_{2-20}$ alkenyl, $C_{8-12}$ alkyl and $C_{8-12}$ alkenyl and $R_3$ and $R_4$ are independently selected from the group consisting of aryl and heteroaryl, wherein the alkyl and alkenyl of $R_1$, $R_2$, $R_5$, $R_6$, $R_7$, $R_8$ and $R_9$ and the aryl and heteroaryl of $R_3$ and $R_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, $R_3$ and $R_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

In some embodiments, repeating unit A of a conjugated polymer or oligomer described herein is selected from the group consisting of:

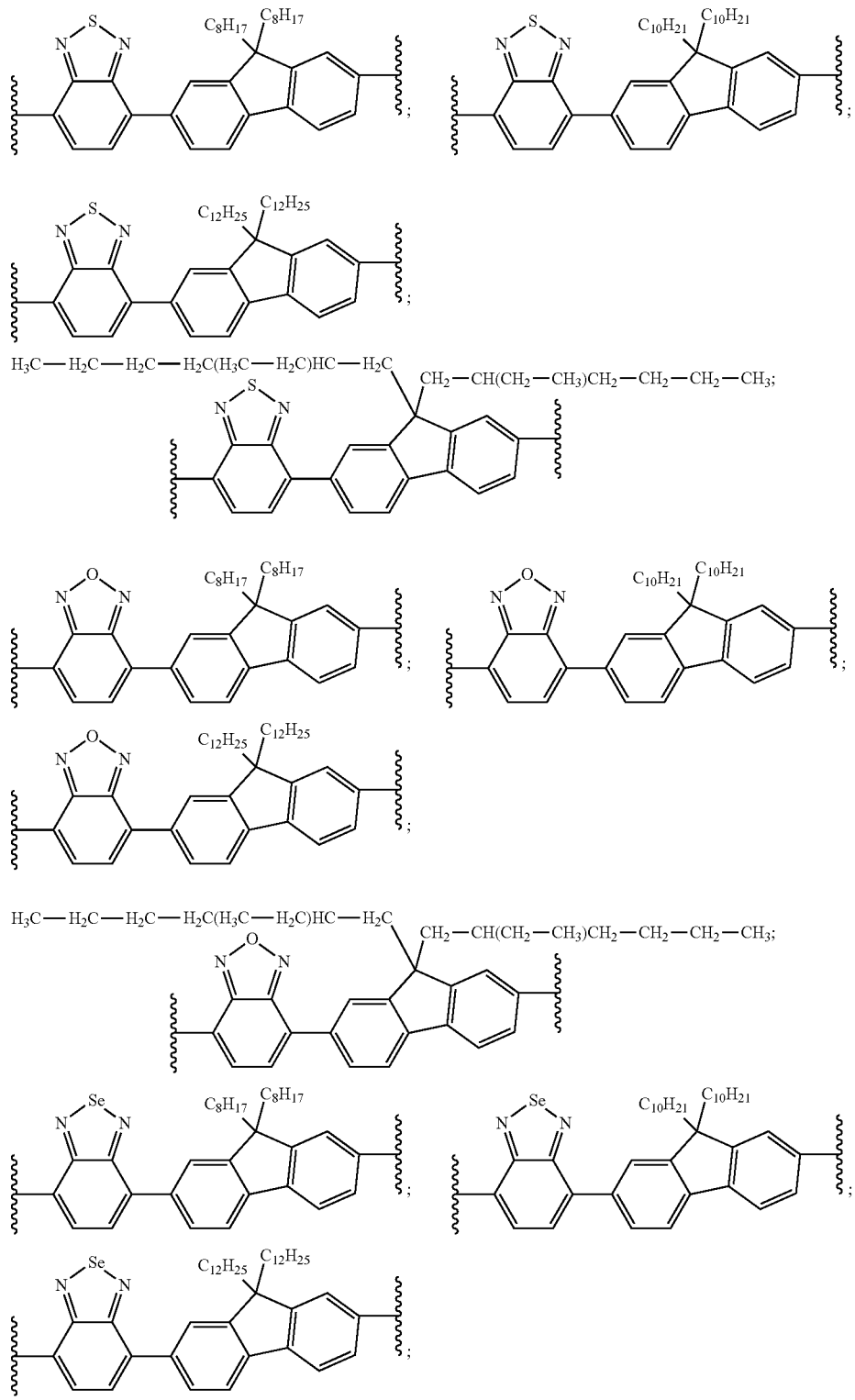

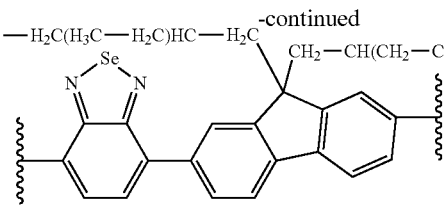
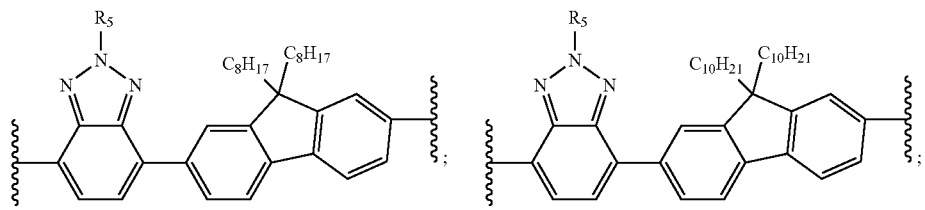
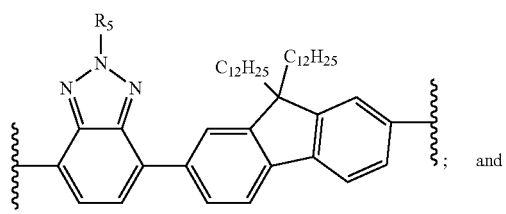
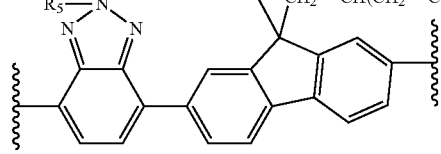
wherein R₅ is defined hereinabove.
In some embodiments, repeating unit B of a conjugated polymer or oligomer described herein is selected from the group consisting of:
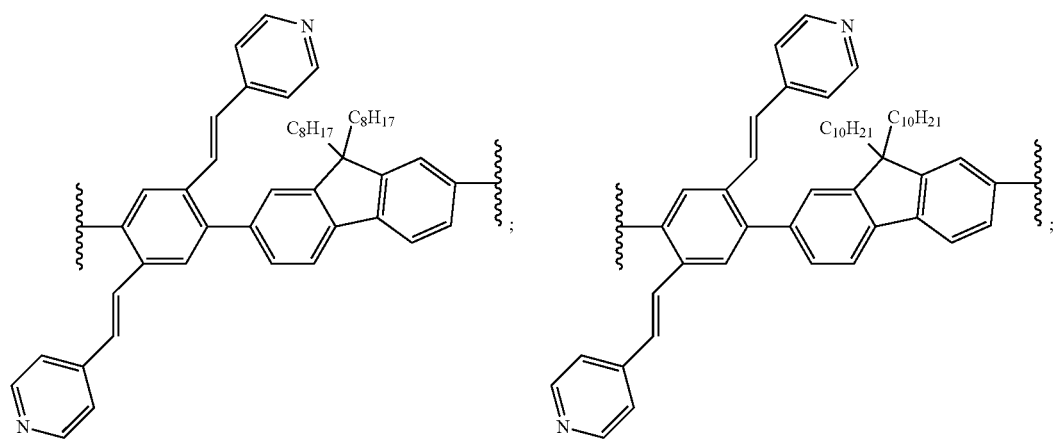

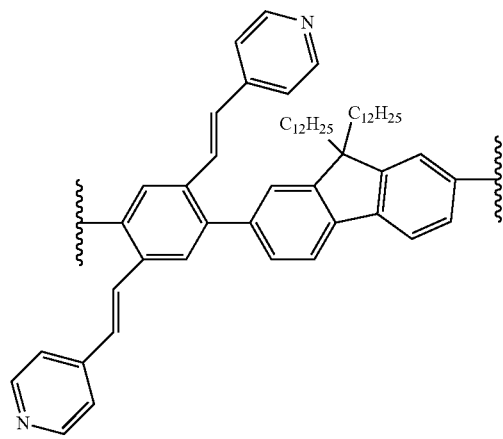
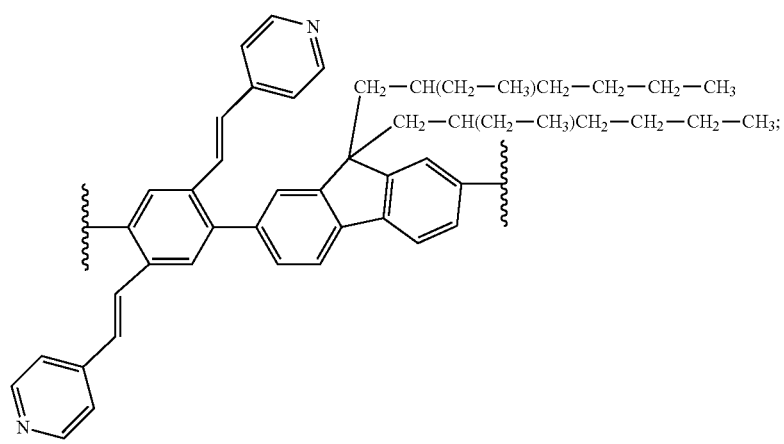
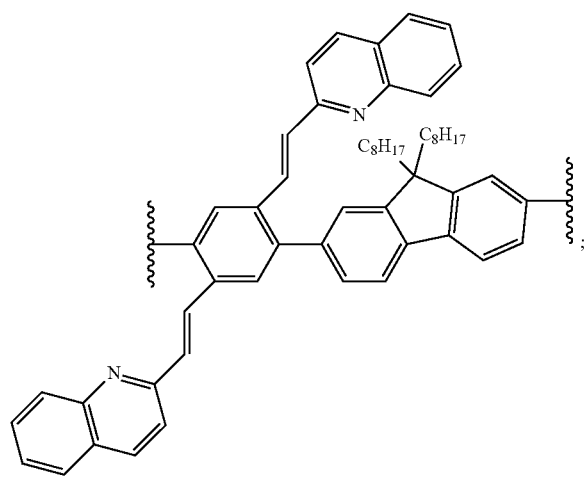
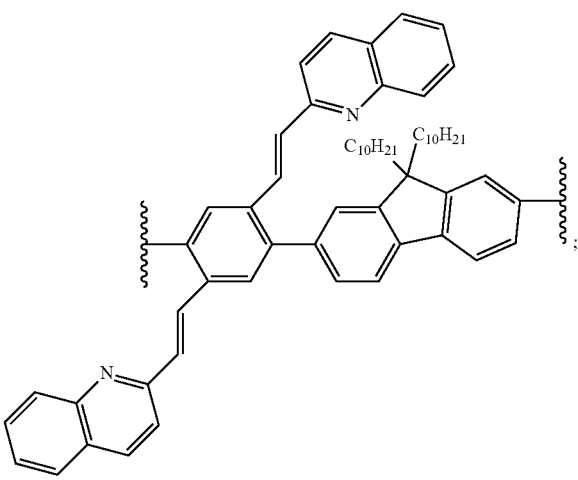

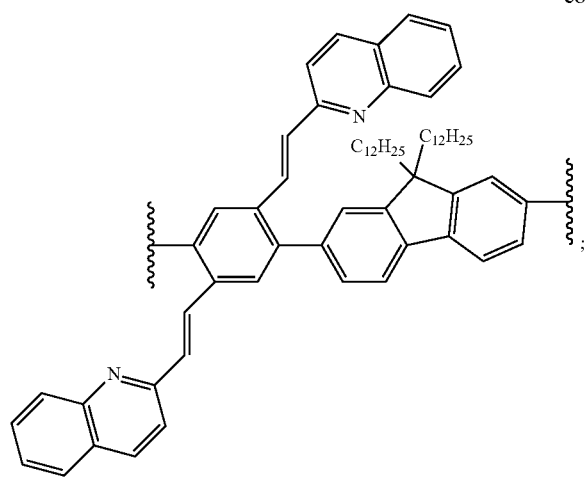
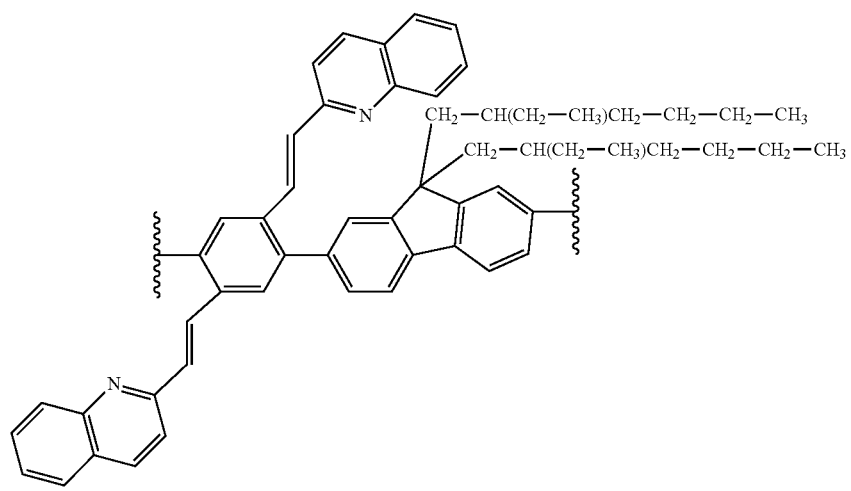
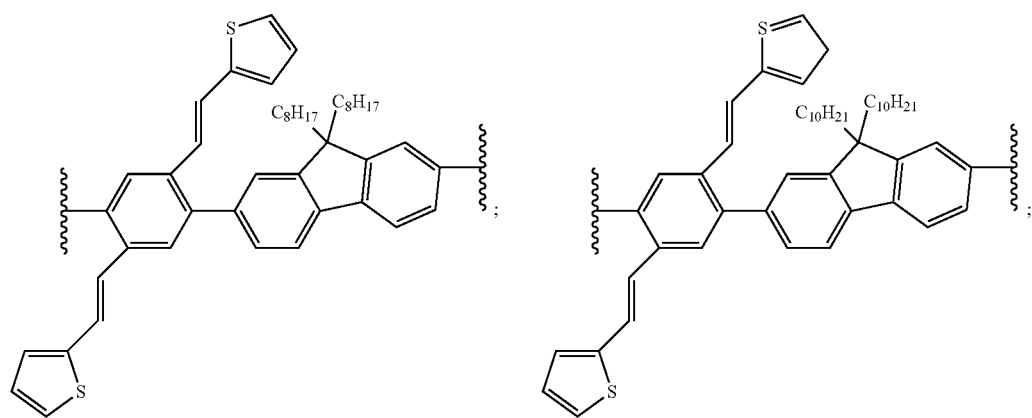

-continued
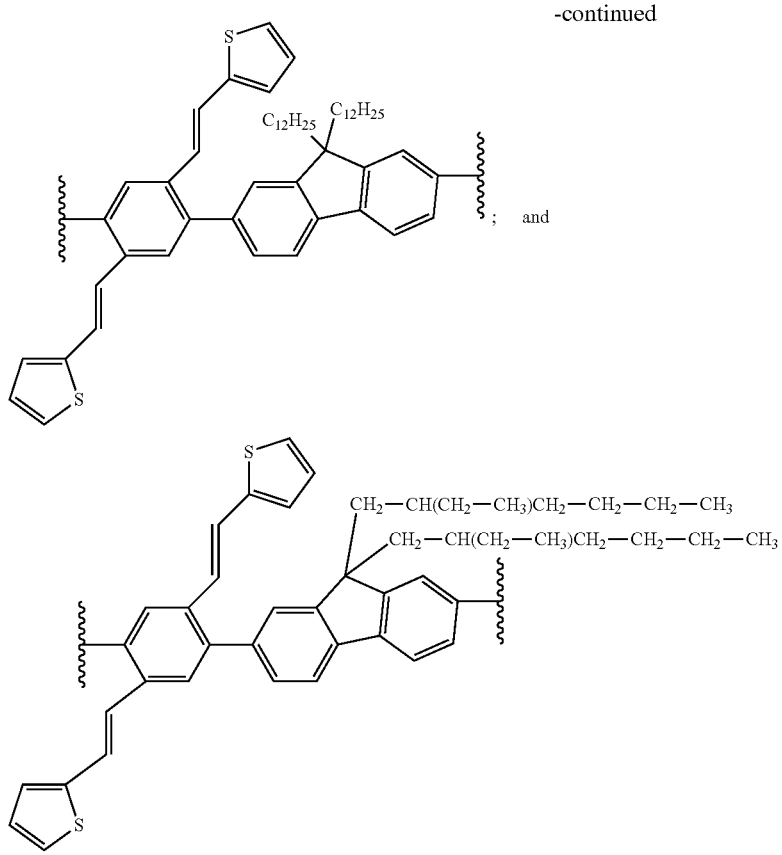
; and
In some embodiments, repeating unit C of a conjugated polymer or oligomer described herein is selected from the group consisting of:
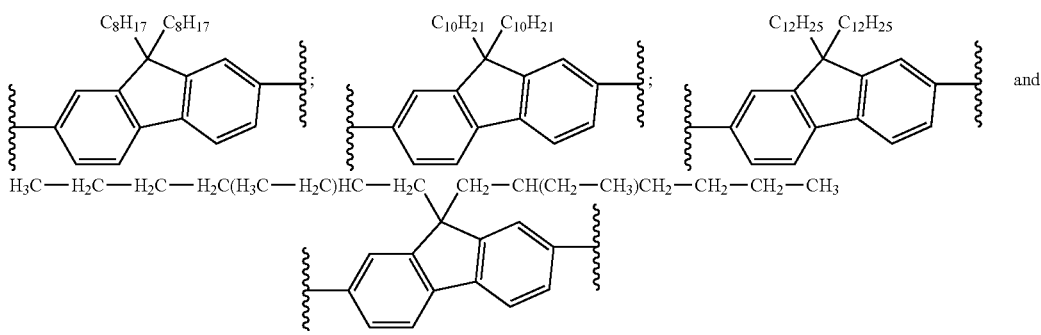
In some embodiments, a conjugated polymer or oligomer of the light emitting polymeric or oligomeric phase comprises repeating units A and B is a conjugated polymer or oligomer of Formula (I):
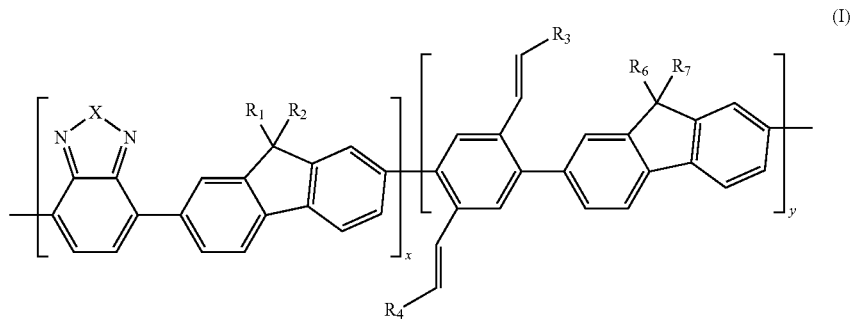

wherein X, $R_1$, $R_2$, $R_3$, $R_4$, $R_6$ and $R_7$ are defined above and x and y are integers independently ranging from 1 to 10,000. As described herein, in some embodiments, repeating units A and B of a conjugated polymer or oligomer of Formula (I) are arranged to provide an alternating copolymer, a block copolymer, statistical copolymer or a random copolymer.

In some embodiments, a conjugated polymer or oligomer of Formula (I) has a weight average molecular weight ($M_w$) ranging from about 1,000 to about 1,000,000. In some embodiments, a conjugated polymer or oligomer of Formula (I) has a number average molecular weight ($M_n$) ranging from about 500 to about 500,000.

In some embodiments, a conjugated polymer or oligomer of Formula (I) described herein is selected from the group consisting of:

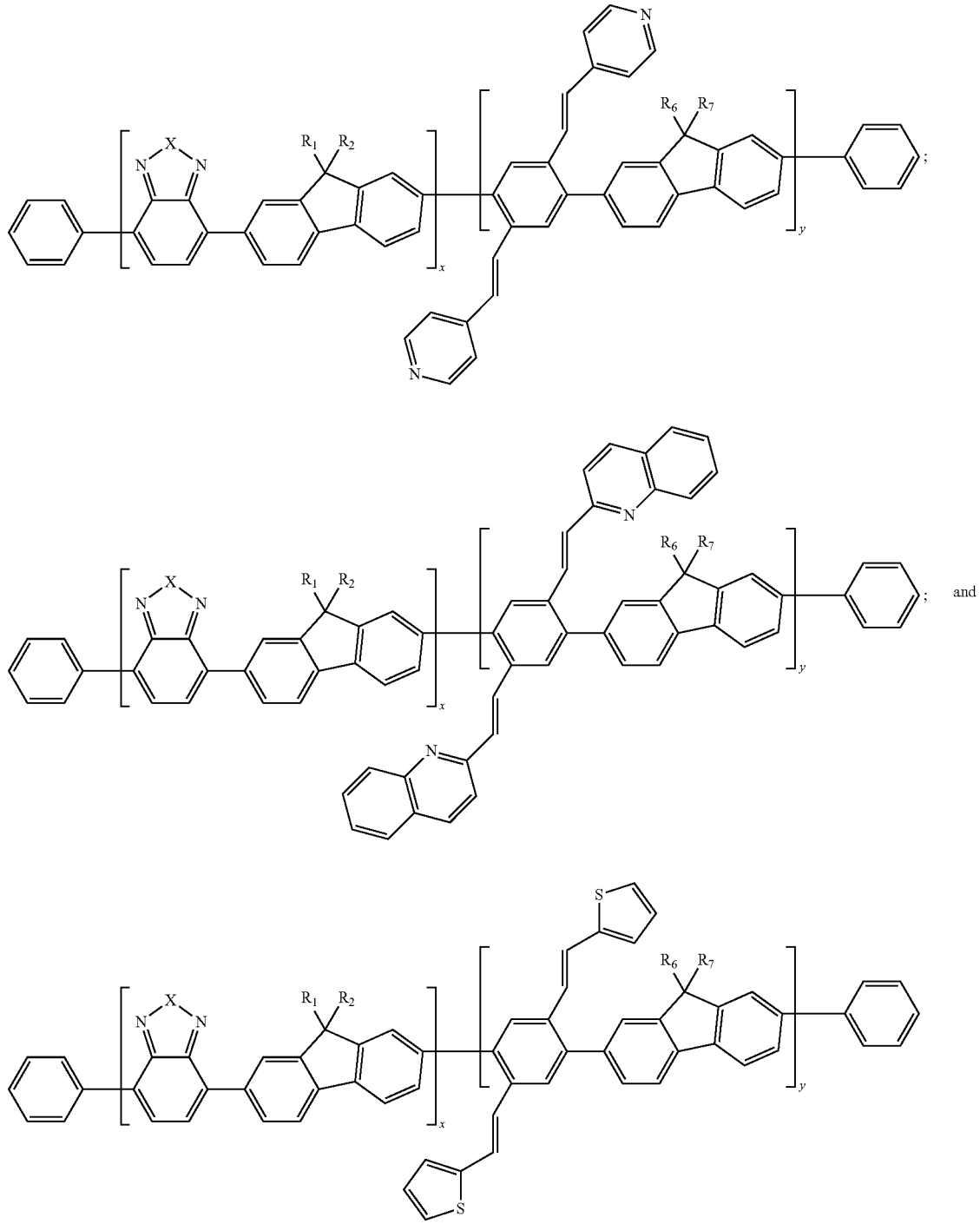

wherein X, $R_1$, $R_2$, $R_6$ and $R_7$ are defined above and x and y are integers independently ranging from 1 to 10,000.

In some embodiments, a conjugated polymer or oligomer of Formula (I) described herein is selected from the group consisting of:
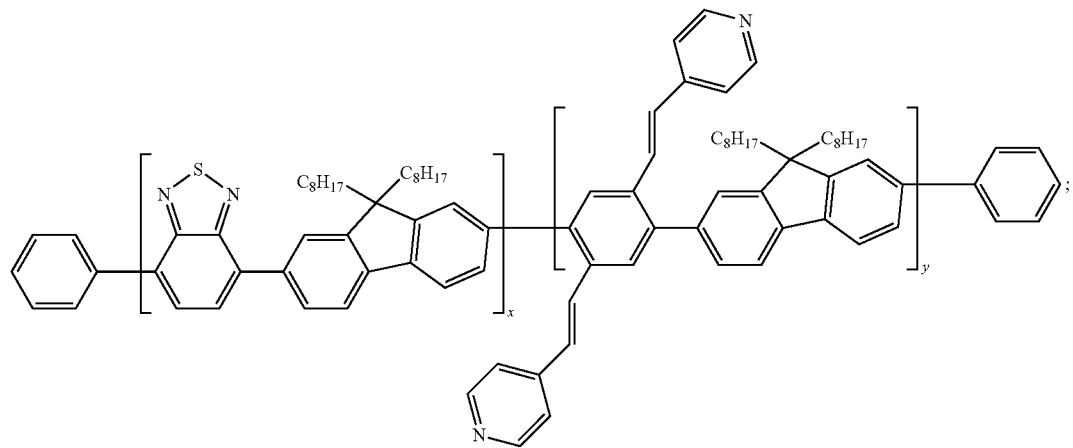
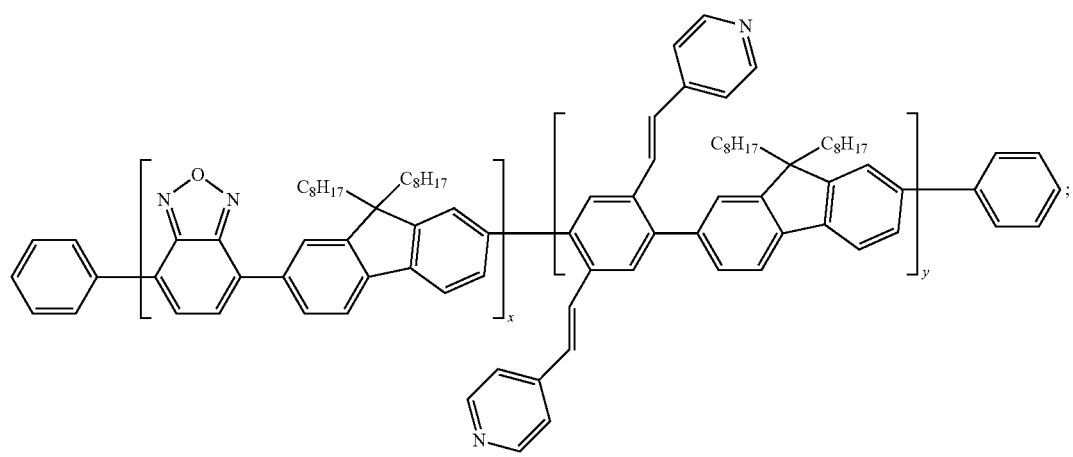
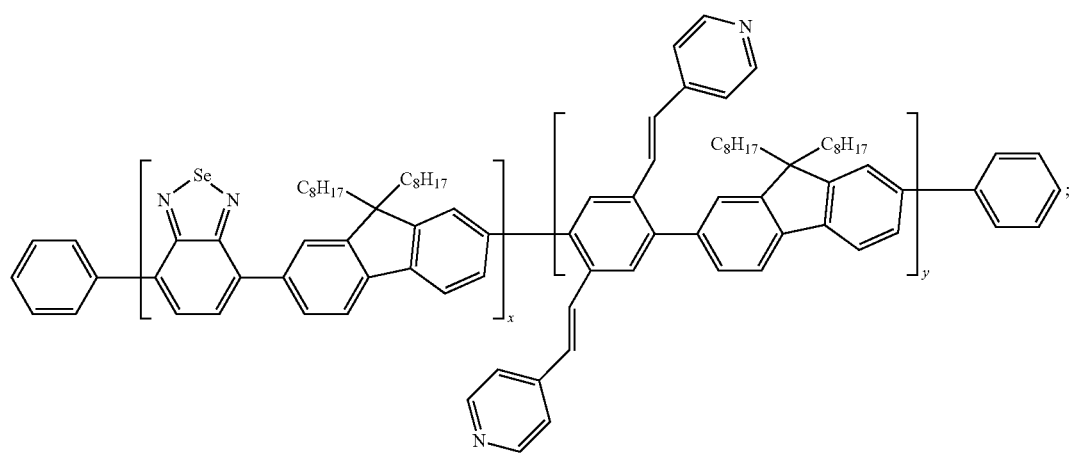

-continued
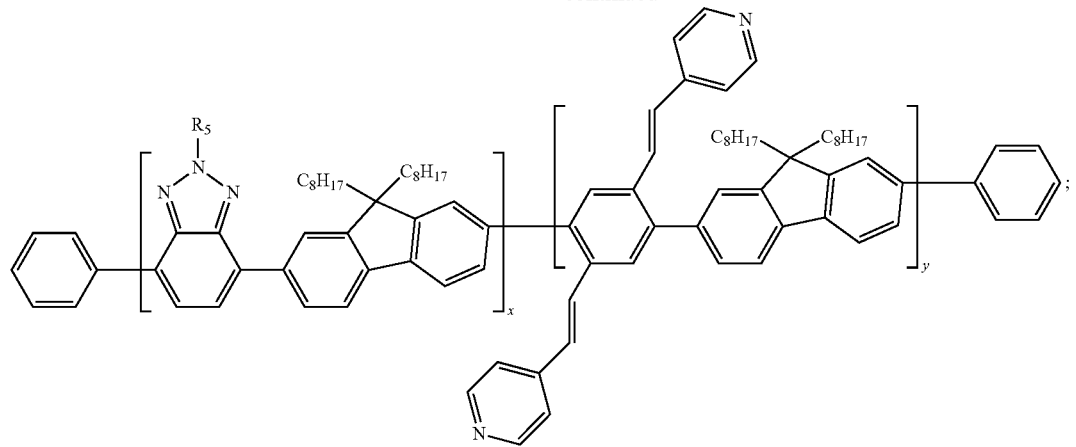
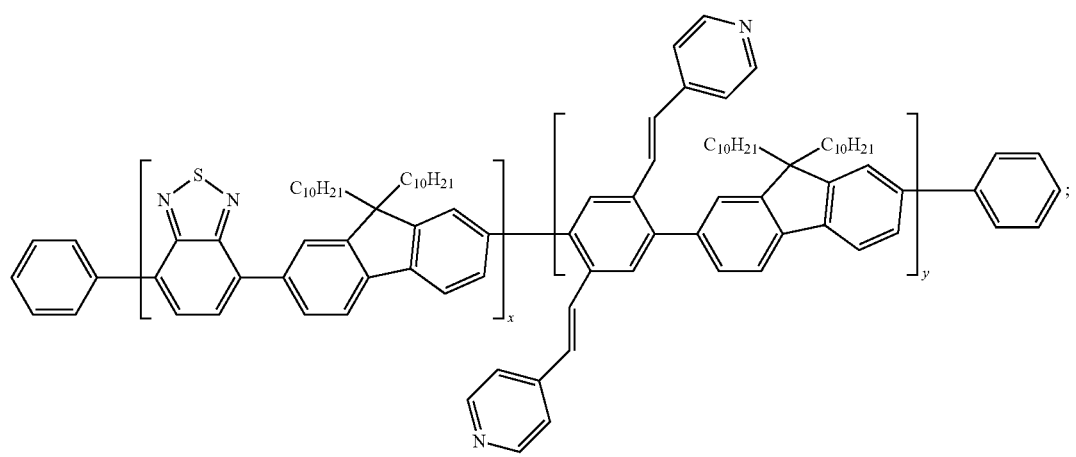
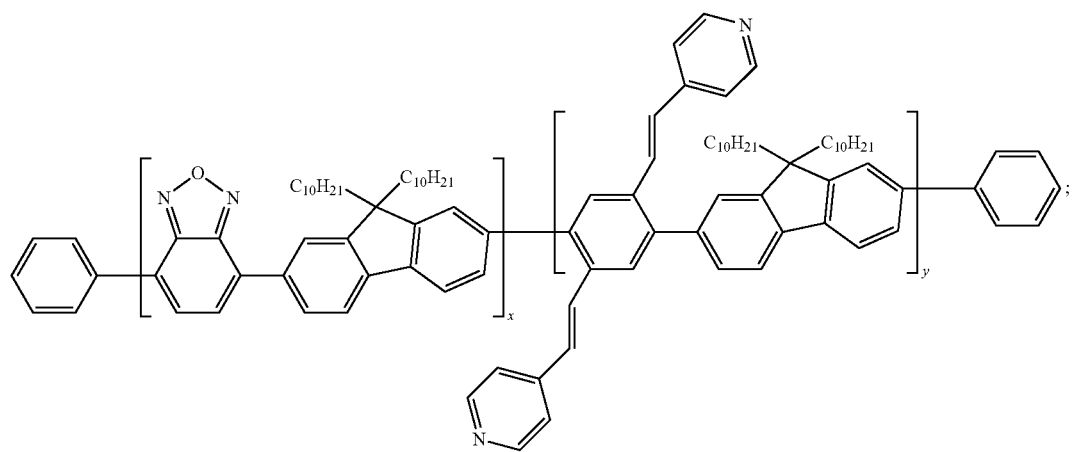

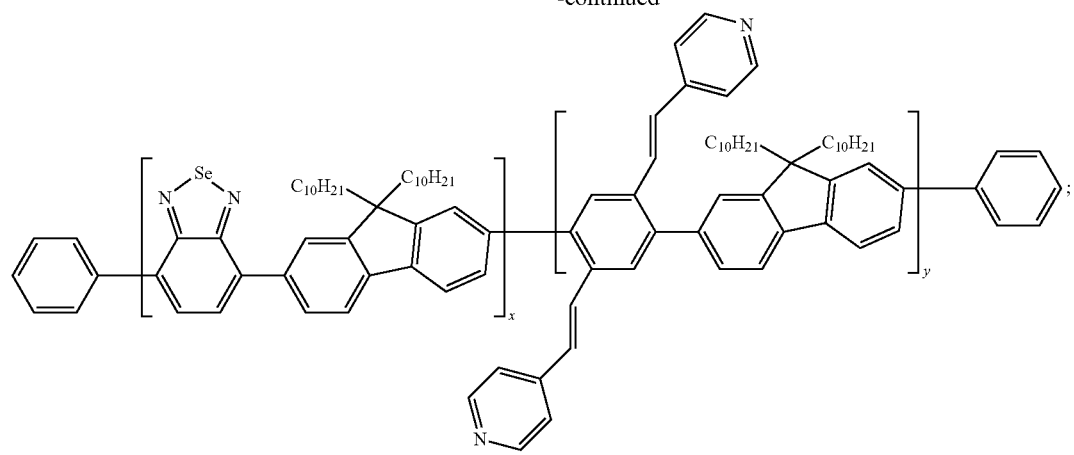
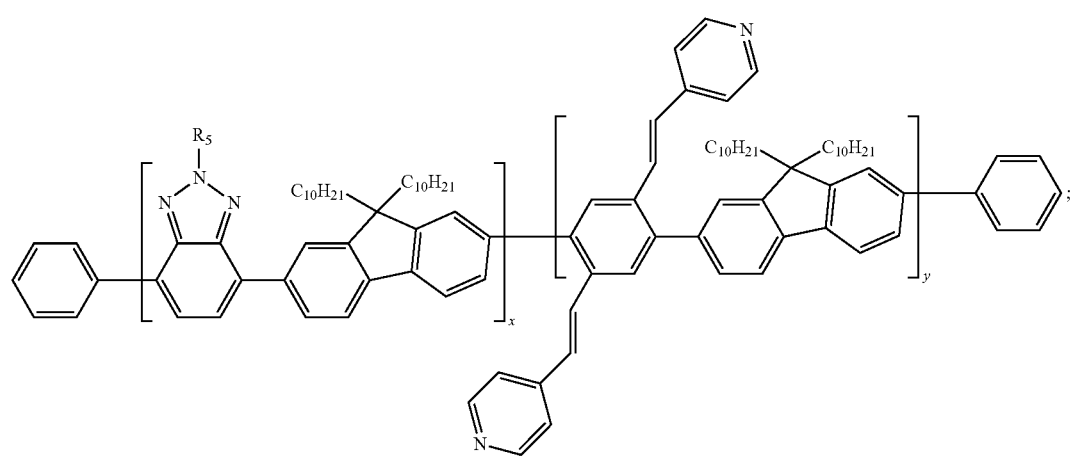
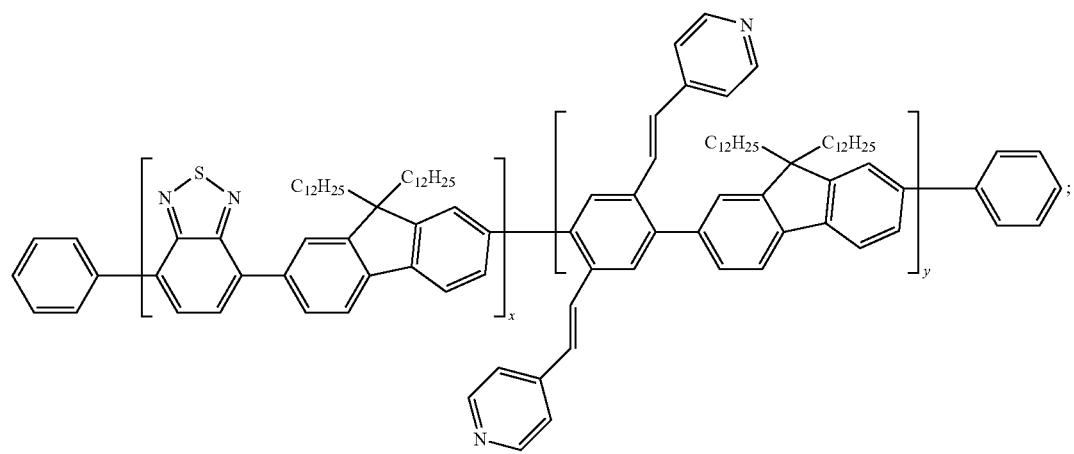

-continued
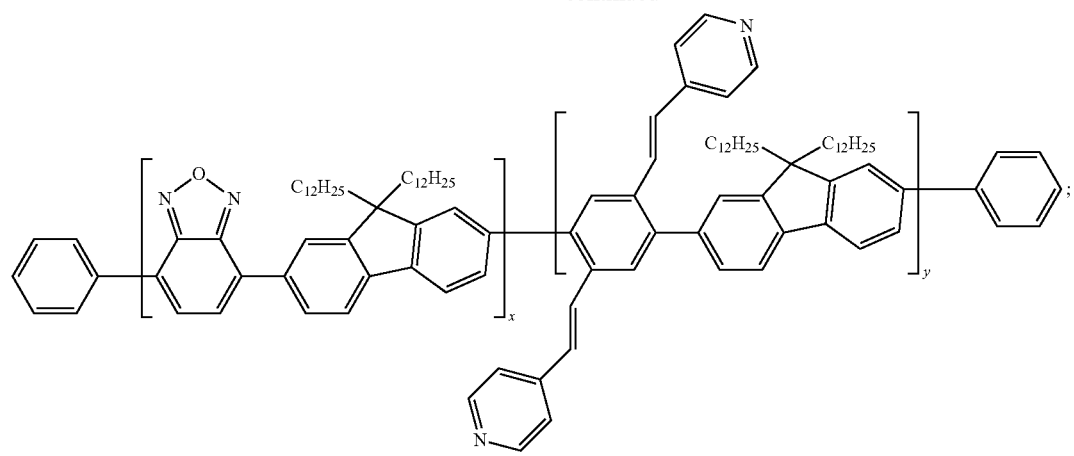
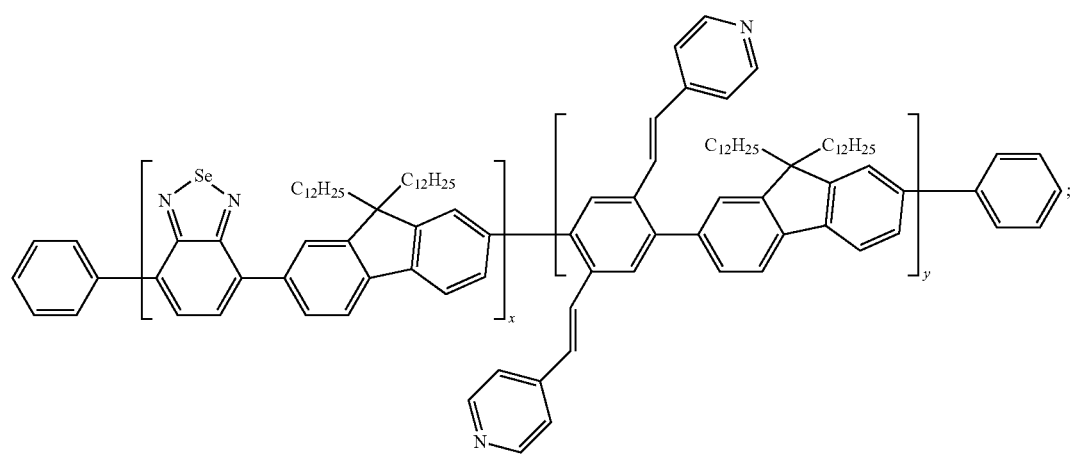
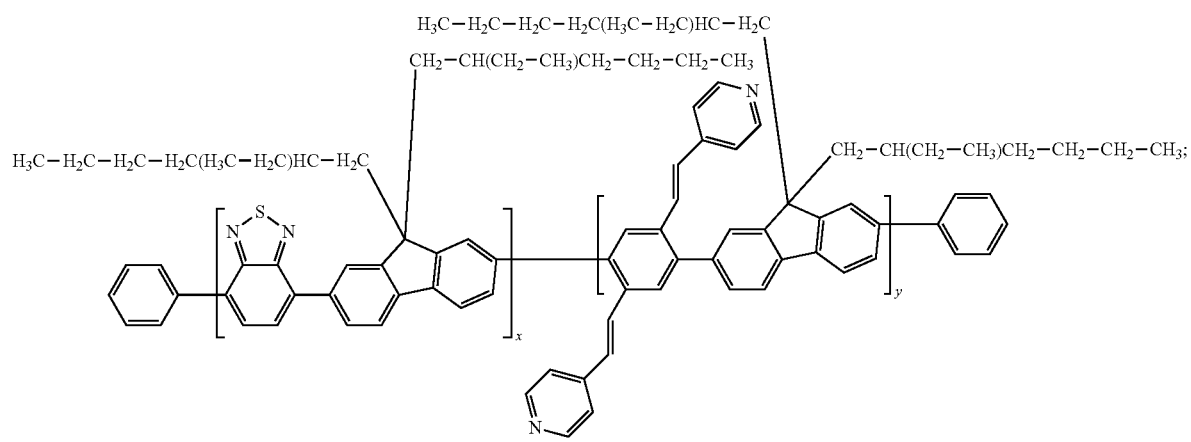

-continued
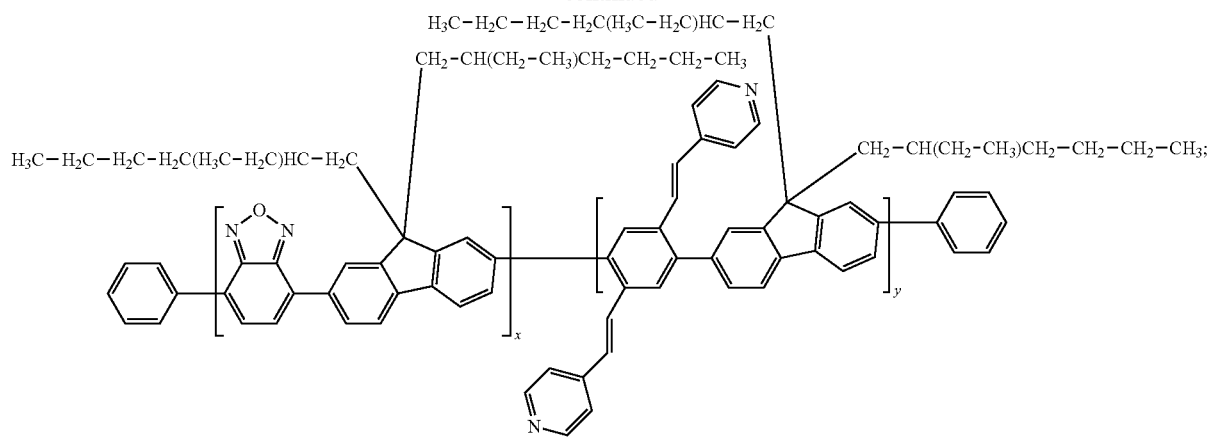
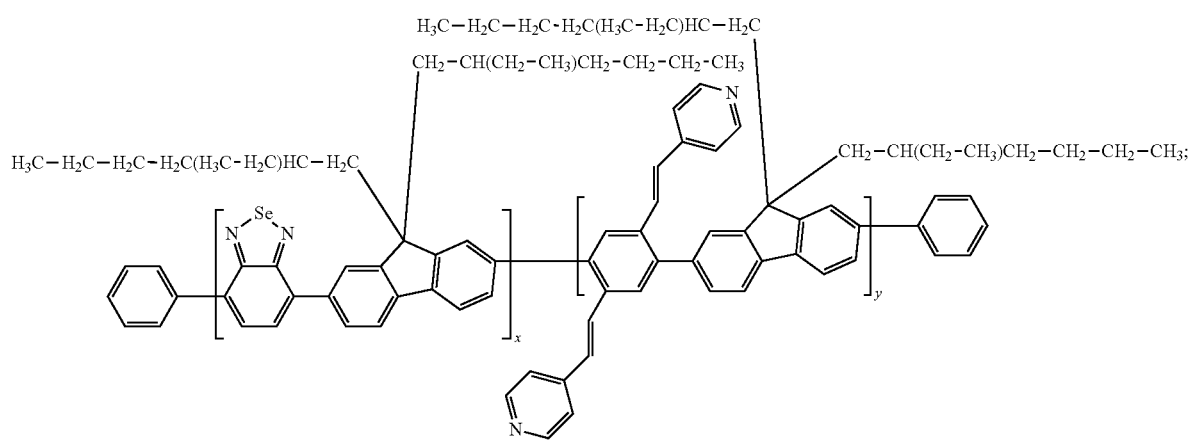
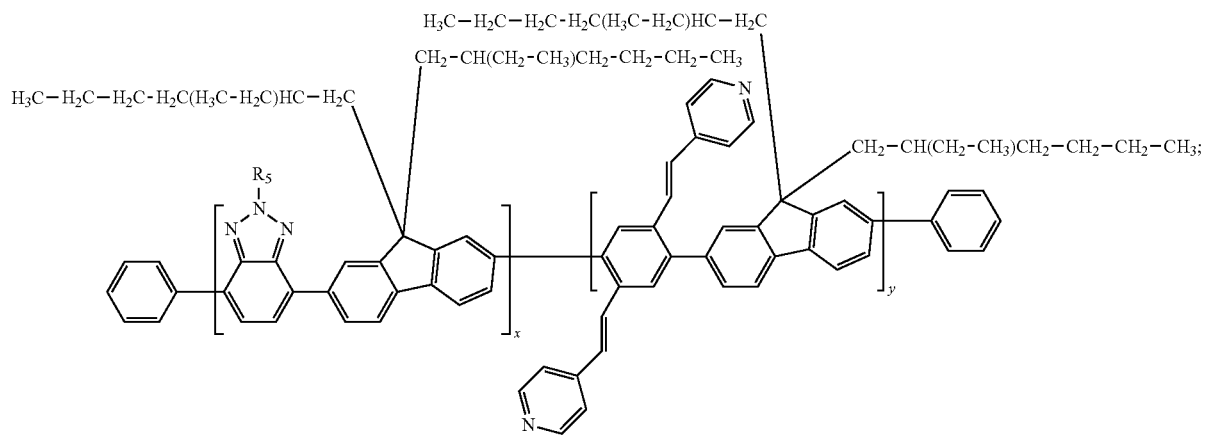

-continued
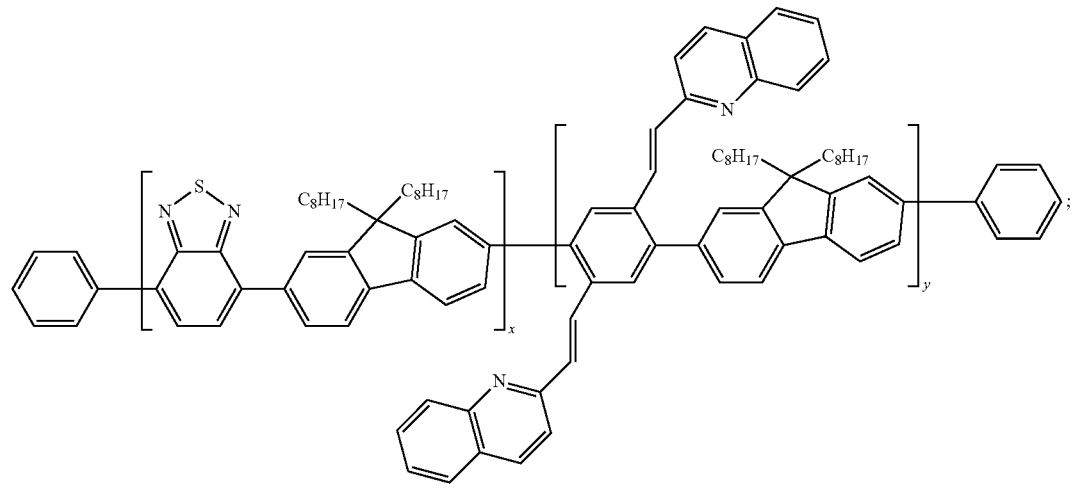
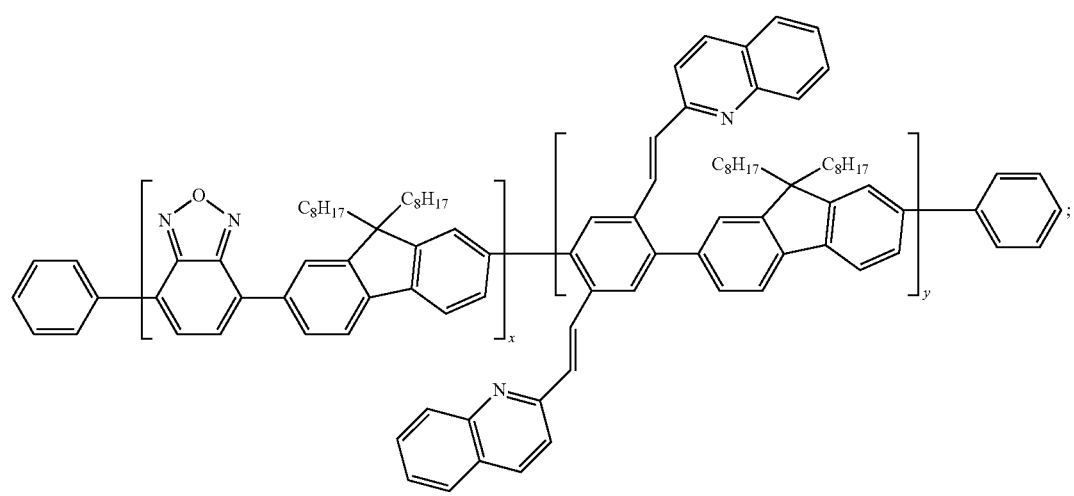
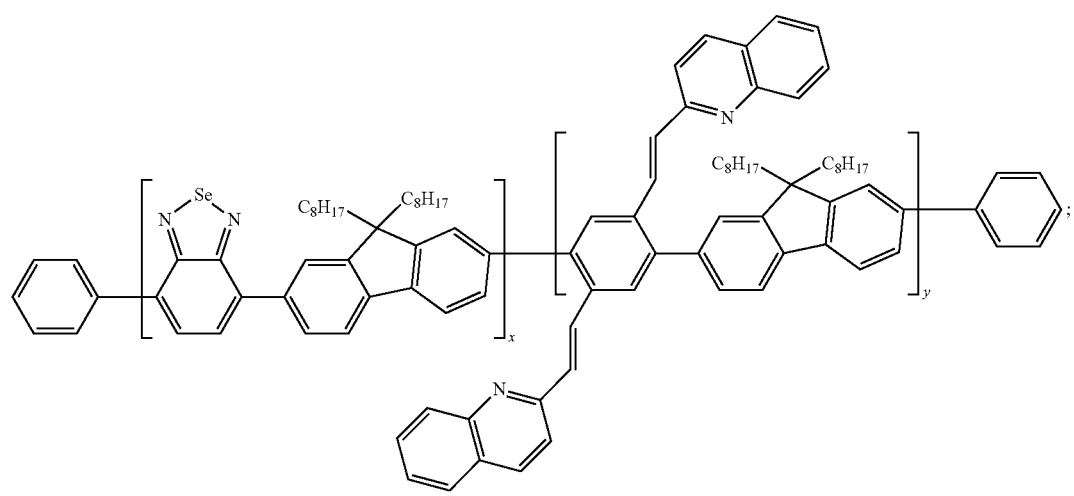

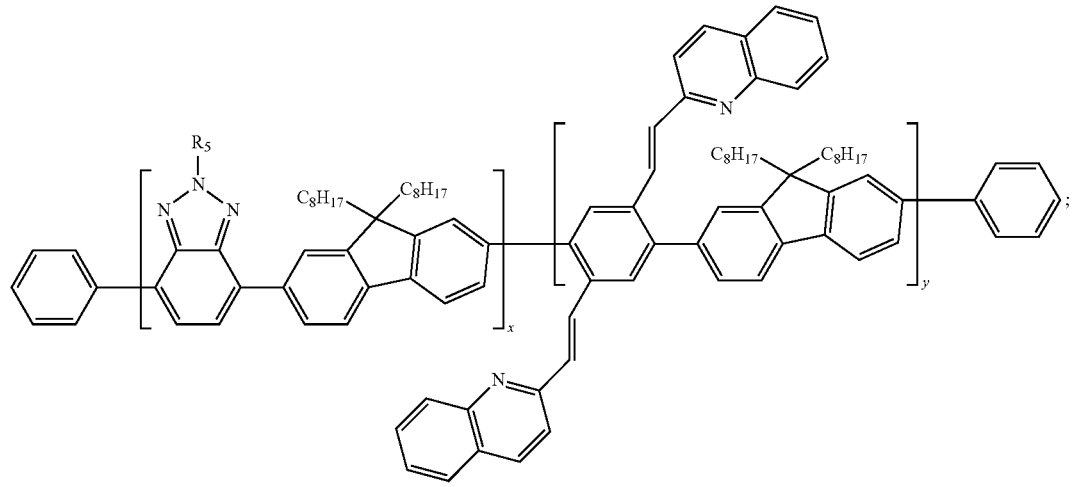
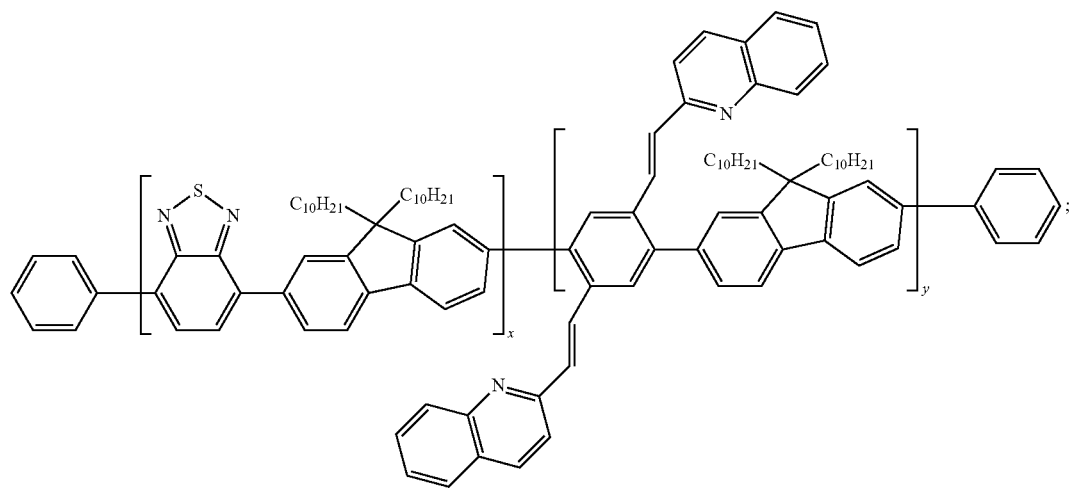
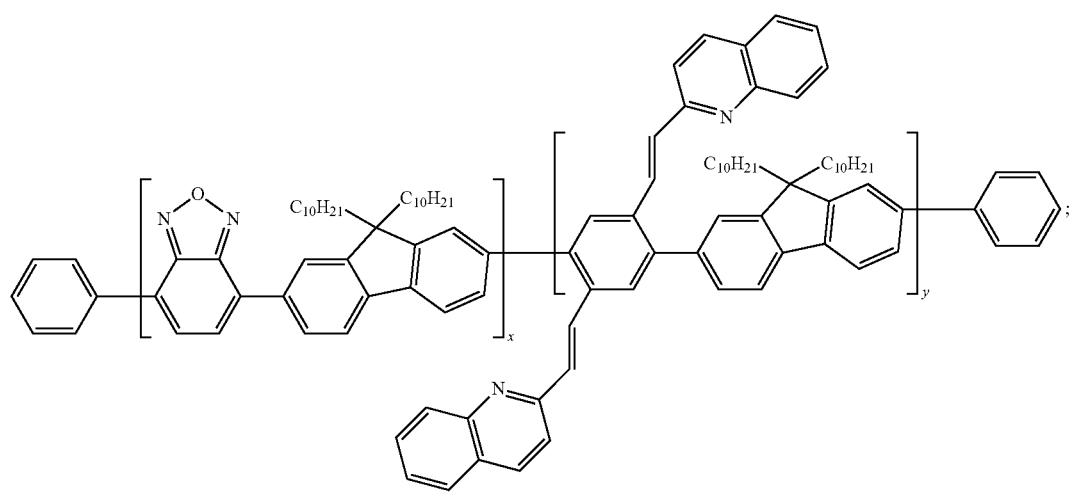

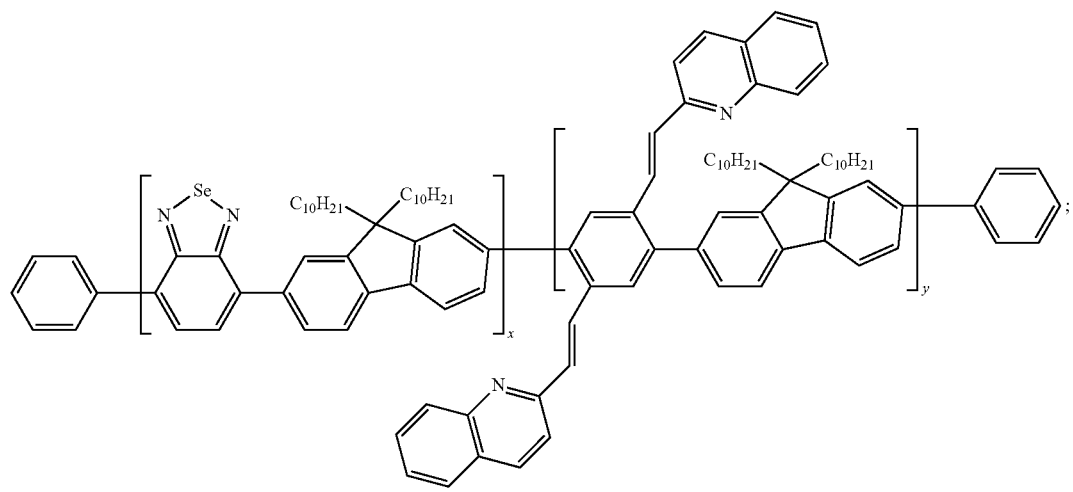
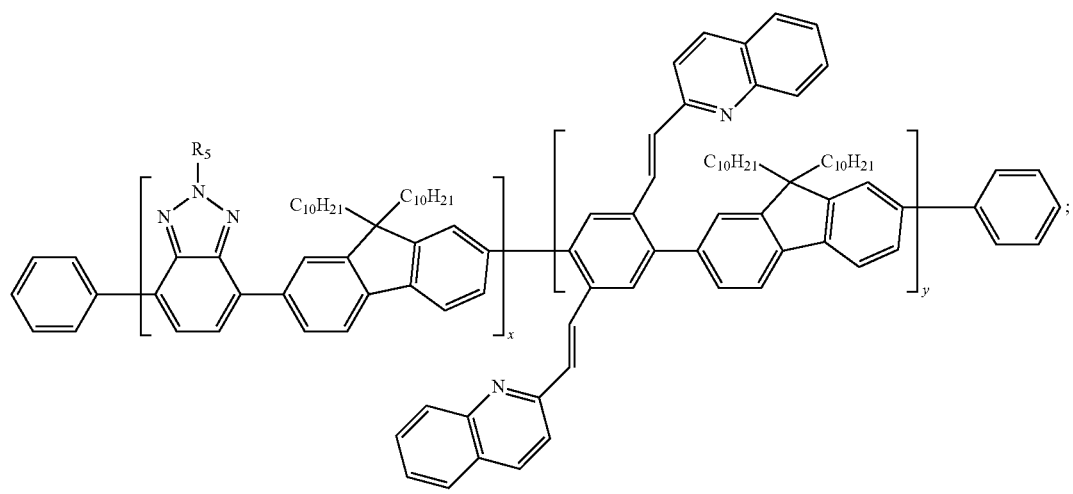
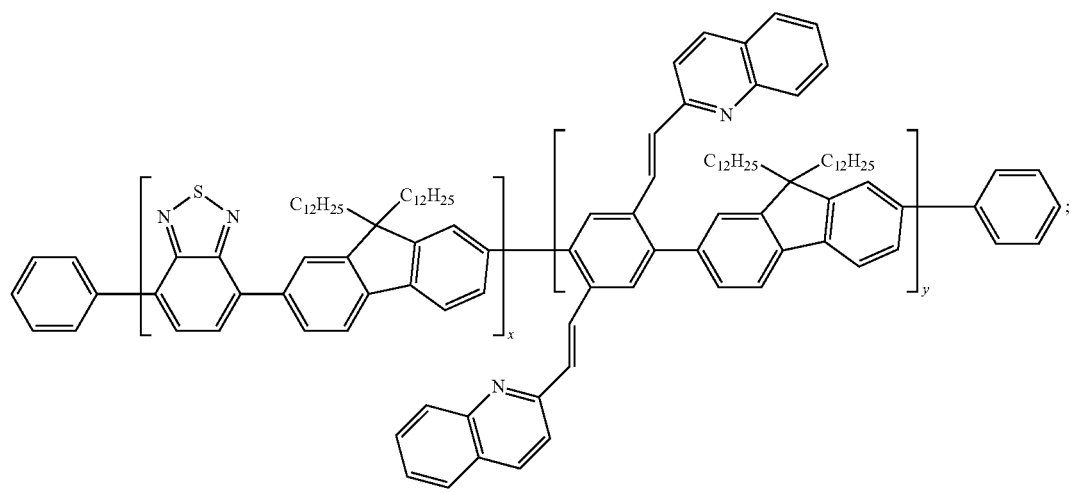

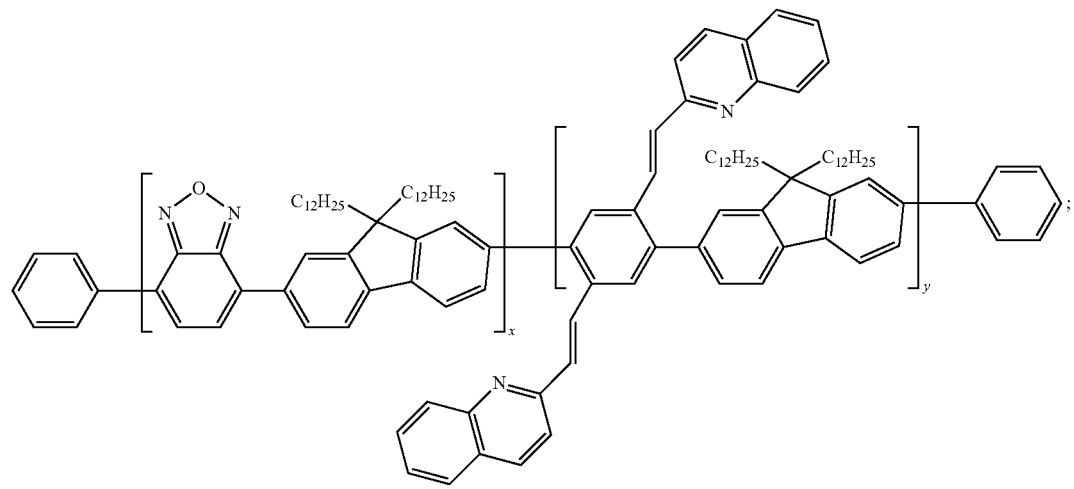
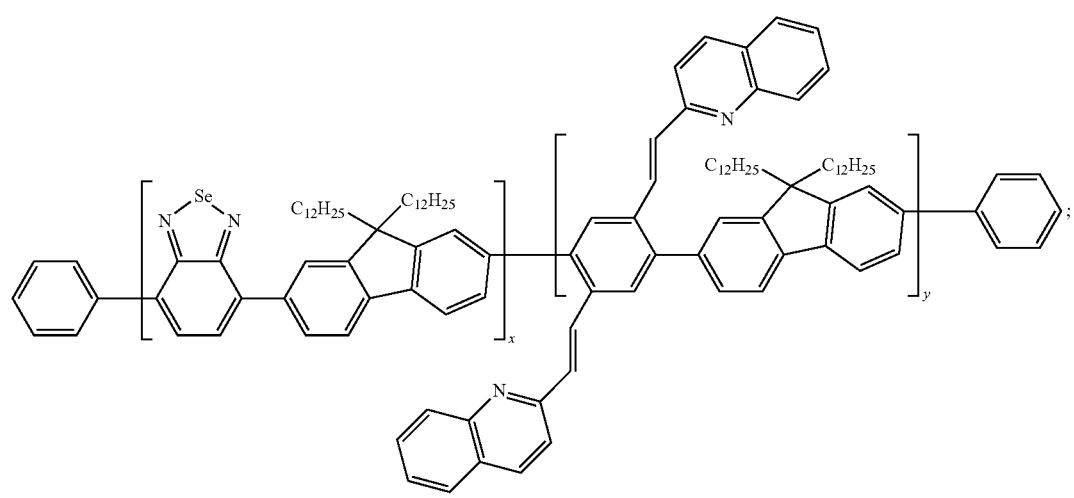
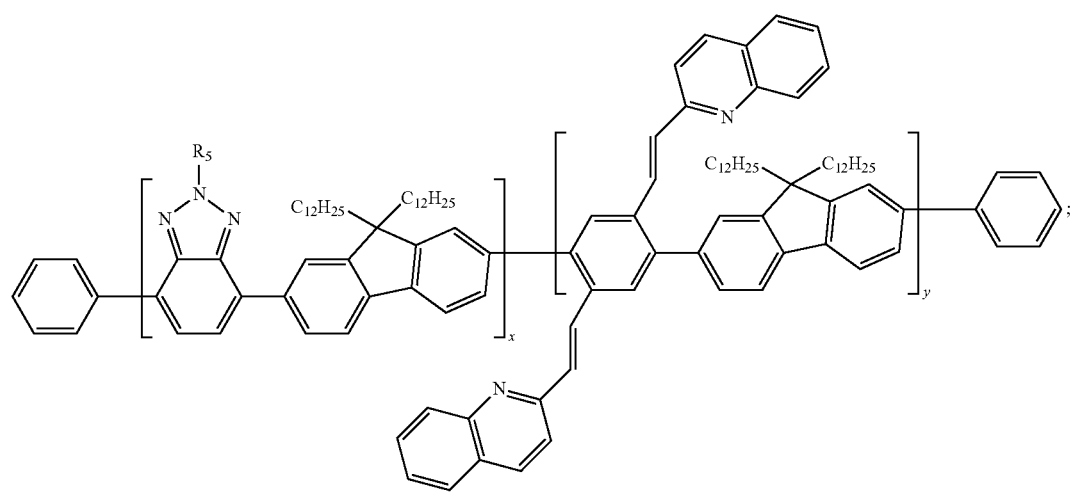

-continued
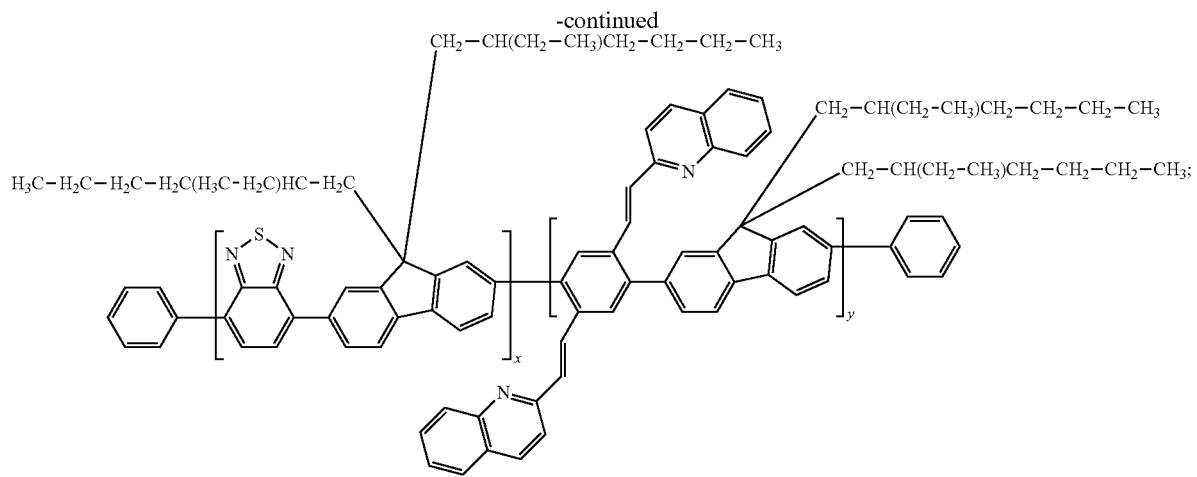
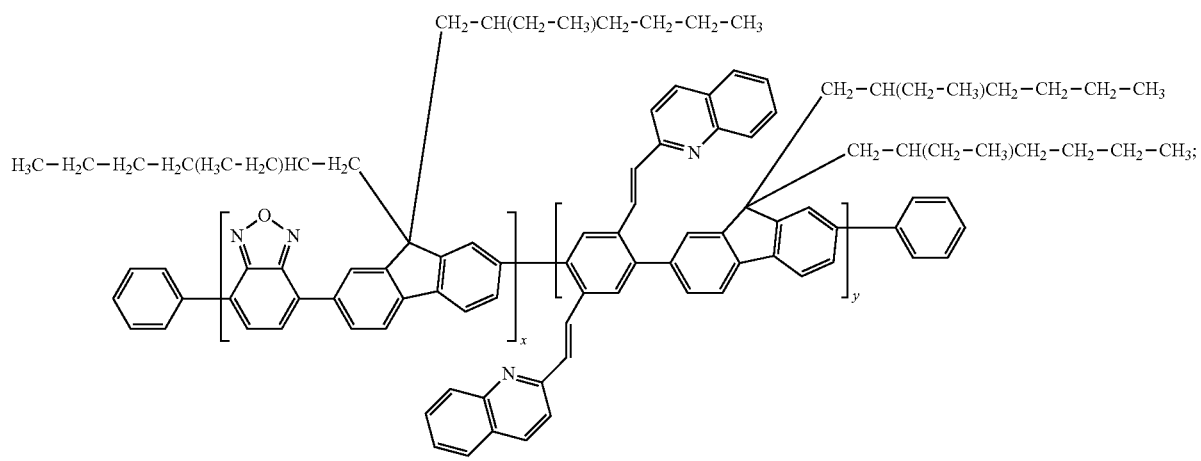
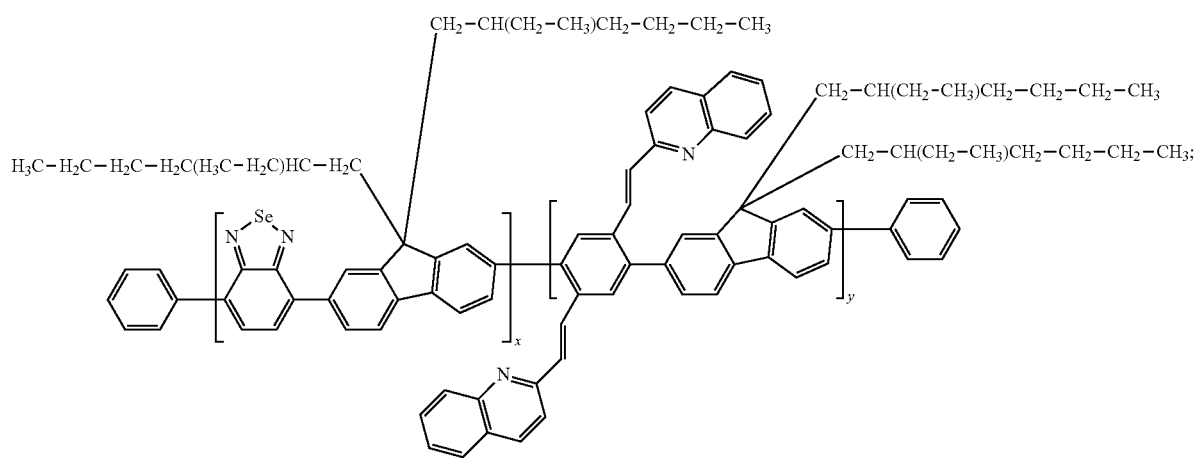

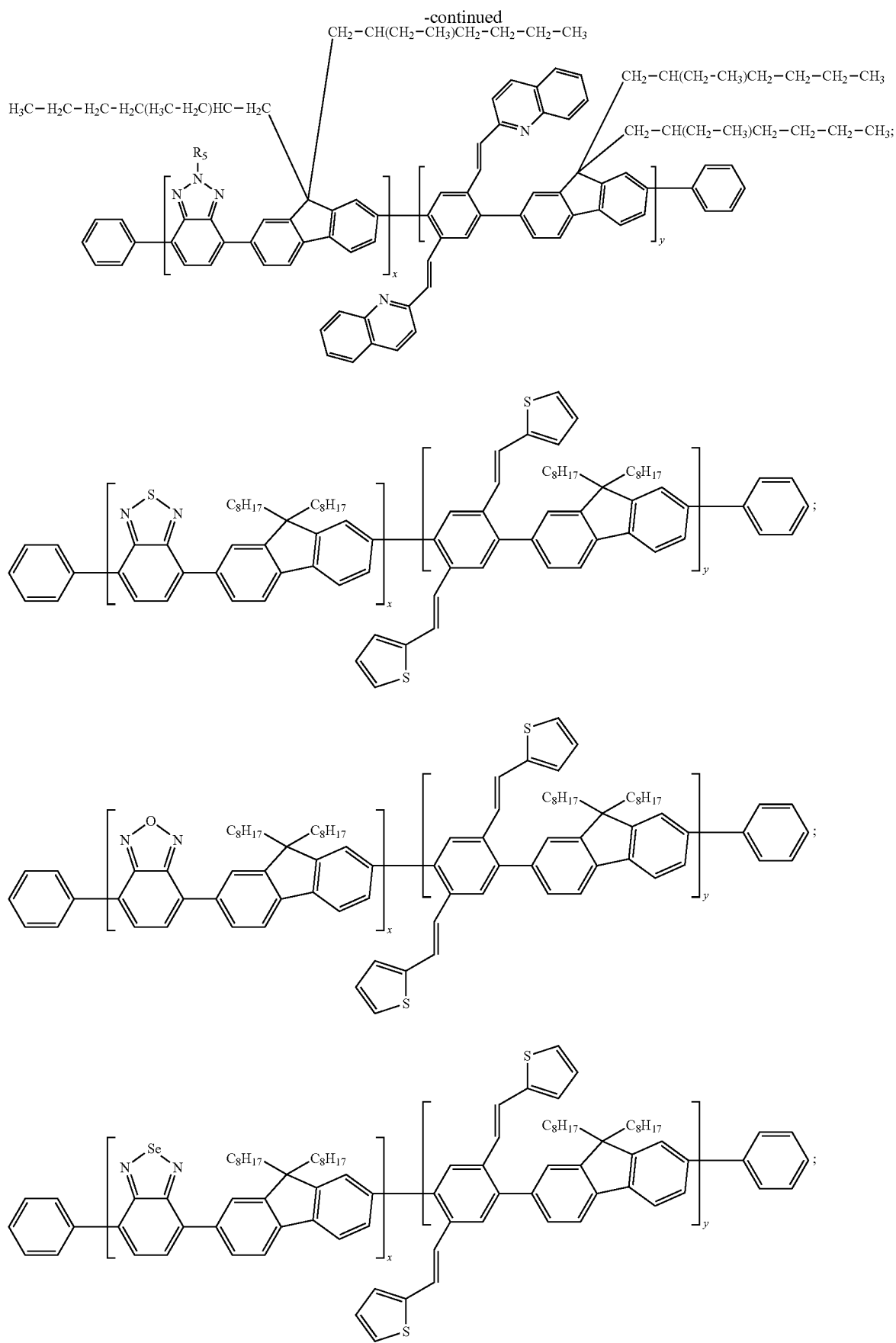

-continued
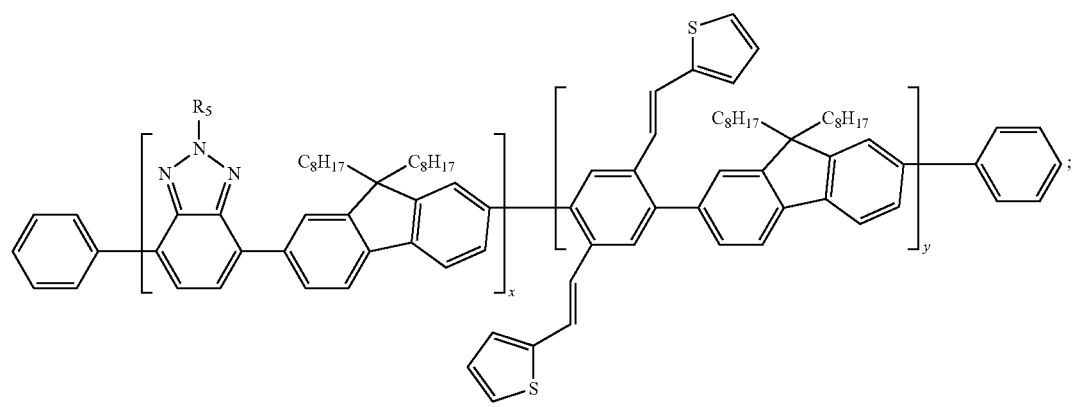
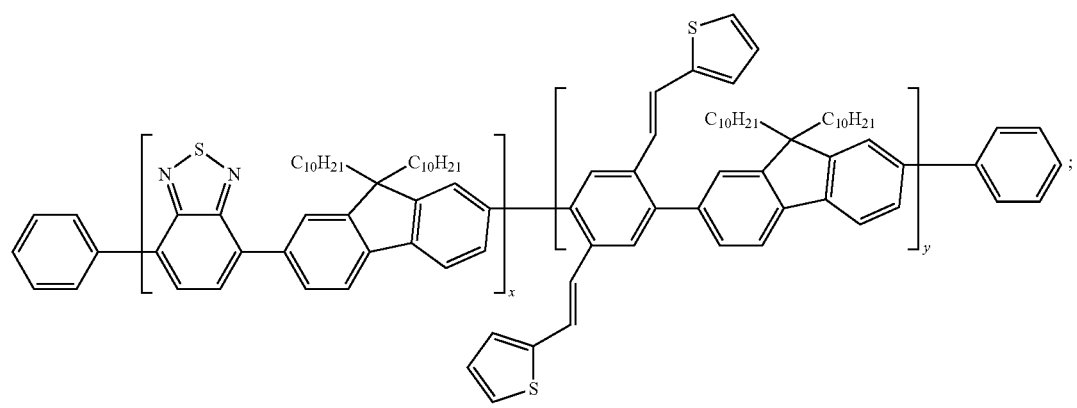
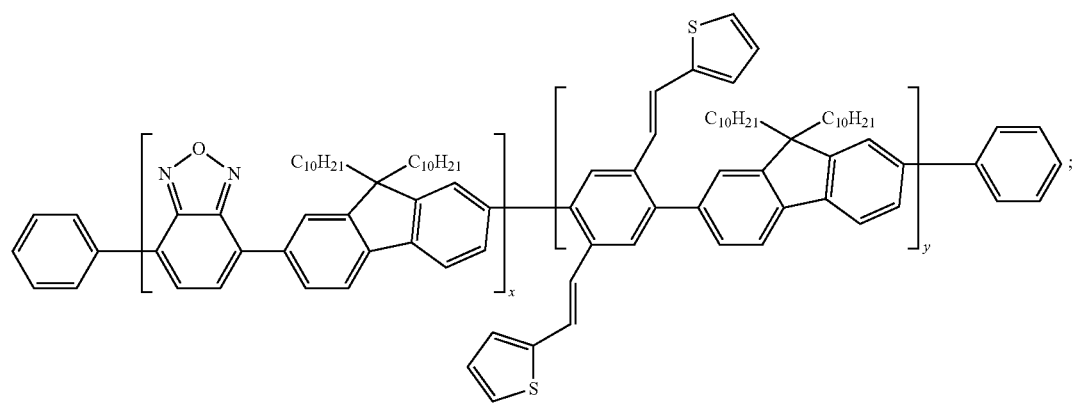
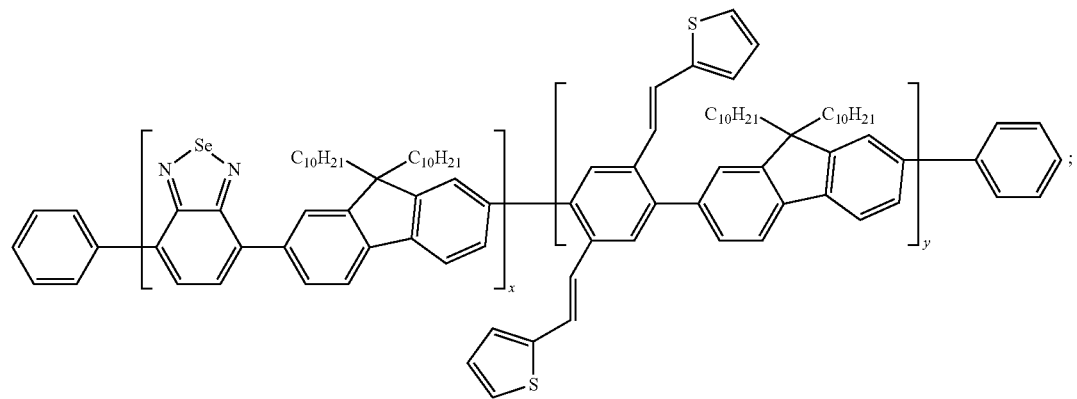

-continued
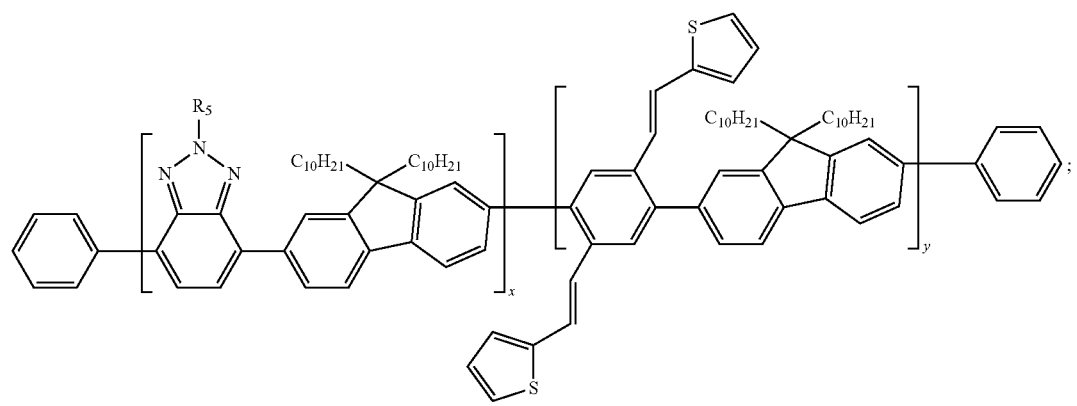
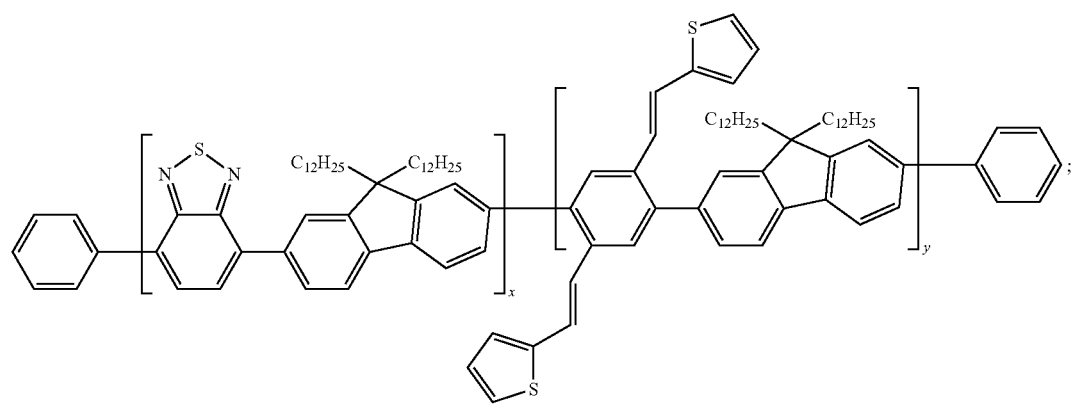
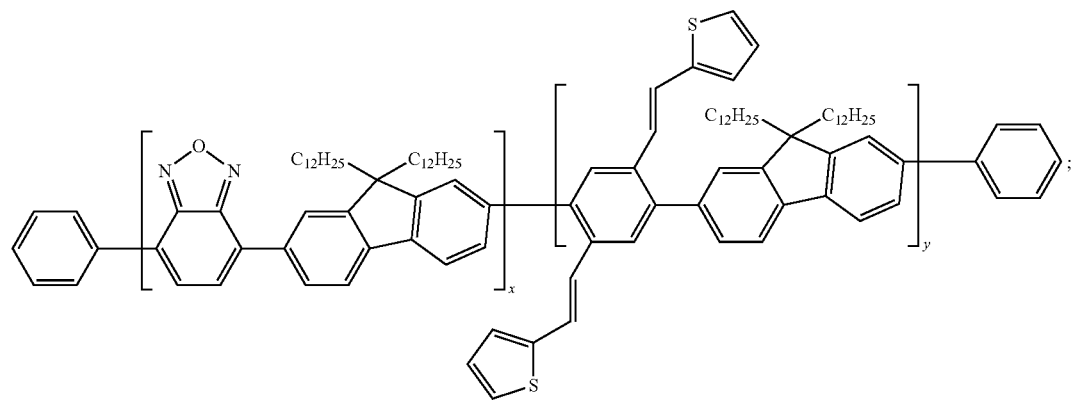
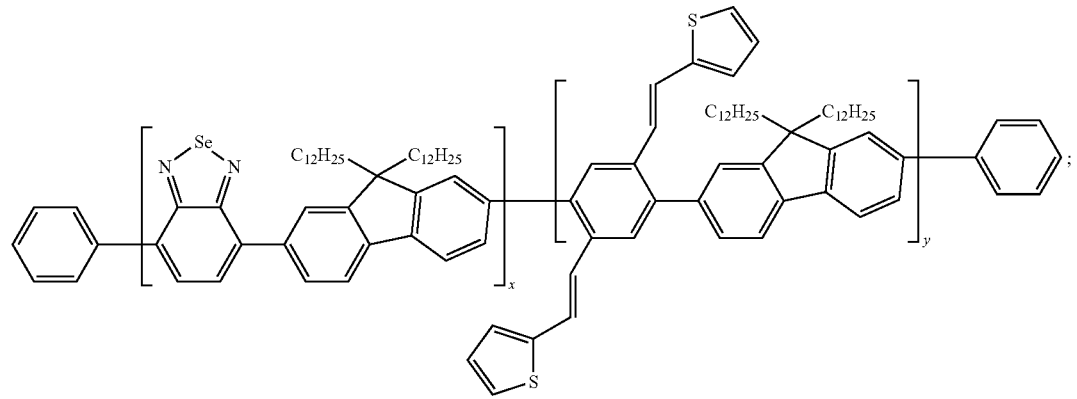

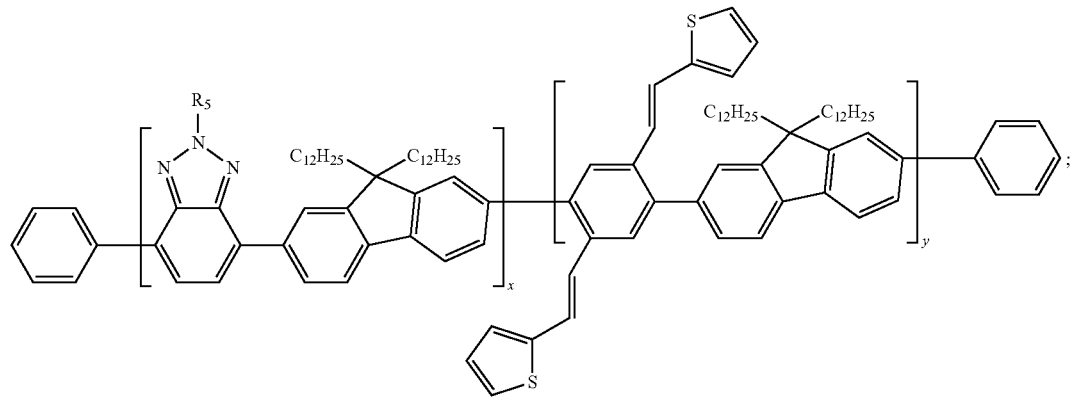
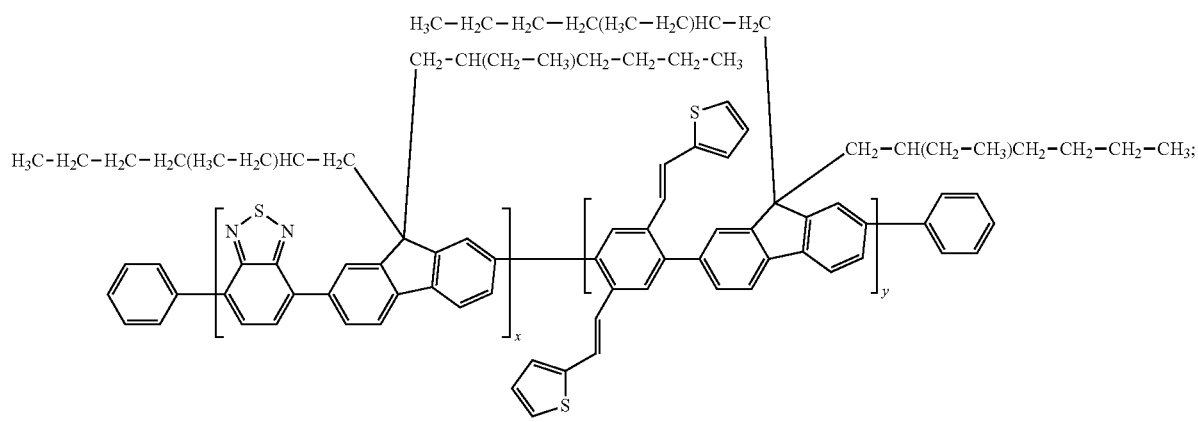
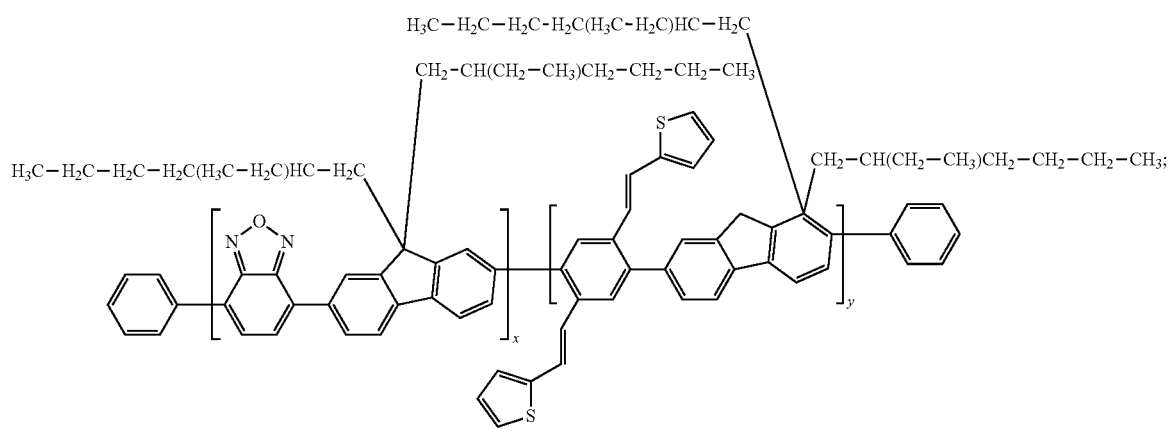
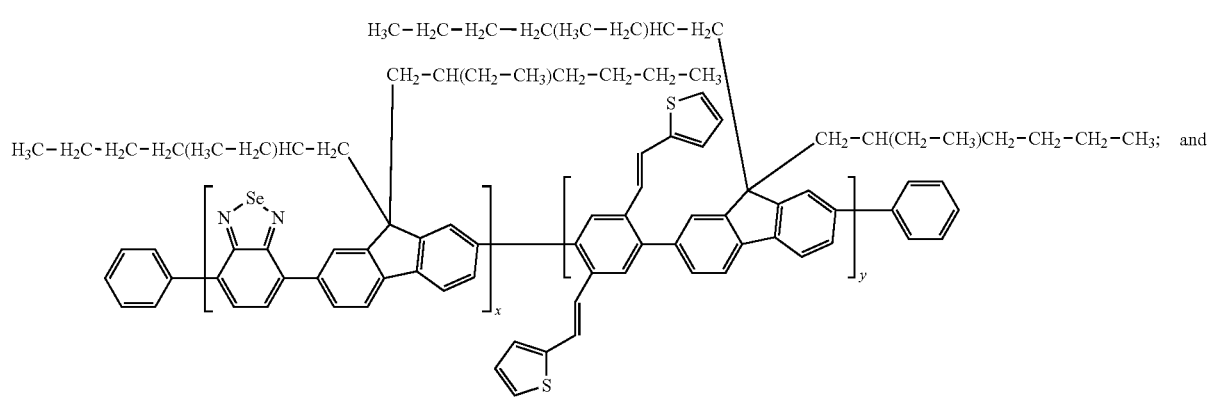

-continued

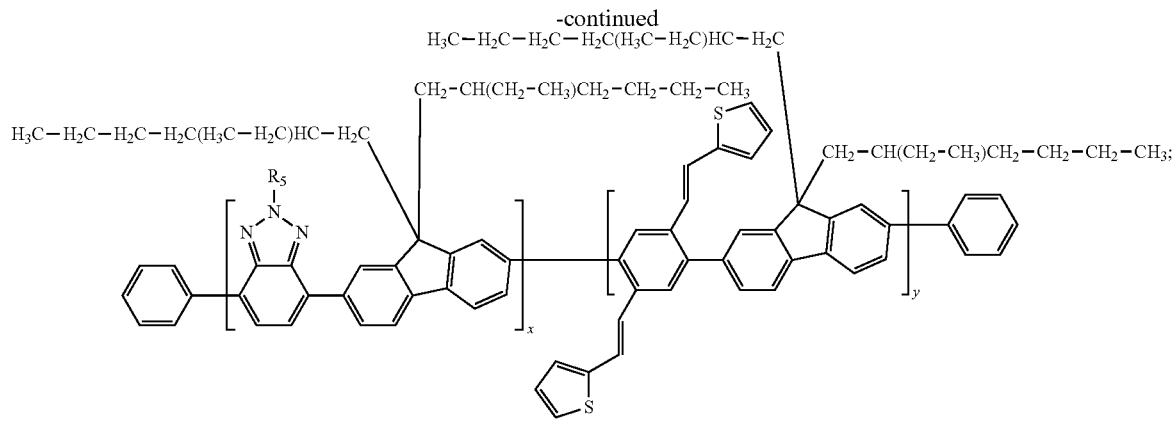

wherein $R_5$ is defined hereinabove and x and y are integers independently ranging from 1 to 10,000.

In some embodiments, a conjugated polymer or oligomer of the light emitting polymeric or oligomeric phase comprising repeating units A and C is a conjugated polymer or oligomer of Formula (II):

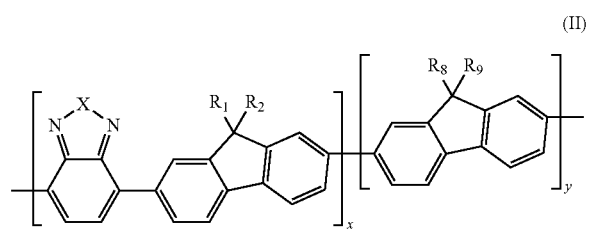

(II)

wherein X, $R_1$, $R_2$, $R_8$ and $R_9$ are defined above and x and y are integers independently ranging from 1 to 10,000. As described herein, in some embodiments, repeating units A and C of a conjugated polymer or oligomer of Formula (II) are arranged to provide an alternating copolymer, a block copolymer, statistical copolymer or a random copolymer.

In some embodiments, a conjugated polymer or oligomer of Formula (II) has a weight average molecular weight ($M_w$) ranging from about 1,000 to about 1,000,000. In some embodiments, a conjugated polymer or oligomer of Formula (II) has a number average molecular weight ($M_n$) ranging from about 500 to about 500,000.

In some embodiments, a conjugated polymer or oligomer of Formula (II) described herein is selected from the group consisting of:

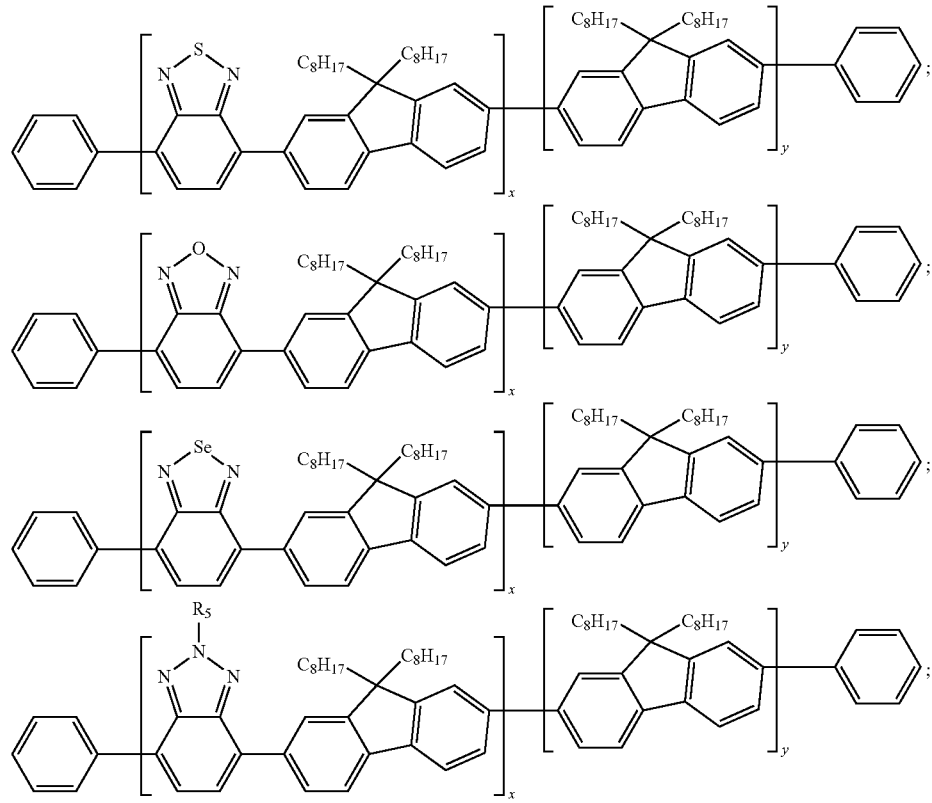

-continued
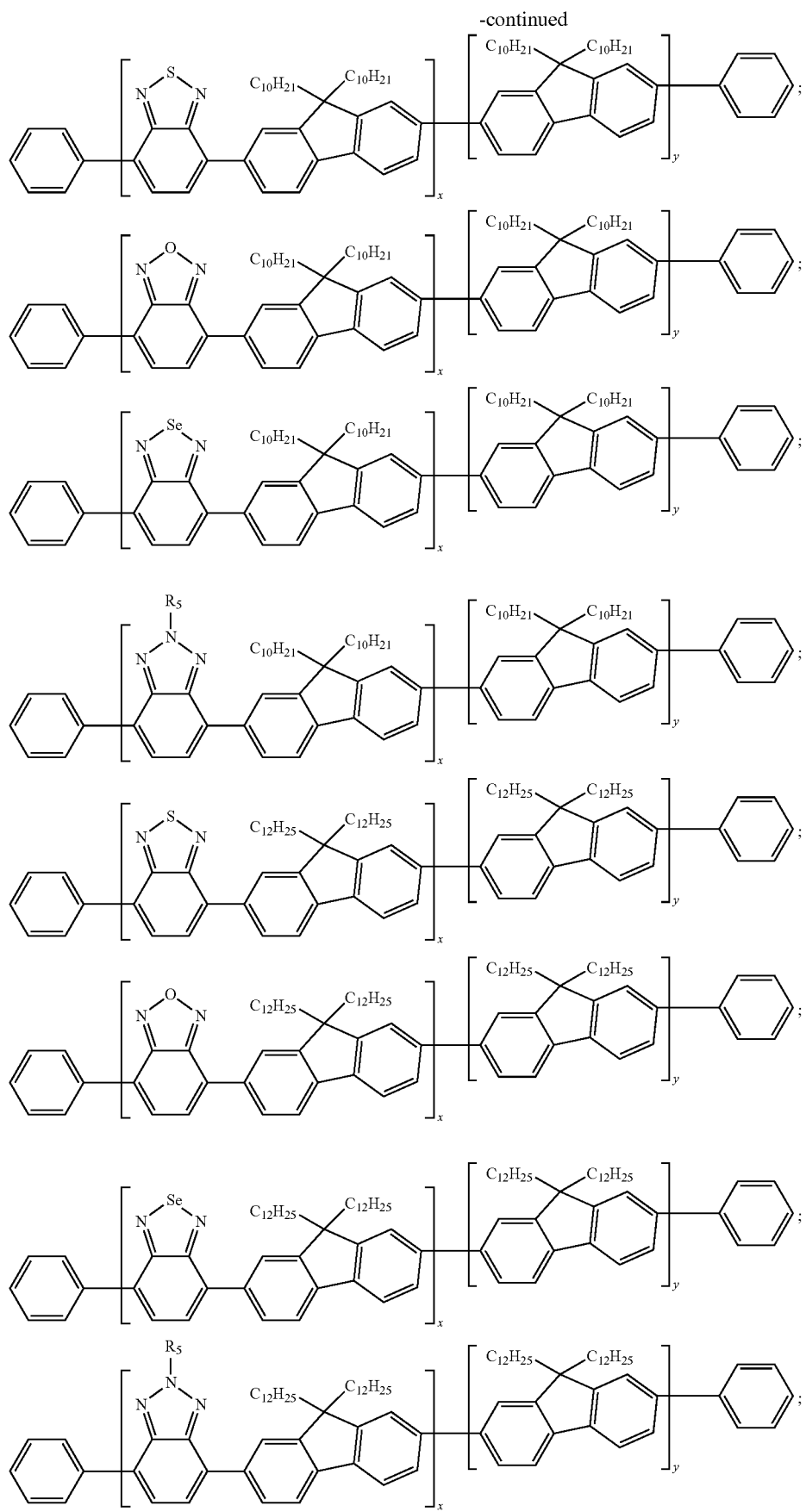

-continued

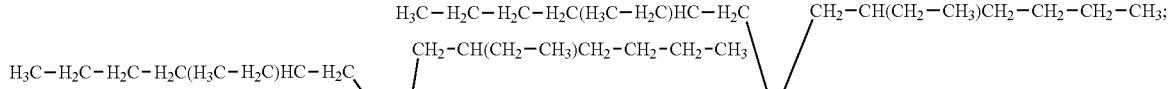

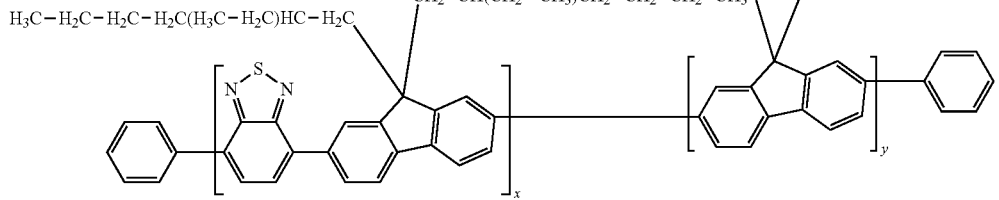

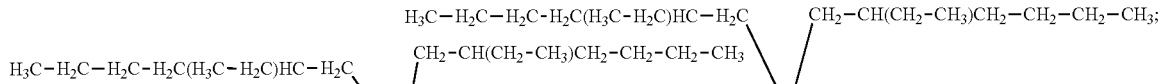

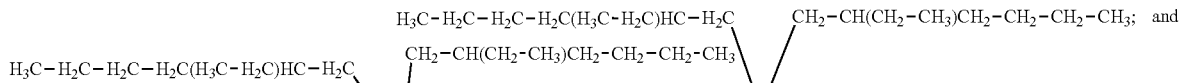

wherein $R_5$ is defined hereinabove and x and y are integers independently ranging from 1 to 10,000.

In some embodiments, a conjugated polymer or oligomer of the light emitting polymeric or oligomeric phase comprising repeating units B and C is a conjugated polymer or oligomer of Formula (III):

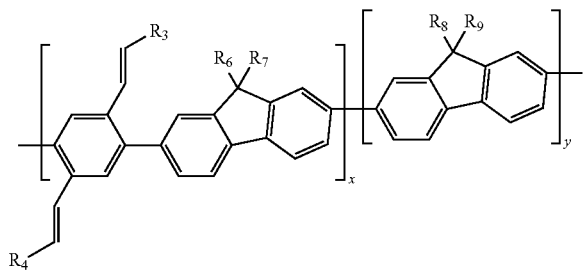

(III)

wherein $R_3$, $R_4$, $R_6$, $R_7$, $R_8$ and $R_9$ are defined above and x and y are integers independently ranging from 1 to 10,000.

As described herein, in some embodiments, repeating units B and C of a conjugated polymer or oligomer of Formula (III) are arranged to provide an alternating copolymer, a block copolymer, statistical copolymer or a random copolymer.

In some embodiments, a conjugated polymer or oligomer of Formula (III) has a weight average molecular weight ($M_w$) ranging from about 1,000 to about 1,000,000. In some embodiments, a conjugated polymer or oligomer of Formula (III) has a number average molecular weight ($M_a$) ranging from about 500 to about 500,000.

In some embodiments, a conjugated polymer or oligomer of Formula (III) described herein is selected from the group consisting of:

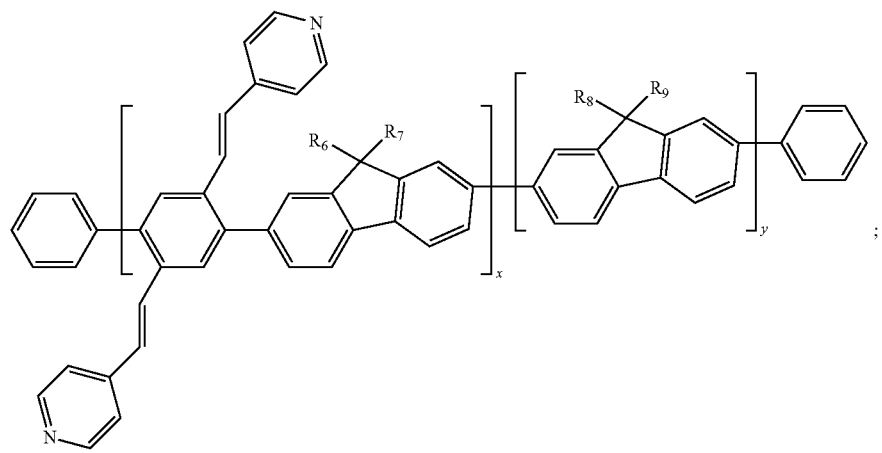
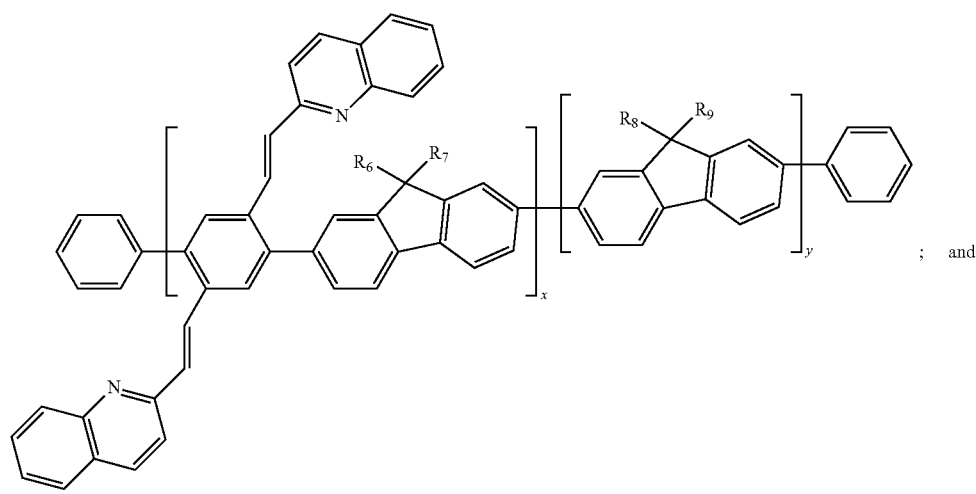
; and
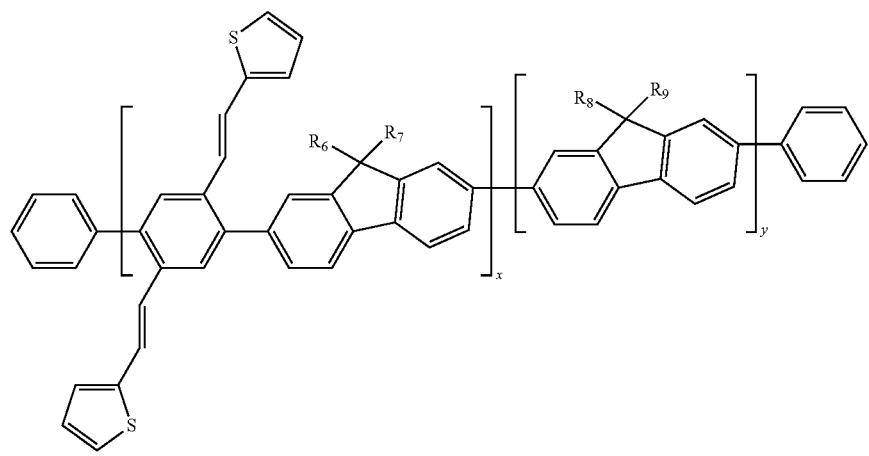
wherein $R_6$, $R_7$, $R_8$ and $R_9$ are defined above and x and y are integers independently ranging from 1 to 10,000, In some embodiments, a conjugated polymer or oligomer of Formula (III) described herein is selected from the group consisting of:
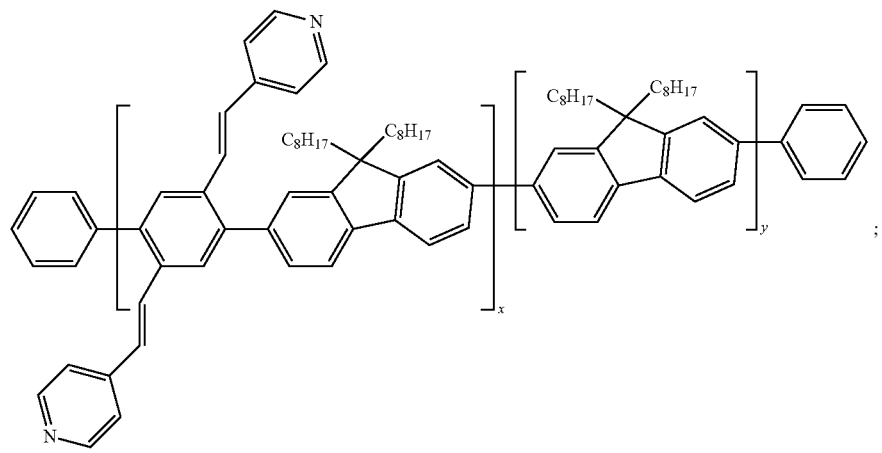
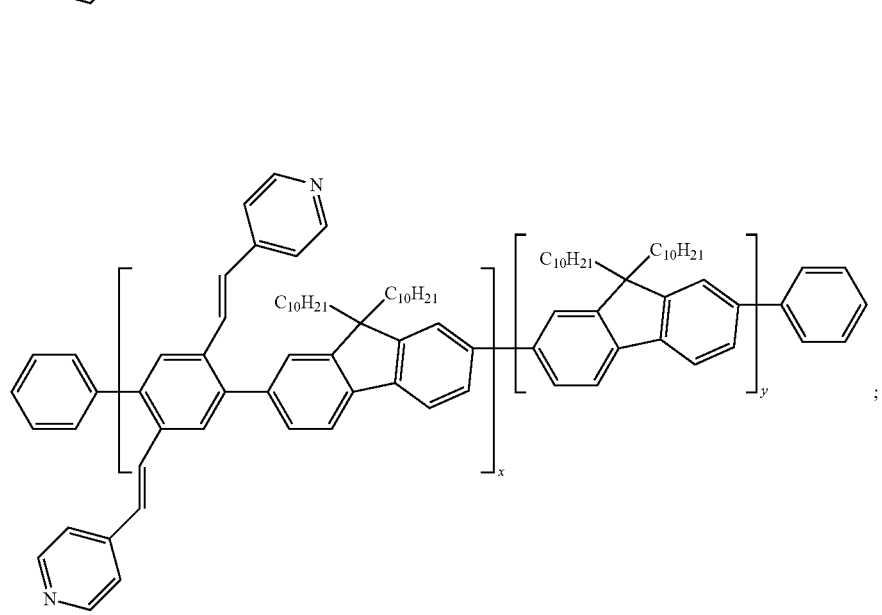
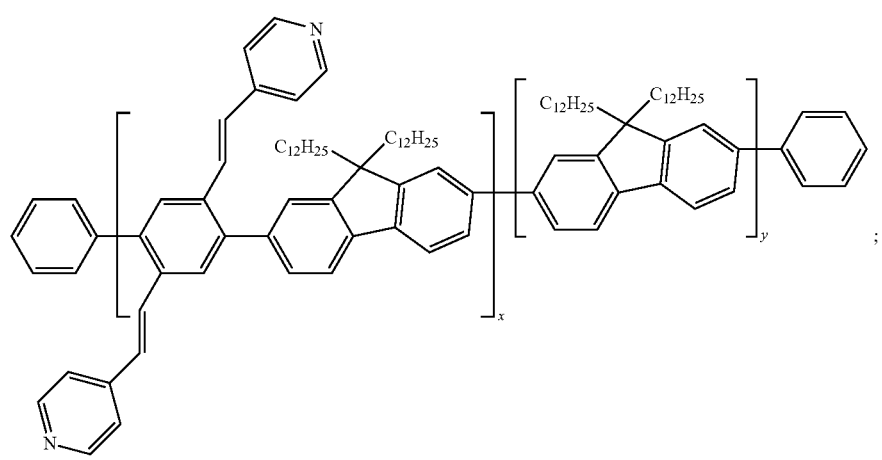

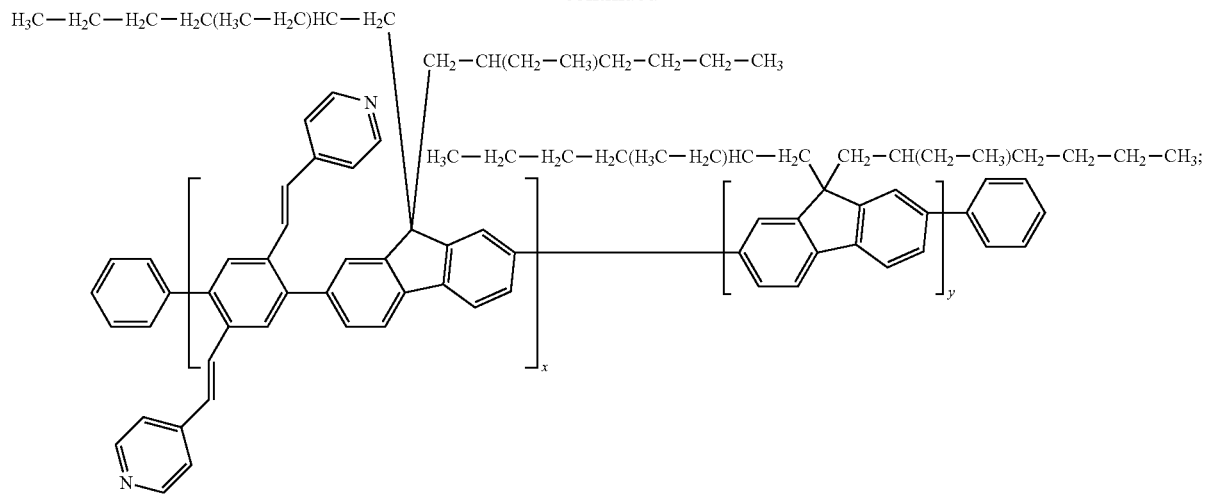
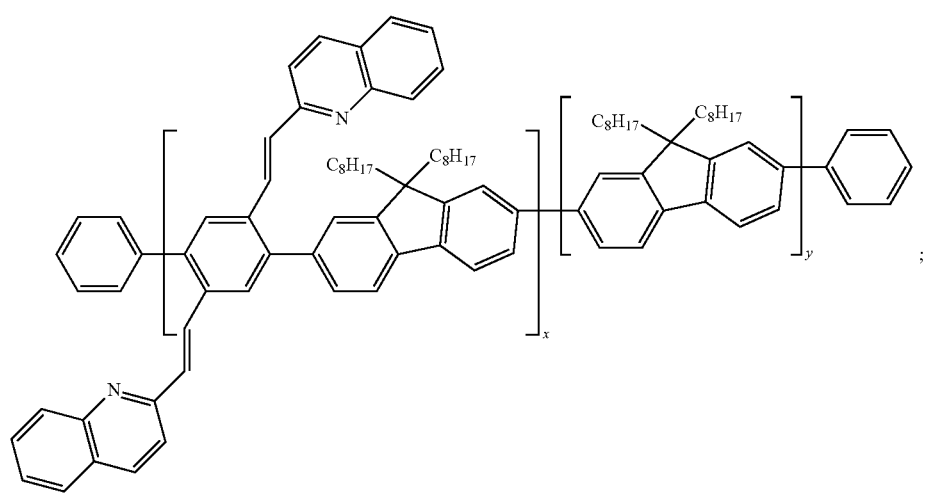
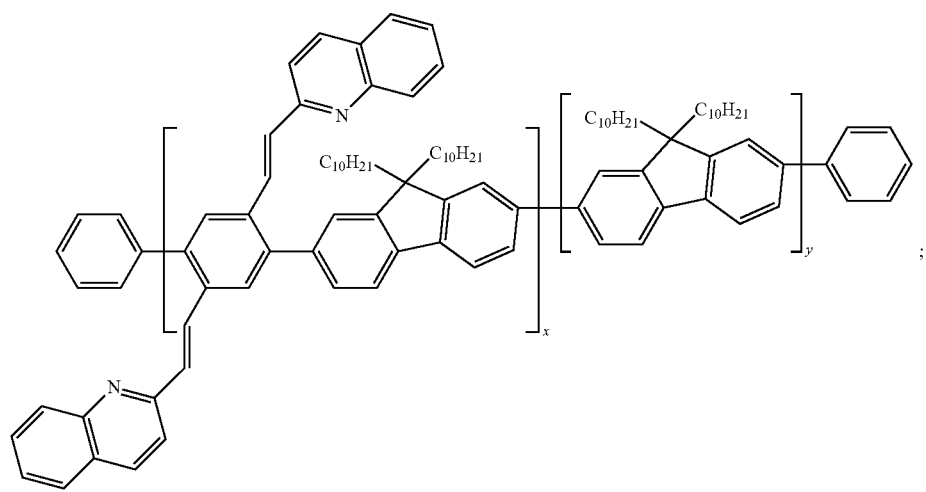

-continued
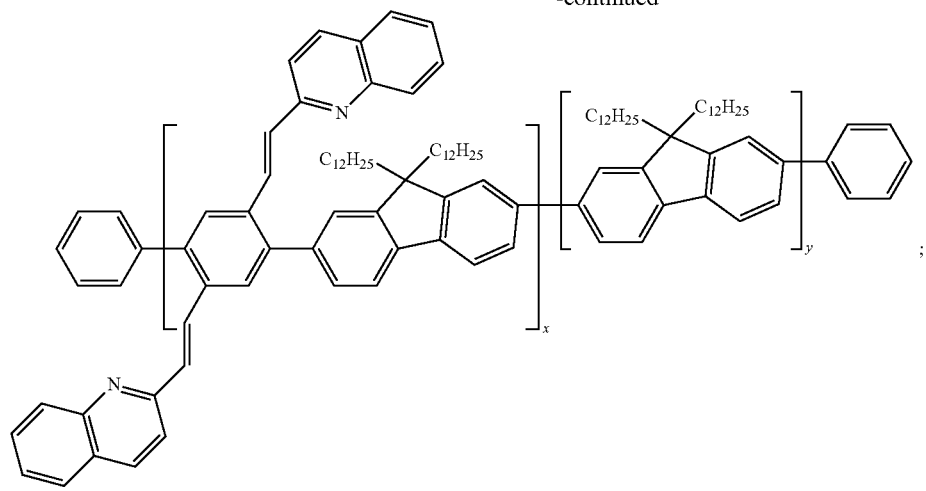
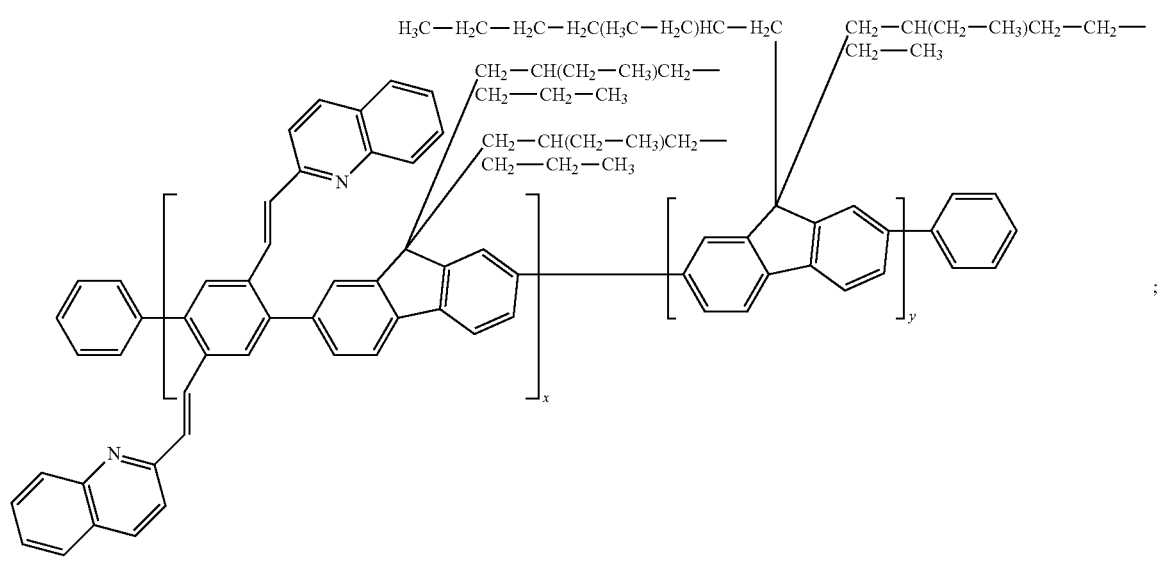
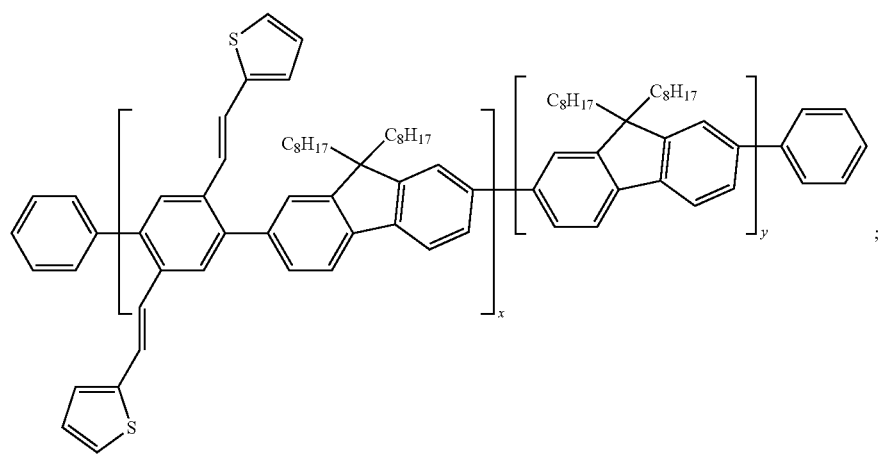

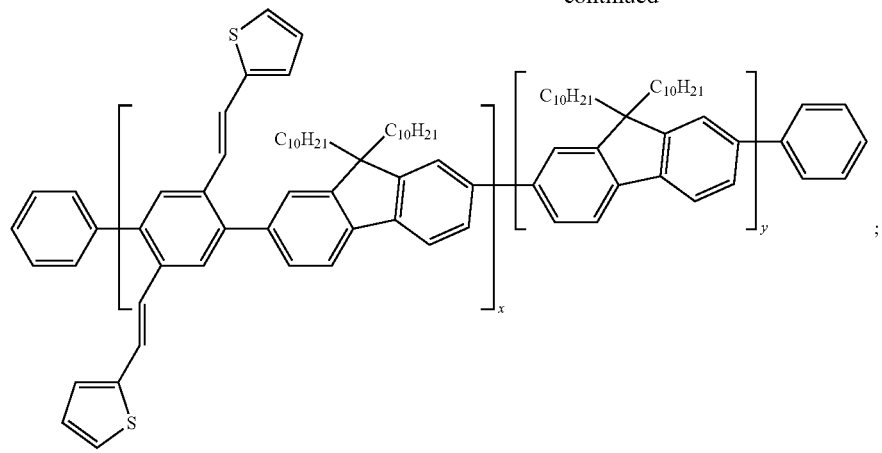
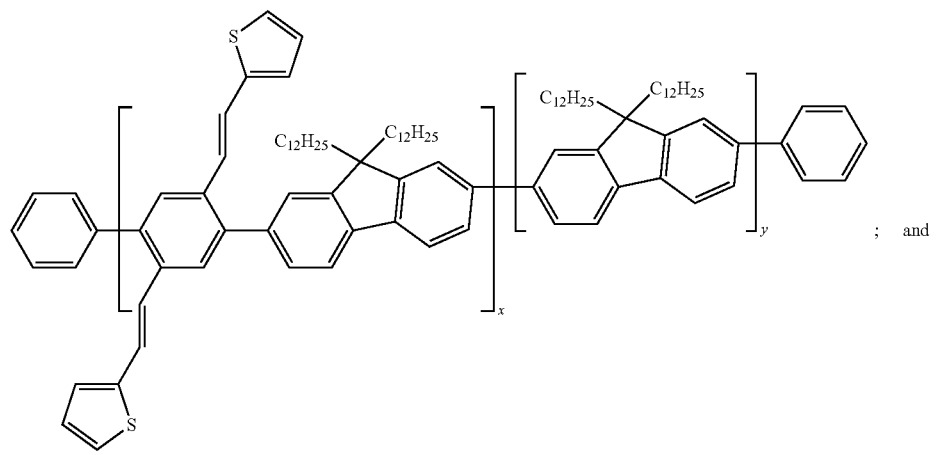
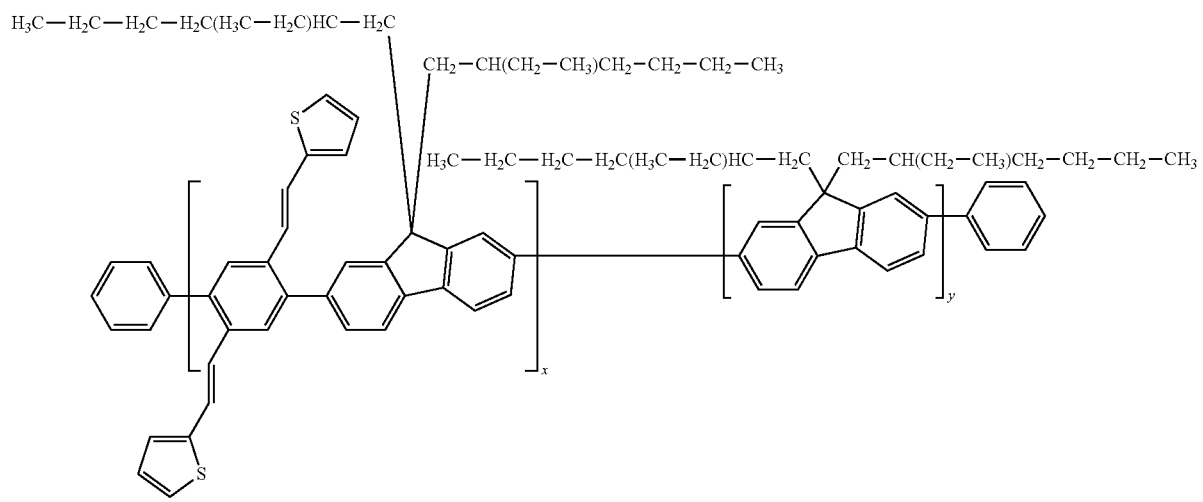
wherein x and y are integers independently ranging from 1 to 10,000.

In some embodiments, a conjugated polymer or oligomer of a light emitting polymeric or oligomeric phase comprising repeating units A, B and C is a conjugated polymer or oligomer of Formula (IV):

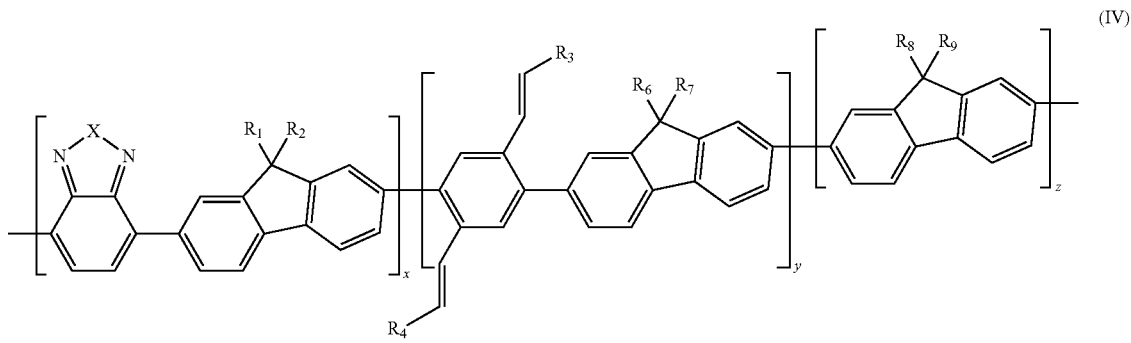

(IV)

wherein X, $R_1$, $R_2$, $R_3$, $R_4$, $R_6$, $R_7$, $R_8$ and $R_9$ are defined above and x, y and z are integers independently ranging from 1 to 10,000. As described herein, in some embodiments, repeating units A, B and C of a conjugated polymer or oligomer of Formula (IV) are arranged to provide an alternating copolymer, a block copolymer, statistical copolymer or a random copolymer.

In some embodiments, a conjugated polymer or oligomer of Formula (IV) has a weight average molecular weight ($M_w$) ranging from about 1,000 to about 1,000,000. In some embodiments, a conjugated polymer or oligomer of Formula (IV) has a number average molecular weight ($M_n$) ranging from about 500 to about 500,000.

In some embodiments, a conjugated polymer of oligomer of Formula (IV) described herein is selected from the group consisting of:

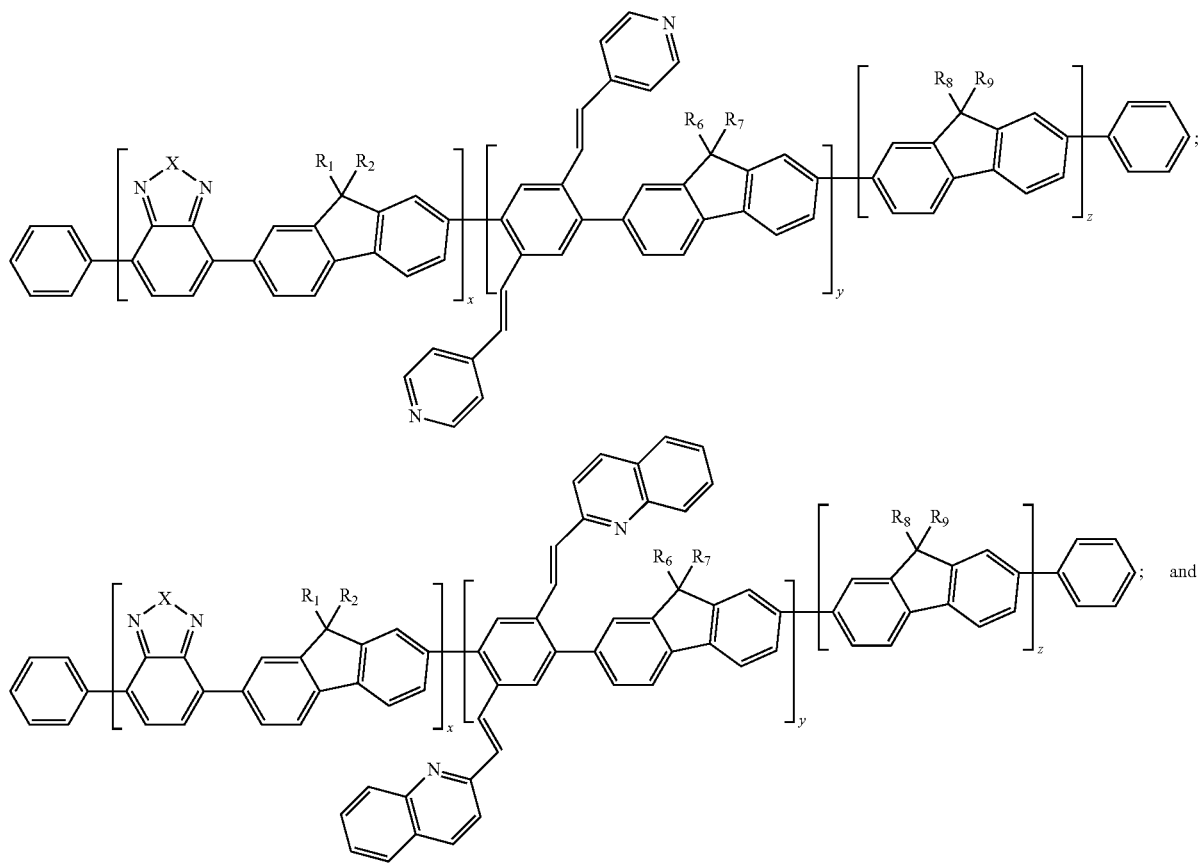

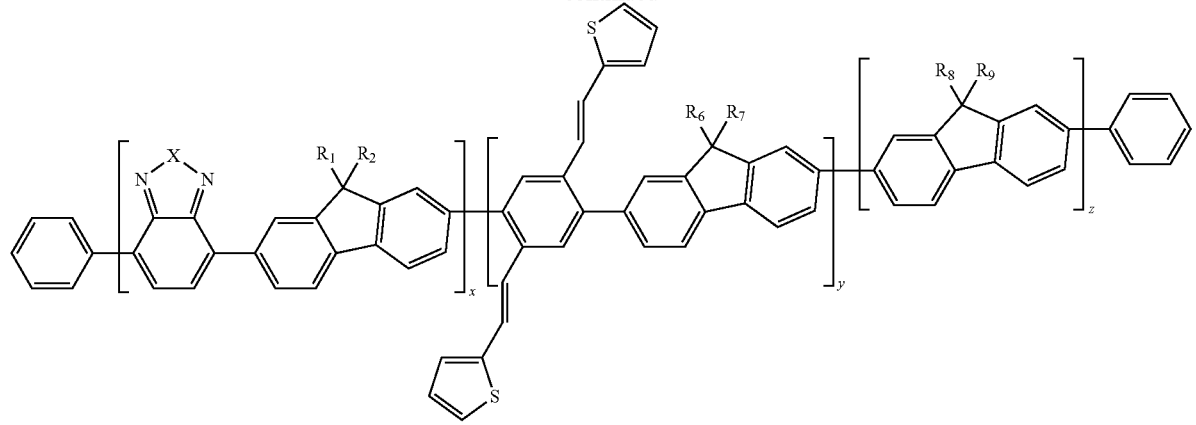
wherein X, $R_1$, $R_2$, $R_6$, $R_7$, $R_8$ and $R_9$ are defined above and x, y and z are integers independently ranging from 1 to 10,000.
In some embodiments, a conjugated polymer or oligomer of Formula (IV) described herein is selected from the group consisting of:
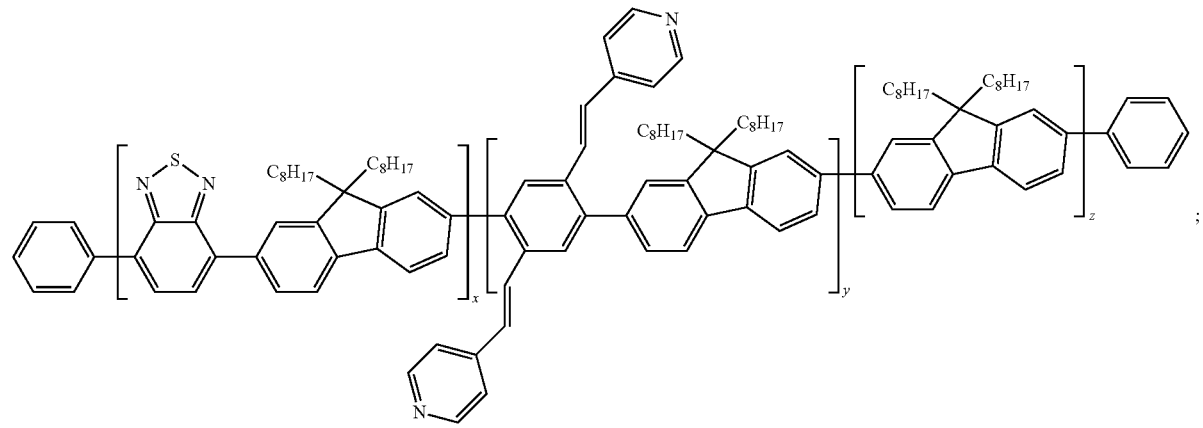
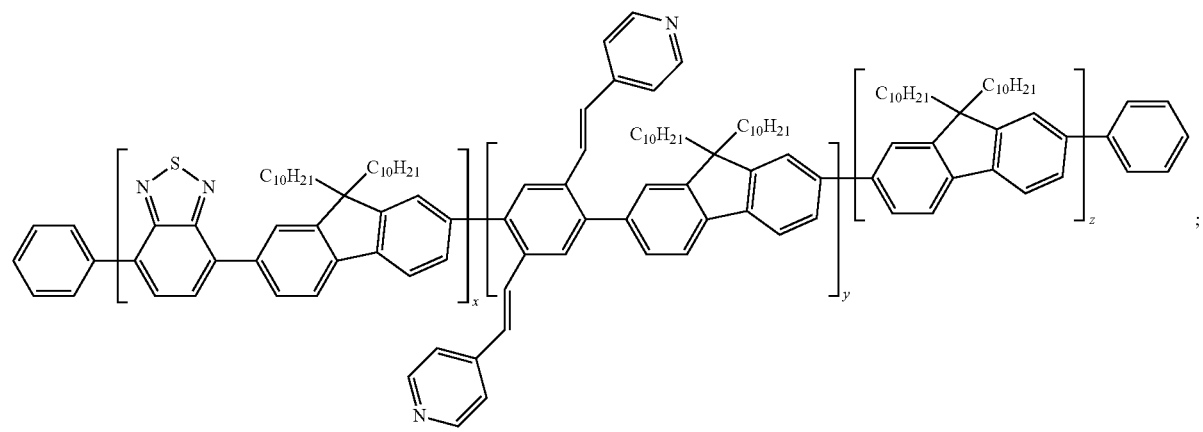

-continued
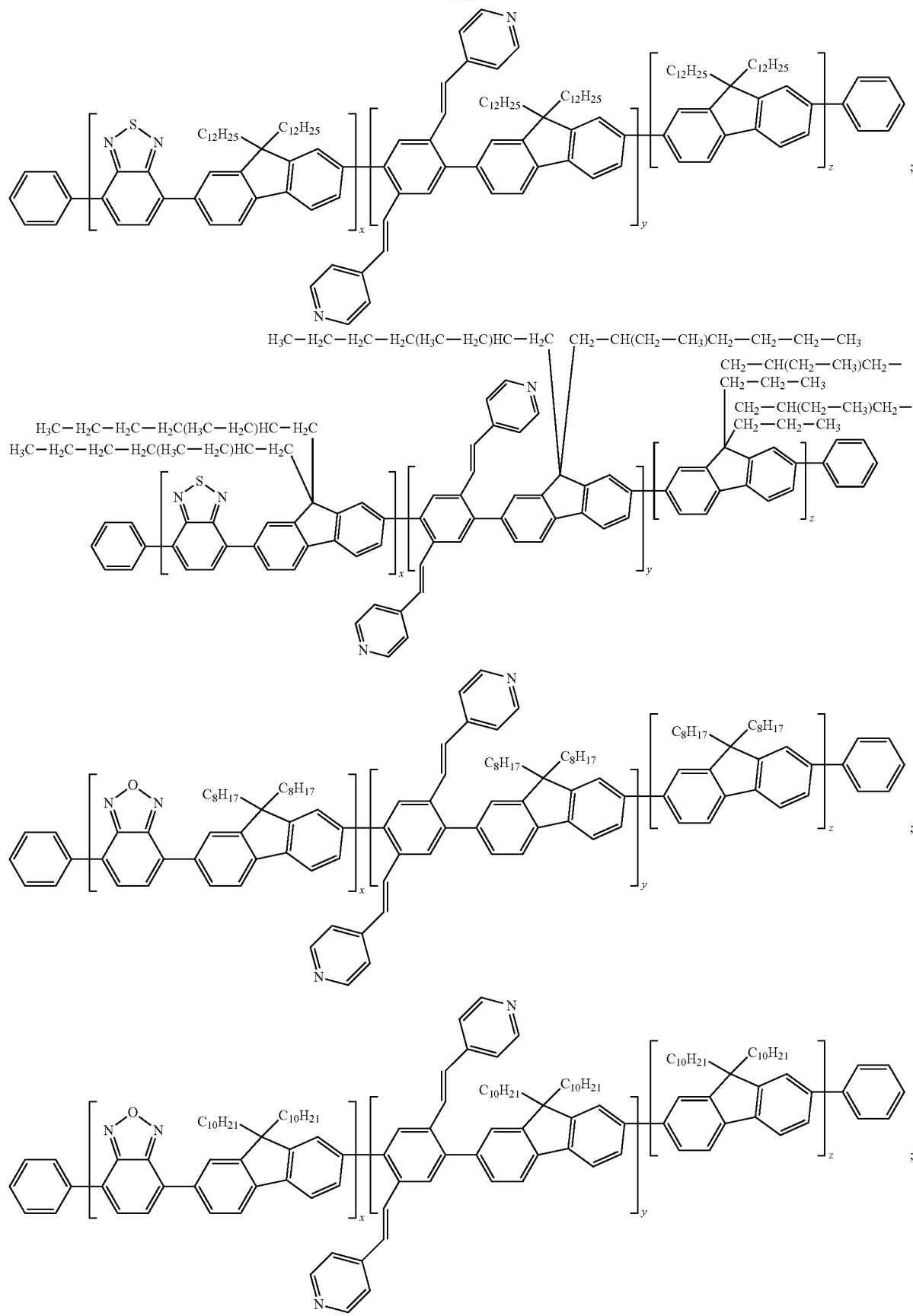

-continued
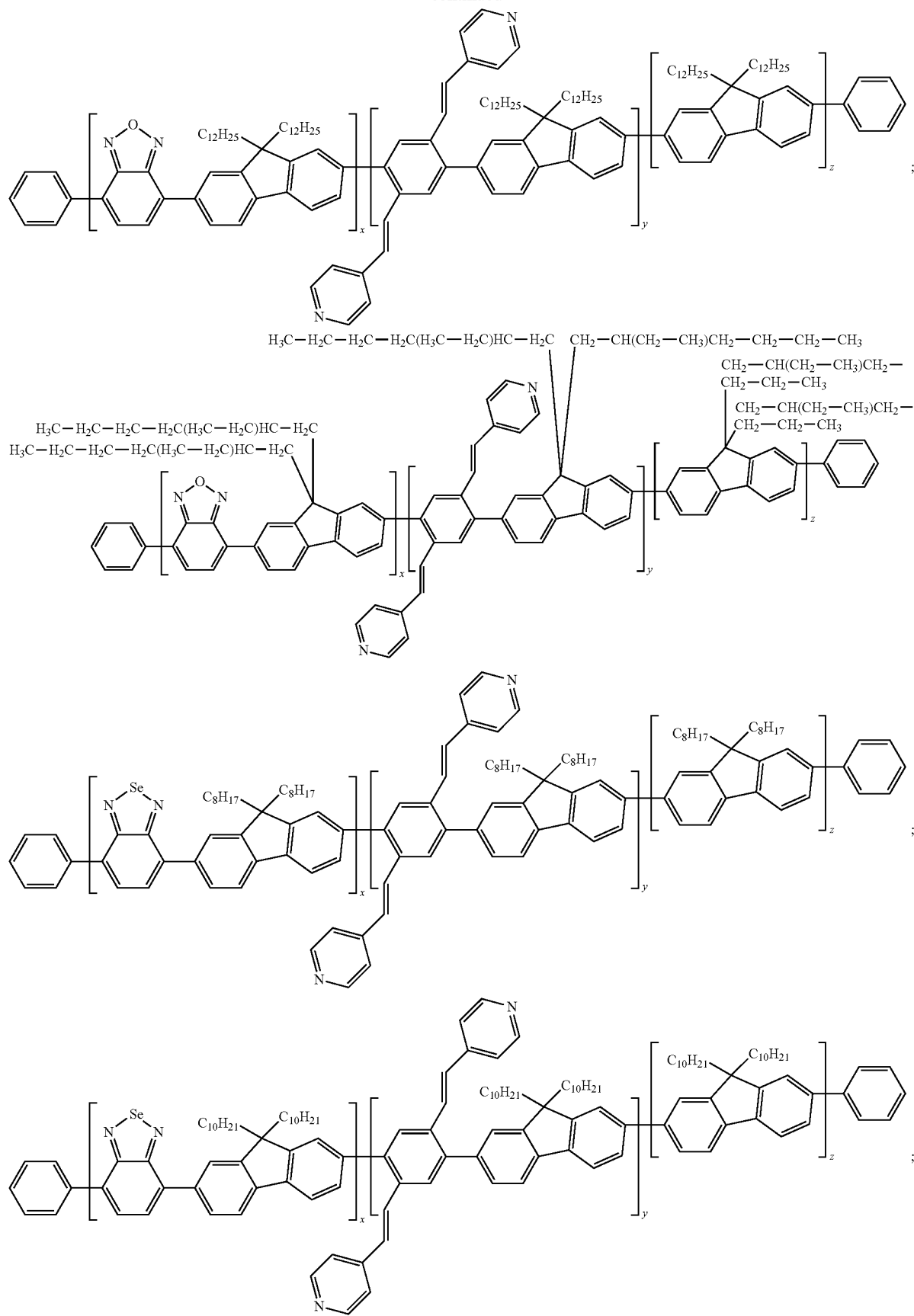

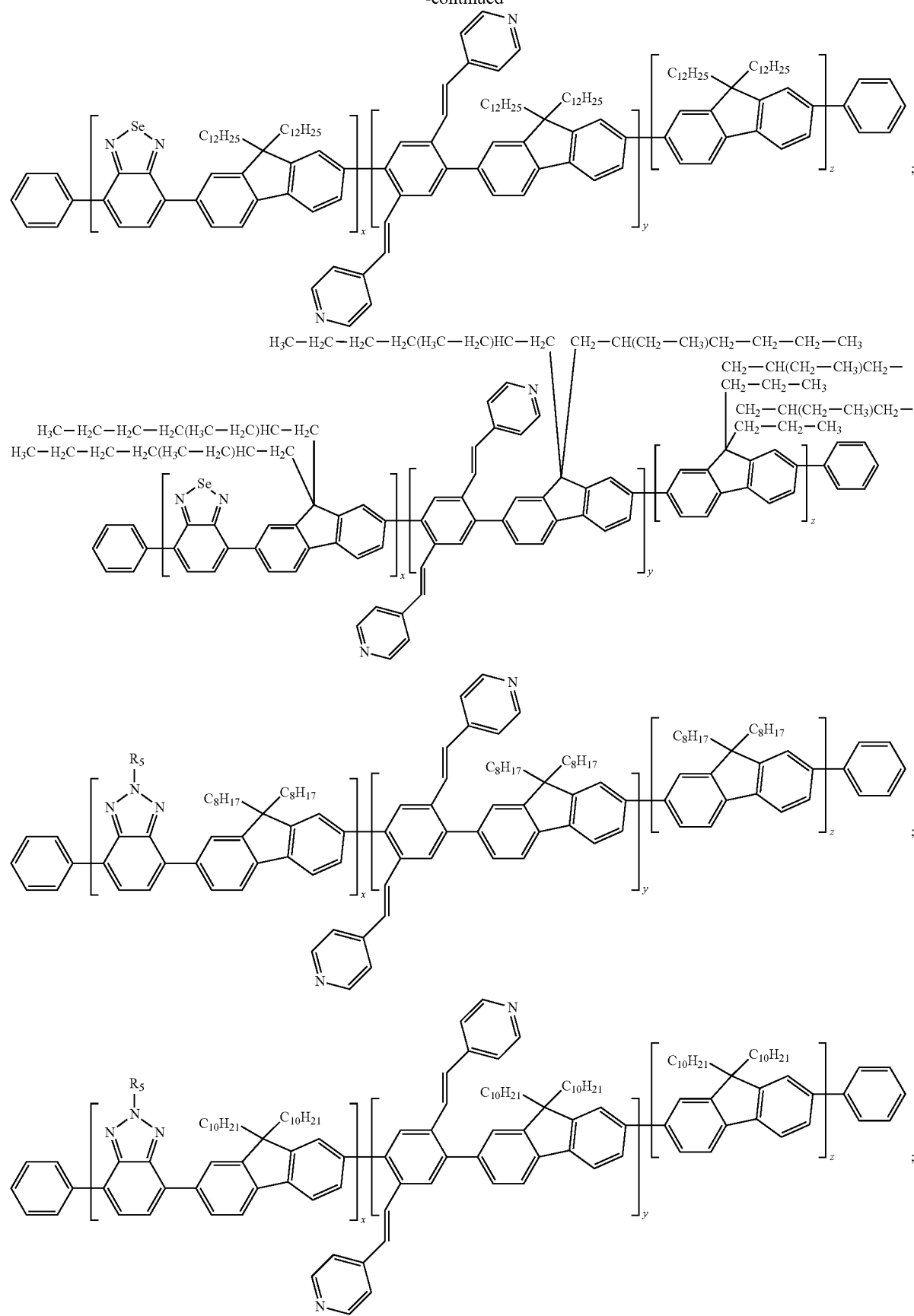

-continued
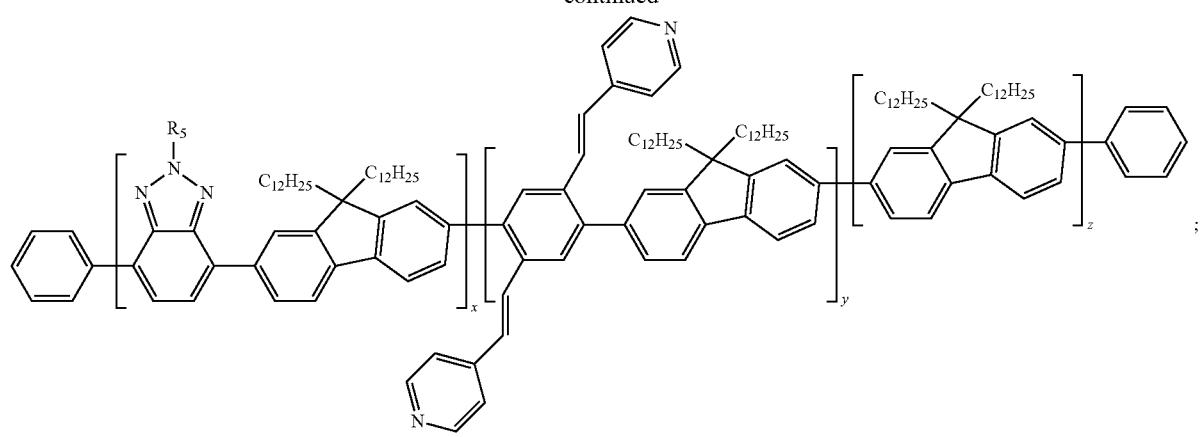
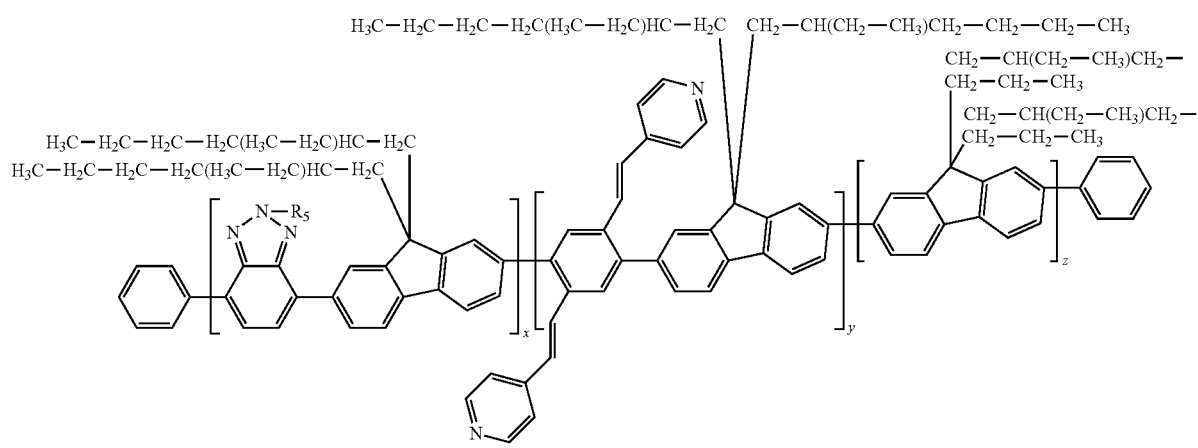
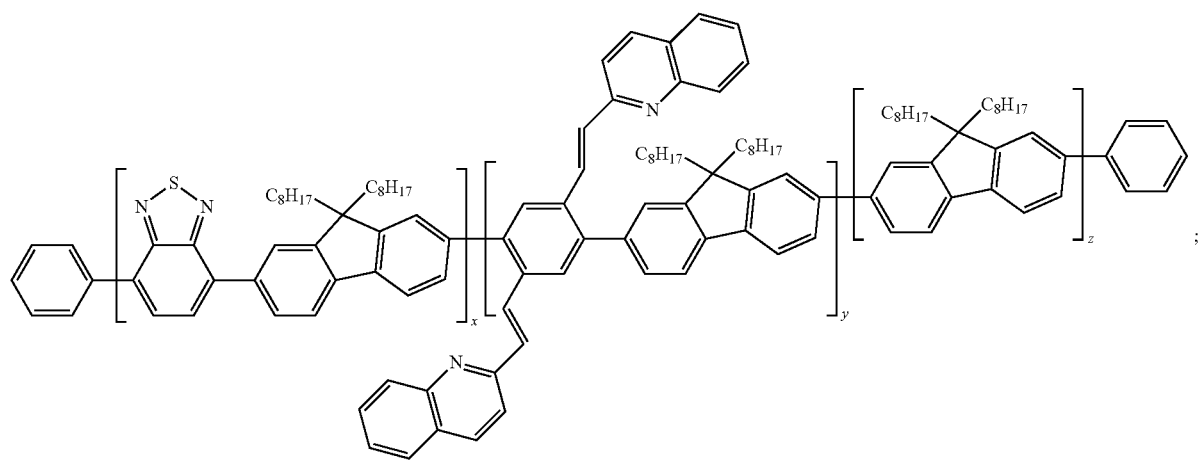

-continued
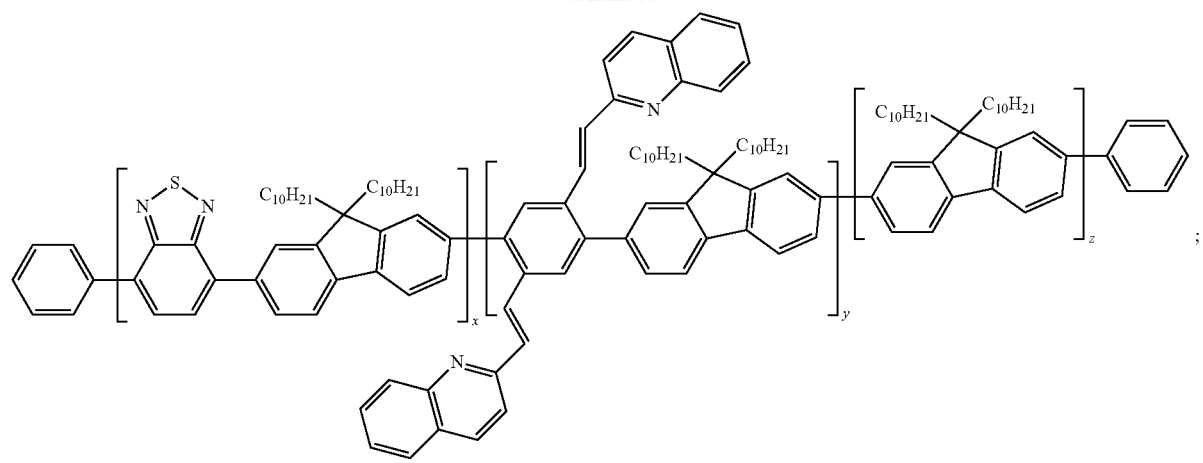
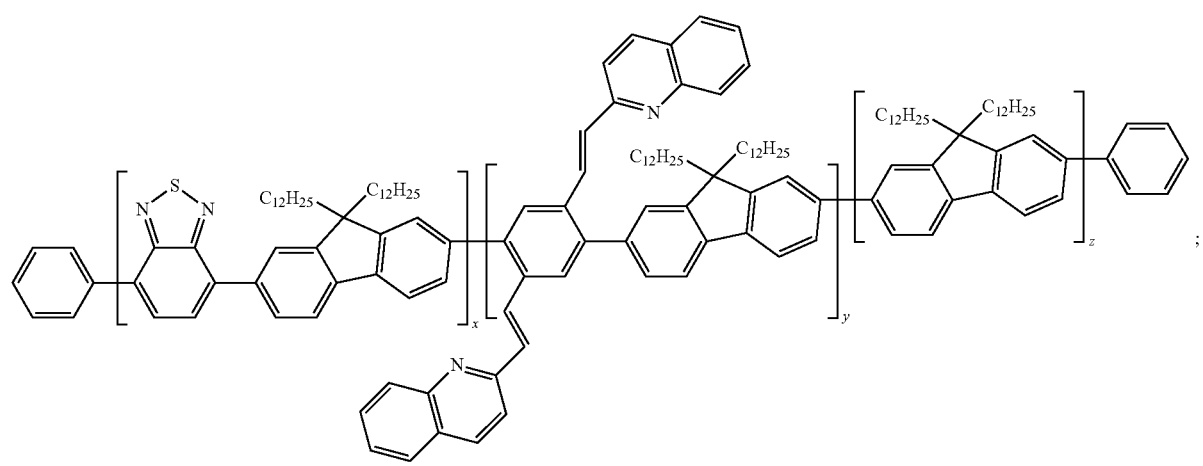
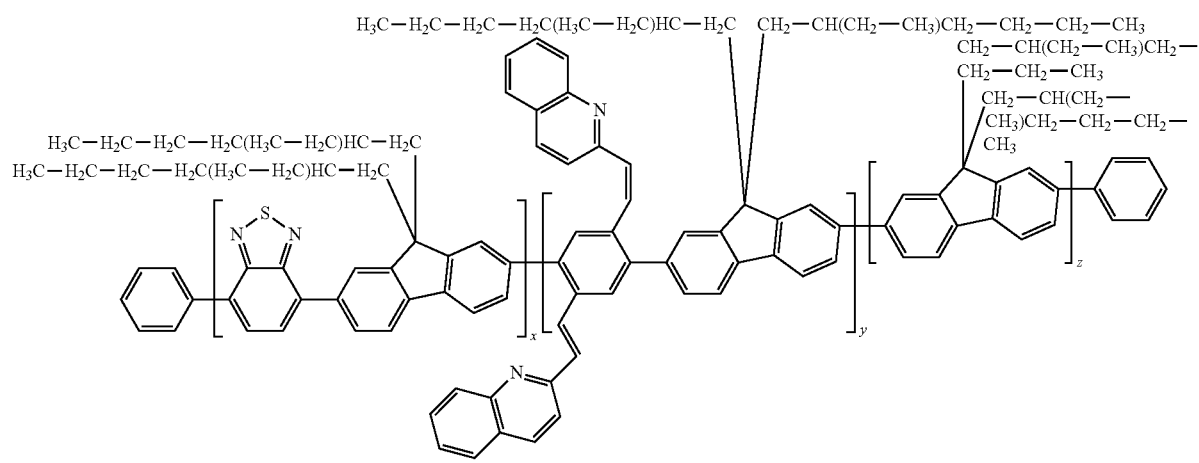

-continued
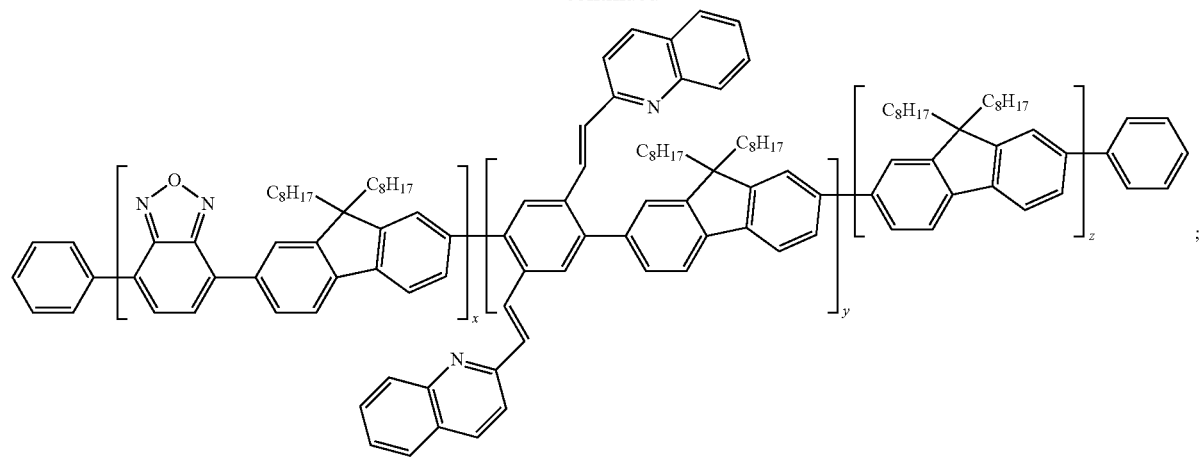
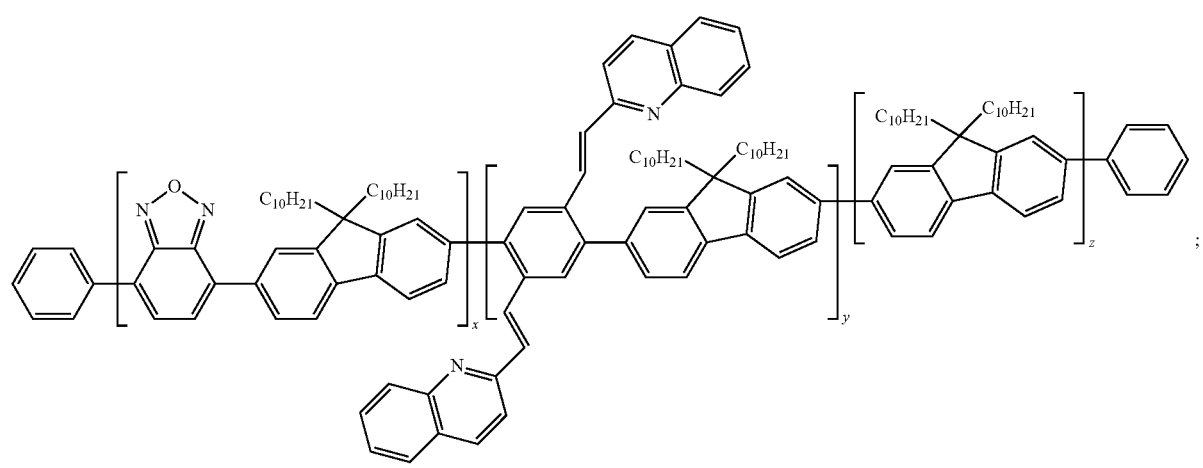
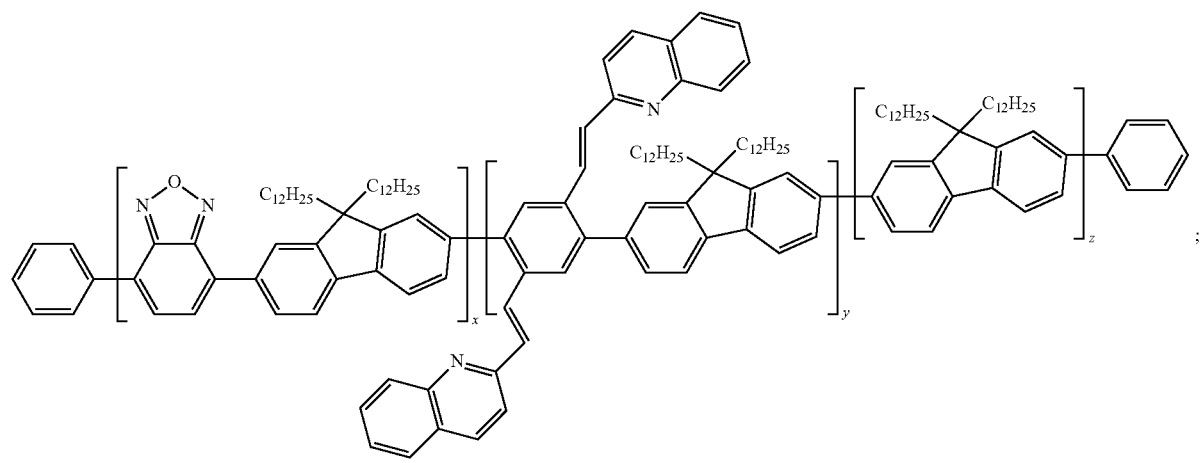

-continued
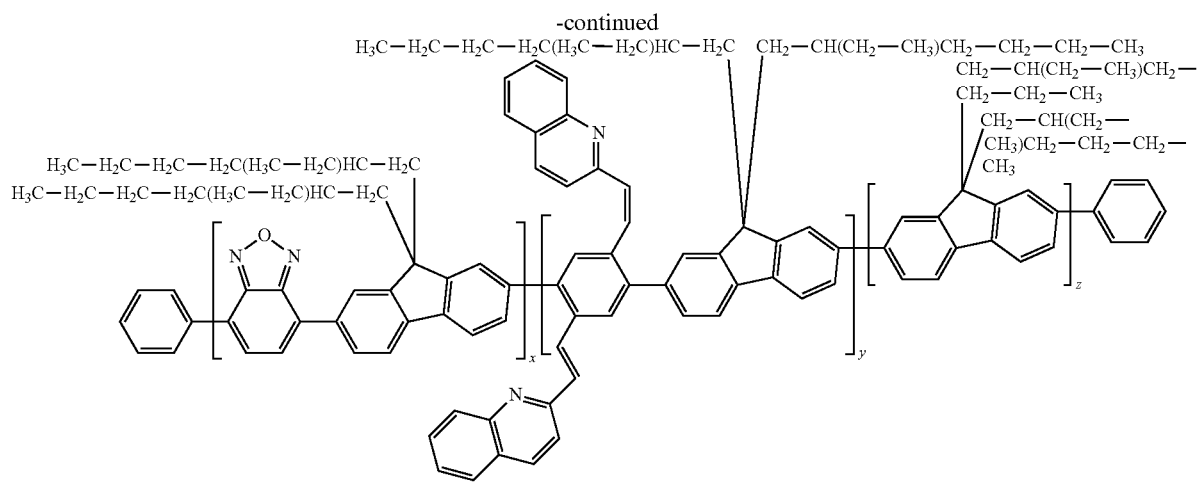
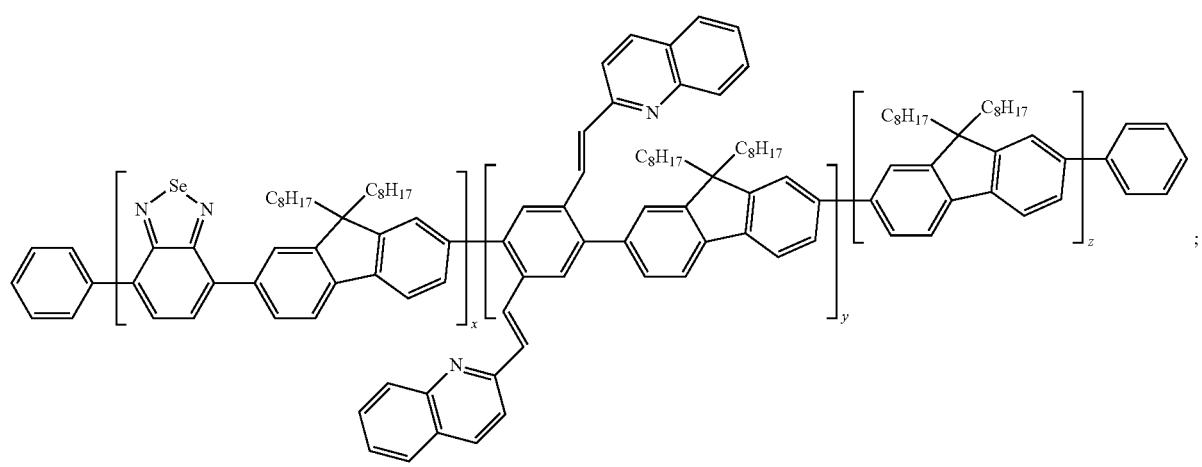
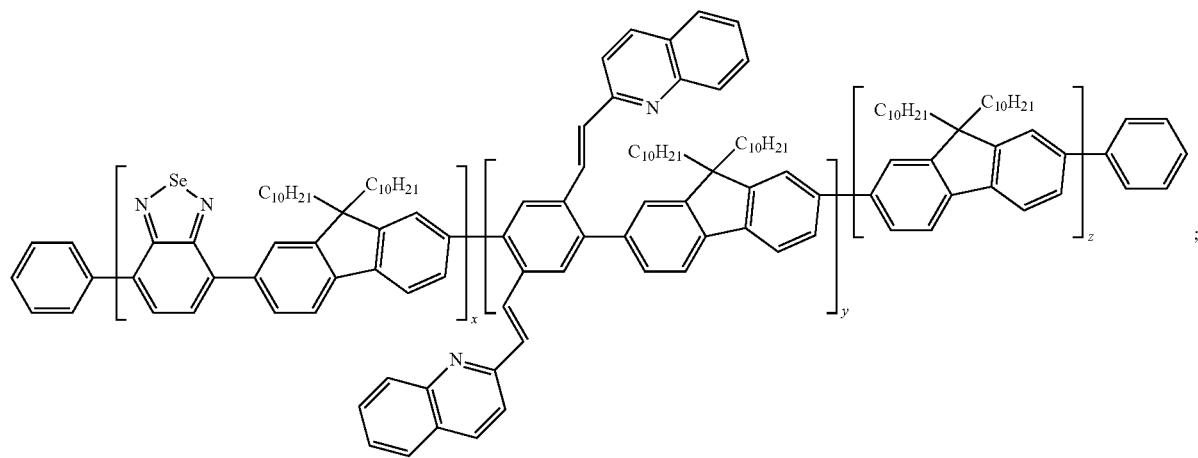

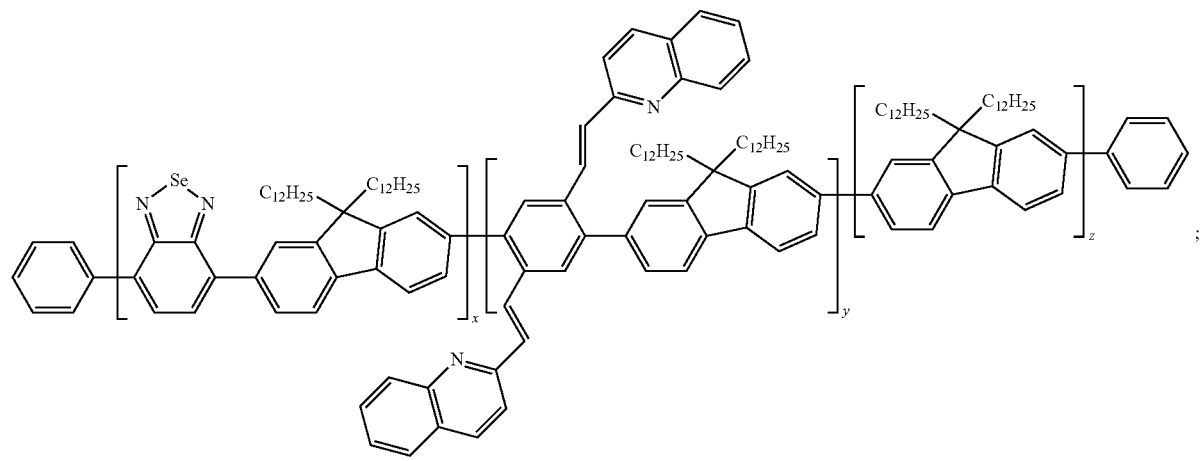
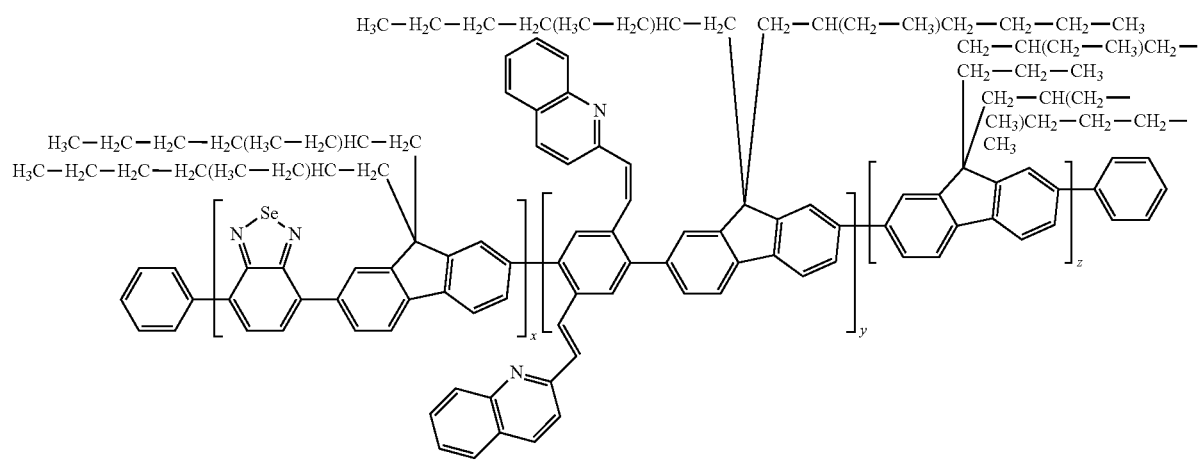
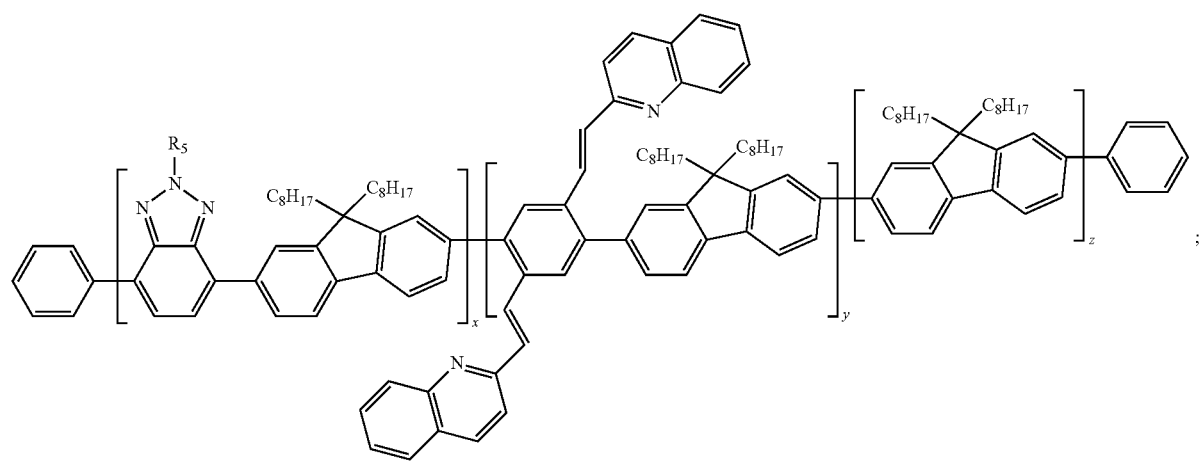

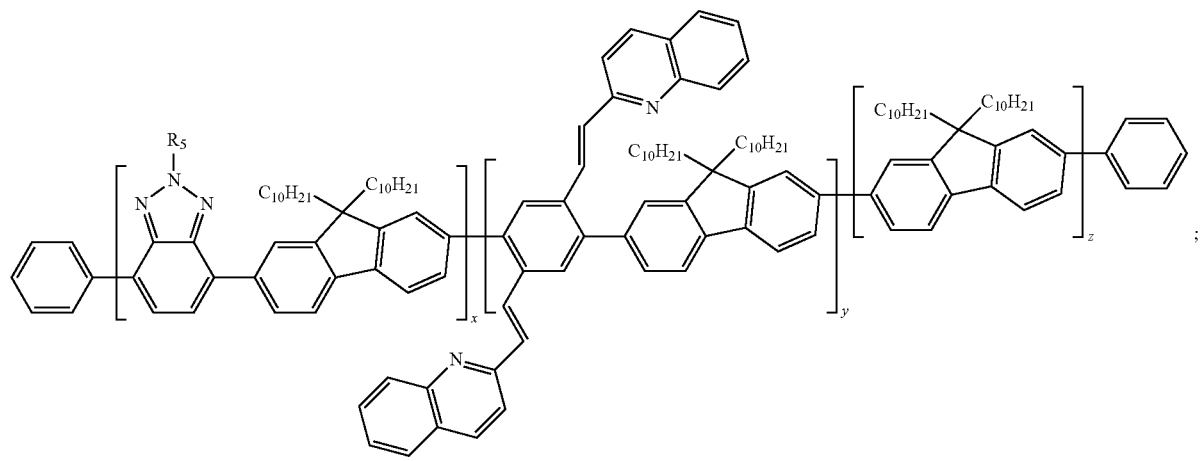
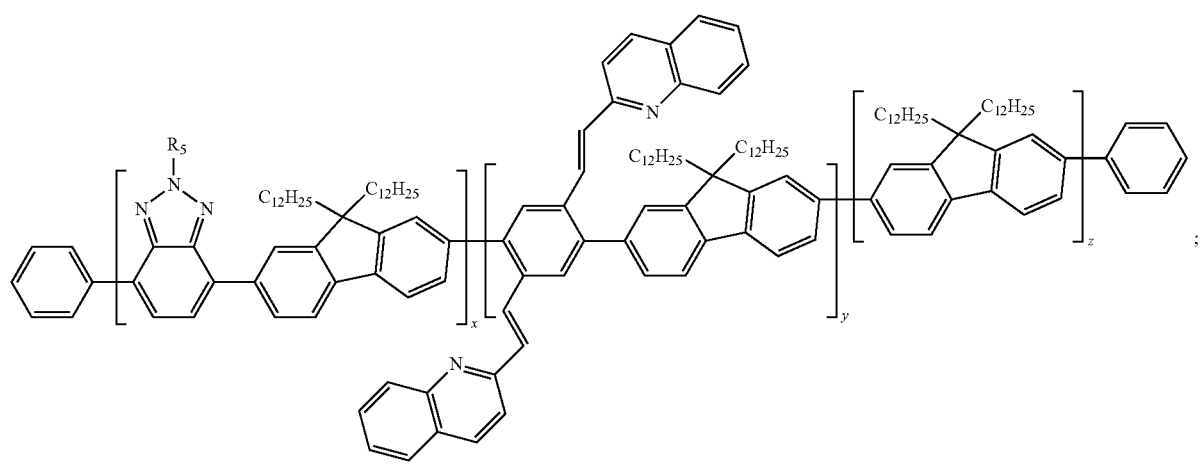
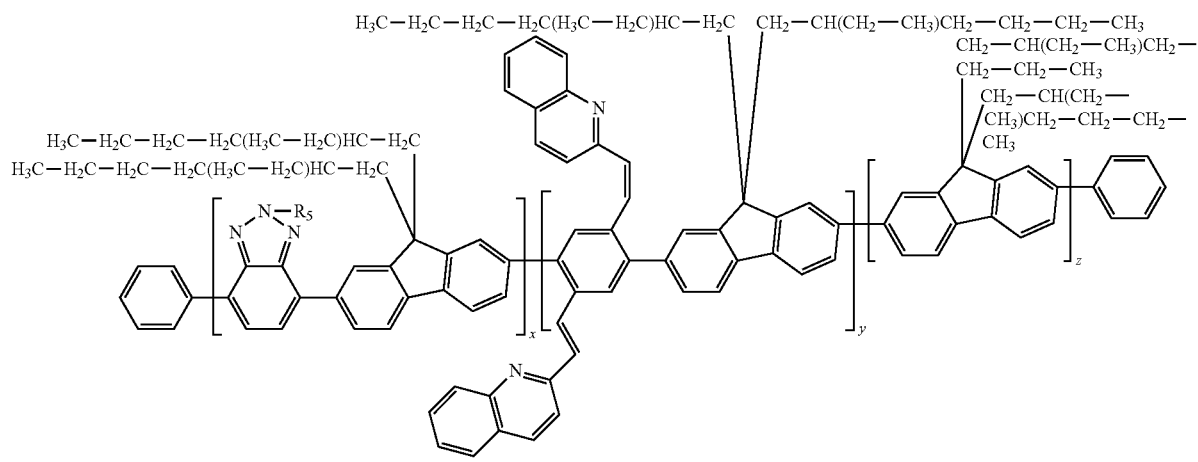

-continued
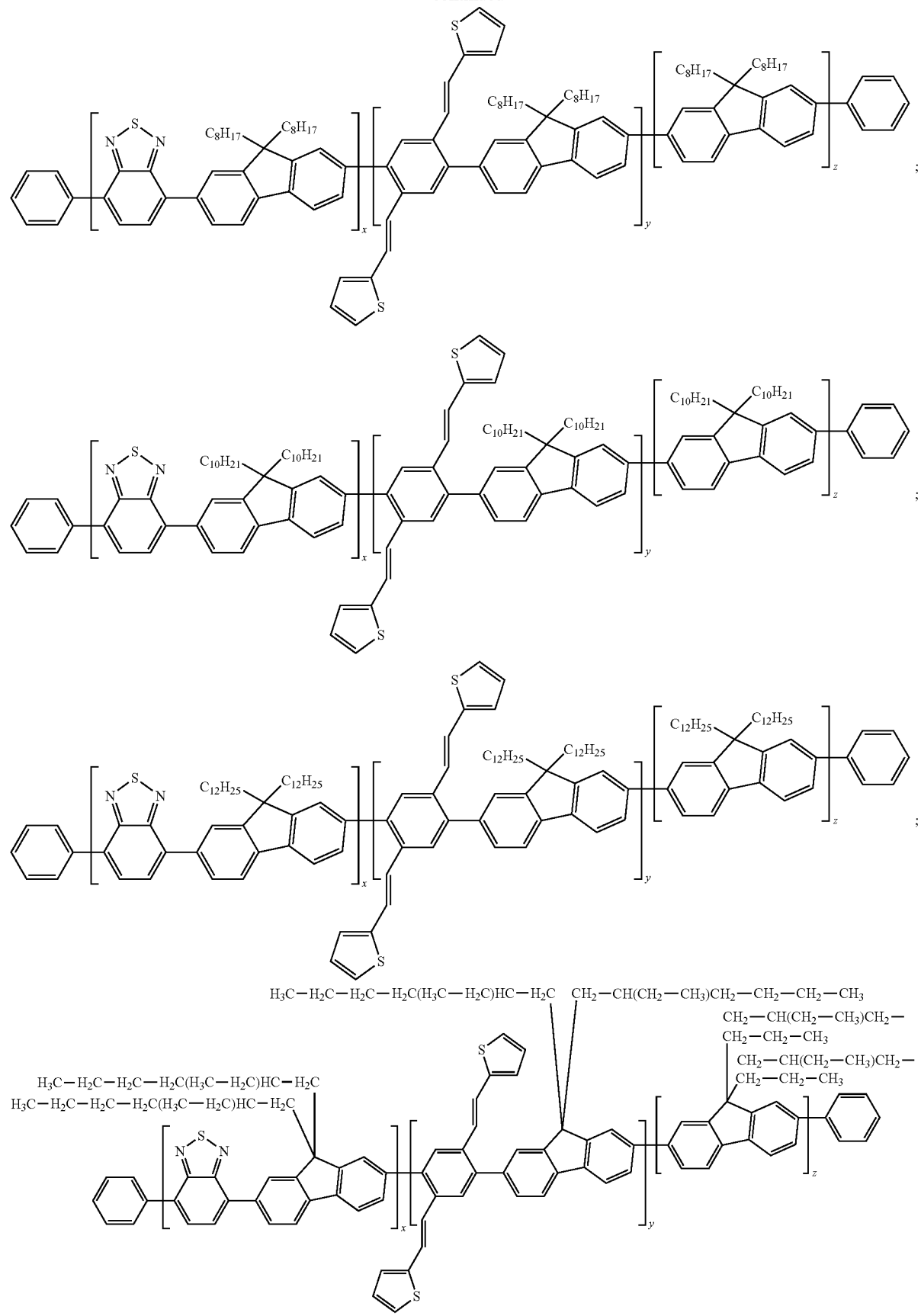

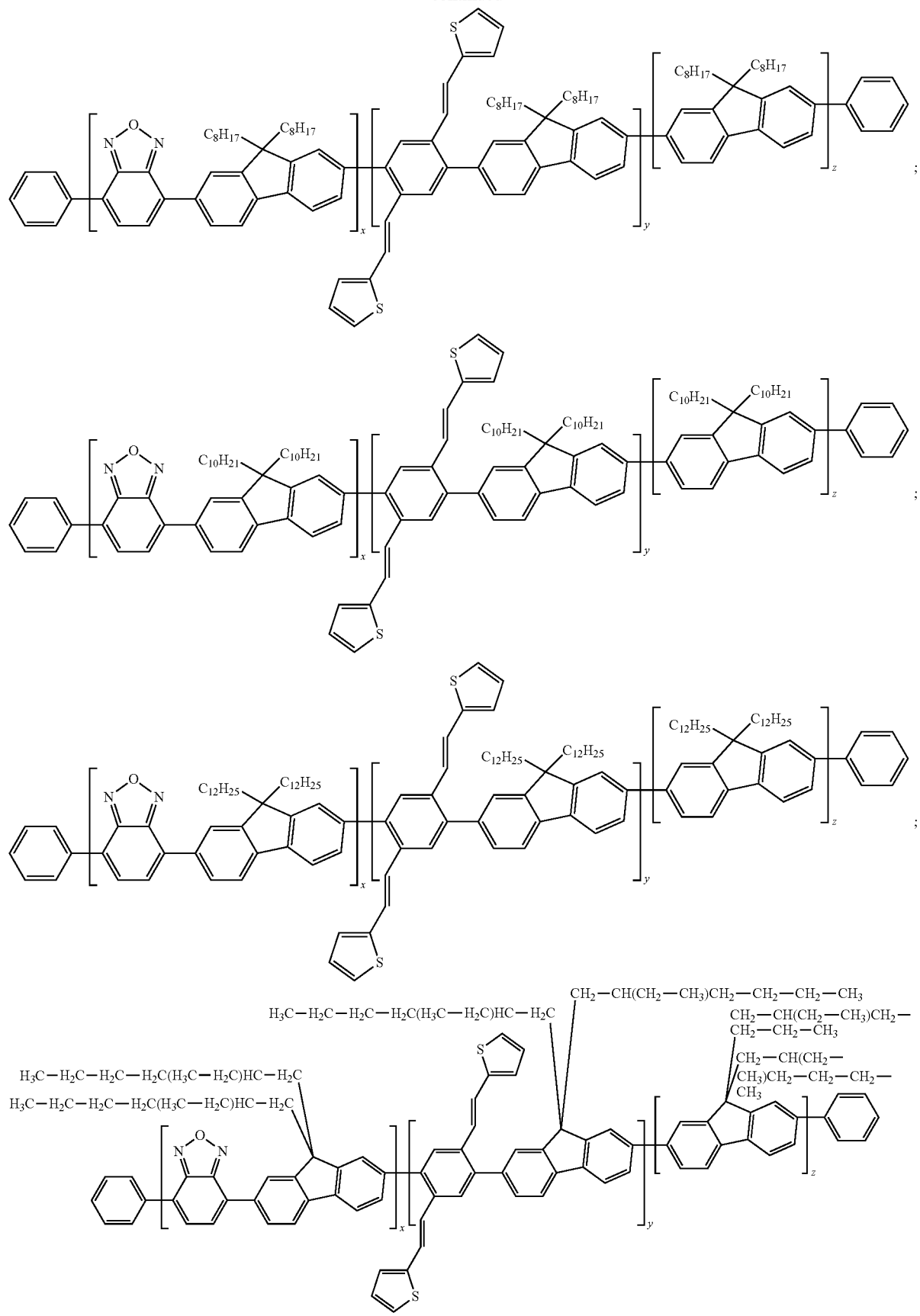

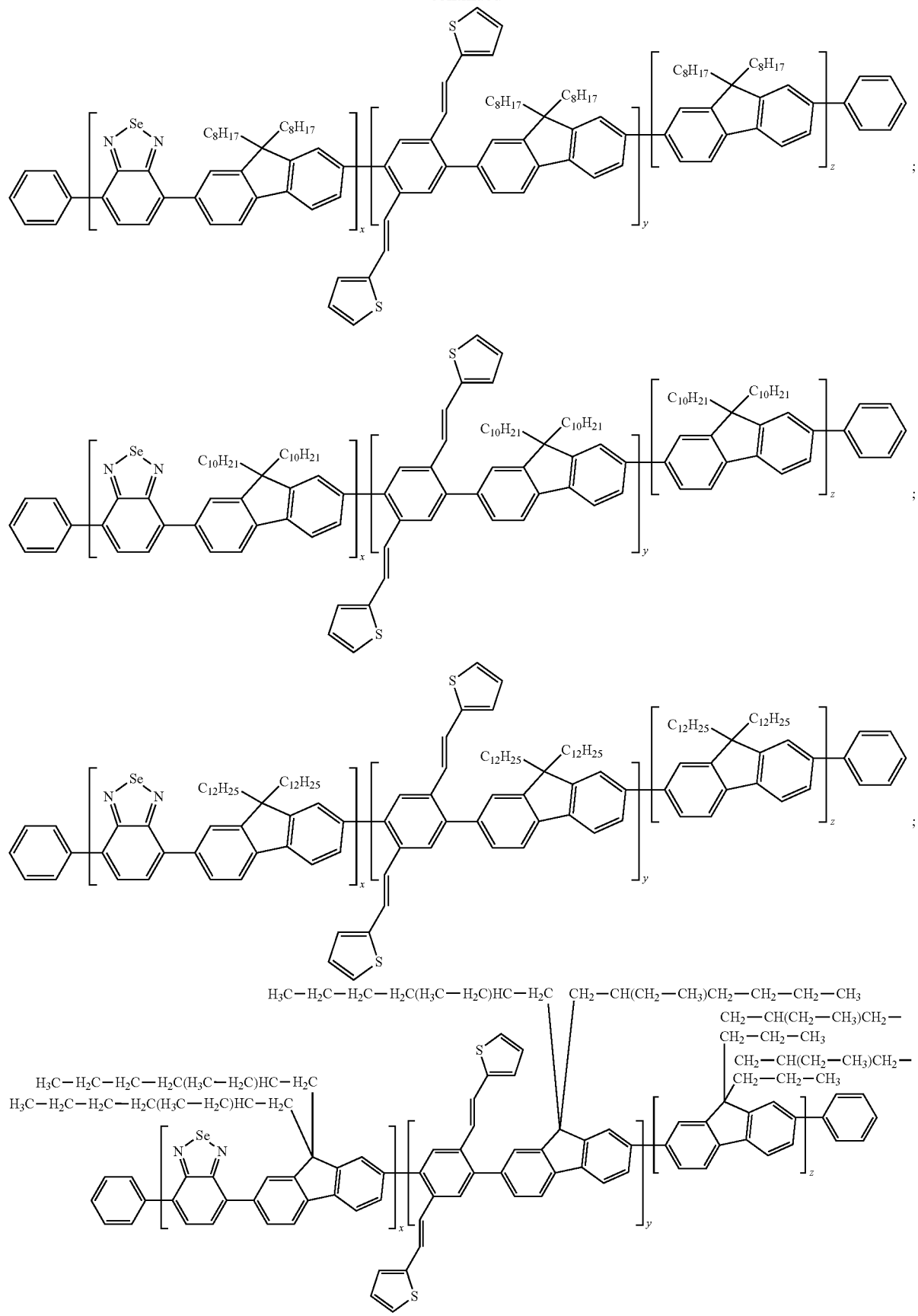

-continued
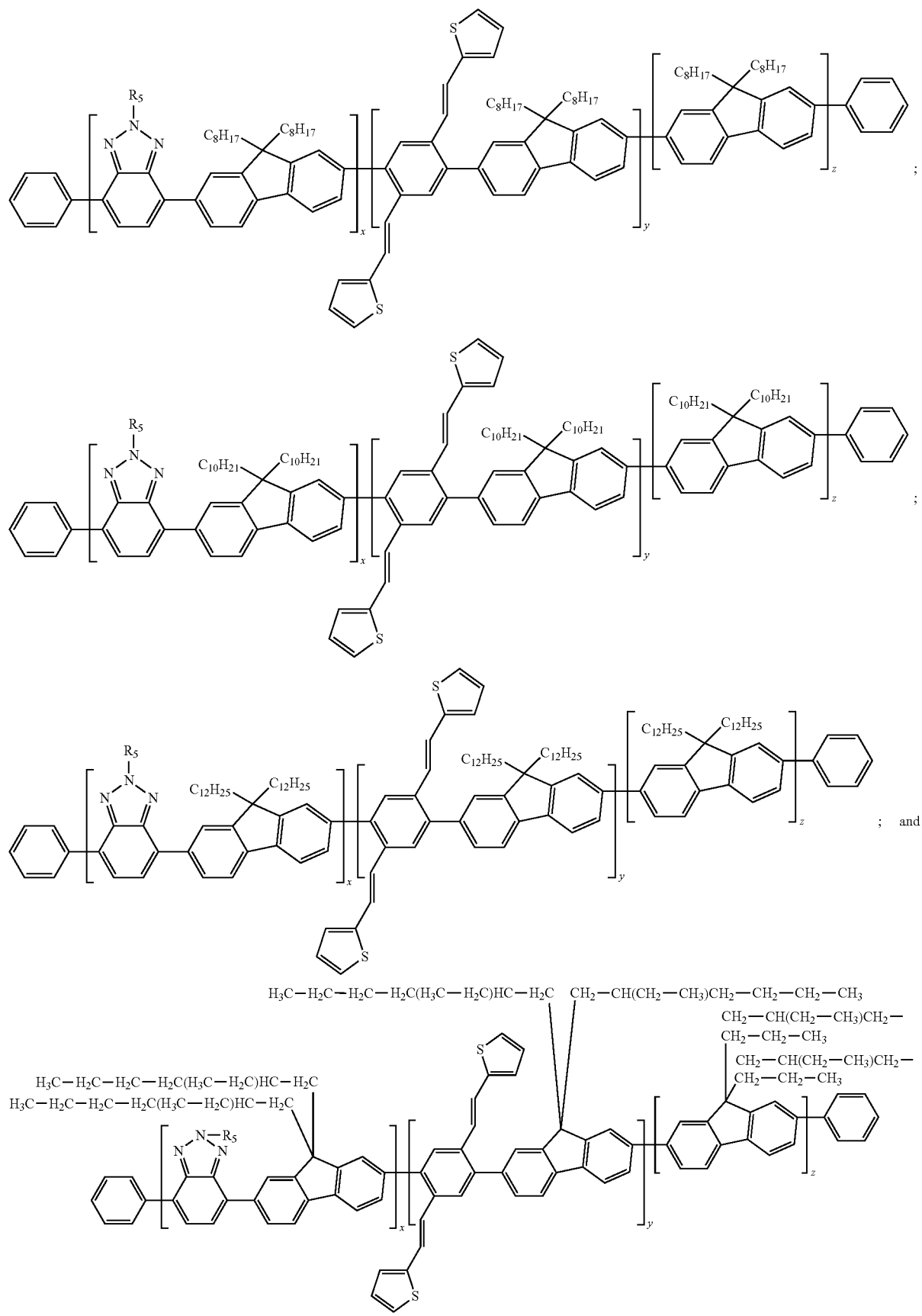

wherein R₅ is defined hereinabove and x, y and z are integers independently ranging from 1 to 10,000.

In some embodiments, a conjugated polymer or oligomer of the light emitting polymeric or oligomeric phase comprising at least two repeating units selected from the group consisting of repeating units A, B, and C described herein can be provided using methods known in the art. For example, in some embodiments, a conjugated polymer or oligomer comprising at least two repeating units selected from the group consisting of repeating units A, B, and C described herein can be provided using Suzuki coupling. Additional information regarding conjugated polymers and/or oligomers comprising at least two repeating units selected from the group consisting of repeating units A, B and C described herein is provided in Patent Cooperation Treaty Application Publication WO2012/009344 (PCT Application No. PCT/US2011/043690, filed on Jul. 12, 2011), which is hereby incorporated by reference in its entirety.

In some embodiments, a conjugated polymer or oligomer of the light emitting polymeric or oligomeric phase comprises one or more species of polyfluorenes, polyflouorene copolymers and/or derivatives thereof. In some embodiments, a conjugated polymer or oligomer comprises a species selected from the group consisting of poly(9,9-di-n-octylfluorenyl-2,7-diyl), poly[(9,9-di-n-octylfluorenyl-2,7-diyl)-alt-(benzo[2,1,3]thiadiazol-4,8-diyl)], poly(9,9-di-n-dodecylfluorenyl-2,7-diyl), poly(9,9-di-n-hexylfluorenyl-2,7-diyl), poly(9,9-di-n-octylfluorenyl-2,7-diyl), poly(9,9-n-dihexyl-2,7-fluorene-alt-9-phenyl-3,6-carbazole), poly[(9,9-dihexylfluoren-2,7-diyl)-alt-(2,5-dimethyl-1,4-phenylene)], poly[(9,9-dihexylfluoren-2,7-diyl)-co-(9-ethylcarbazol-2,7-diyl)], poly[(9,9-dihexylfluoren-2,7-diye-co-(anthracen-9,10-diyl)], poly[(9,9-dioctylfluorenyl-2,7-diyl)-co-bithiophene], poly[9,9-bis-(2-ethylhexyl)-9H-fluorene-2,7-diyl], poly((9,9-dihexyl-9H-fluorene-2,7-vinylene)-co-(1-methoxy-4-(2-ethylhexyloxy)-2,5-phenylenevinylene)) (e.g., 90:10 or 95:5 mole ratio), poly(9,9-di-(2-ethylhexyl)-9H-fluorene-2,7-vinylene), poly(9,9-di-n-hexylfluorenyl-2,7-vinylene), poly[(9,9-di-(2-ethylhexyl)-9H-fluorene-2,7-vinylene)-co-(1-methoxy-4-(2-ethylhexyloxy)-2,5-phenylenevinylene)] (e.g., 90:10 or 95:5 mole ratio) and mixtures thereof.

In some embodiments, a conjugated polymeric or oligomeric phase of an optoelectronic device described herein comprises a polymer or oligomer comprising a structural unit of Formula (V):

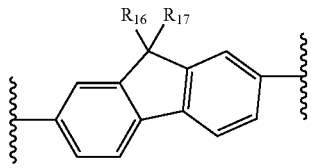

wherein ⸹ represents points of attachment in the polymer or oligomer chain and R₁₆ and R₁₇ are independently selected from the group consisting of hydrogen, C₁₋₂₀ alkyl, C₂₋₂₀ alkenyl, C₈₋₁₂ alkyl and C₈₋₁₂ alkenyl and wherein the alkyl and alkenyl of R₁₆ and R₁₇ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, a conjugated polymeric or oligomeric phase of an optoelectronic device described herein comprises one or more species of poly(phenyl vinylene)s, poly(phenyl vinylene) copolymers and/or derivatives thereof. In some embodiments, a conjugated polymeric or oligomeric phase of an optoelectronic device described herein comprises a species selected from the group consisting of poly[2-methoxy-5-(2-ethylhexyloxy)-1,4-phenylenevinylene], poly(1-methoxy-4-(3-propyloxy-heptaisobutyl-PSS)-2,5-phenylenevinylene)-co-(1-methoxy-4-(2-ethylhexyloxy)-2,5-phenylenevinylene) (60:40), poly(1-methoxy-4-(O-disperse Red 1))-2,5-phenylenevinylene, poly(2,5-bis(1,4,7,10-tetraoxaundecyl)-1,4-phenylenevinylene), poly(2,5-dioctyl-1,4-phenylenevinylene), poly[(m-phenylenevinylene)-alt-(2,5-dihexyloxy-p-phenylenevinylene)], poly[(m-phenylenevinylene)-alt-(2-methoxy-5-(2-ethylhexyloxy)-p-phenylenevinylene)], poly[(m-phenylenevinylene)-co-(2,5-dioctoxy-p-phenylenevinylene)], poly[(o-phenylenevinylene)-alt-(2-methoxy-5-(2-ethylhexyloxy)-p-phenylenevinylene)], poly[(p-phenylenevinylene)-alt-(2-methoxy-5-(2-ethylhexyloxy)-p-phenylenevinylene)], poly[1-methoxy-4-(3-propyloxy-heptaisobutyl-PSS)-2,5-phenylenevinylene], poly[1-methoxy-4-(3-propyloxy-heptaisobutyl-PSS)-2,5-phenylenevinylene]-co-[1-methoxy-4-(2-ethylhexyloxy)-2,5-phenylenevinylene] (30:70), poly[2,5-bisoctyloxy)-1,4-phenylenevinylene], poly[2,5-bis(3',7'-dimethyloctyloxy)-1,4-phenylenevinylene], poly[2-(2',5'-bis(2''-ethylhexyloxy)phenyl)-1,4-phenylenevinylene], poly[2-methoxy-5-(2-ethylhexyloxy)-1,4-phenylenevinylene], poly[2-methoxy-5-(3',7'-dimethyloctyloxy)-1,4-phenylenevinylene], poly[5-methoxy-2-(3-sulfopropoxy)-1,4-phenylenevinylene], poly[tris(2,5-bis(hexyloxy)-1,4-phenylenevinylene)-alt-(1,3-phenylenevinylene)], poly{[2-[2',5'-bis(2''-ethylhexyloxy)phenyl]-1,4-phenylenevinylene]-co-[2-methoxy-5-(2'-ethylhexyloxy)-1,4-phenylenevinylene]}, and mixtures thereof.

In some embodiments, a conjugated polymer or oligomer of the light emitting polymeric or oligomeric phase comprises one or more species of poly(naphthalene vinylene)s, poly(naphthalene vinylene) copolymers and/or derivatives thereof. In some embodiments, a conjugated polymer or oligomer of the light emitting polymer or oligomer phase comprises one or more species of cyano-poly(phenylene vinylene)s, cyano-poly(phenylene vinylene) copolymers and/or derivatives thereof. In some embodiments, a conjugated polymer or oligomer of the light emitting polymeric or oligomeric phase comprises one or more species of poly(fluorenylene ethynylene)s, poly(fluorenylene ethynylene) copolymers and/or derivatives thereof. In some embodiments, a conjugated polymer or oligomer of the light emitting polymeric or oligomeric phase comprises one or more species of poly(phenylene ethynylene)s, poly(phenylene ethynylene) copolymers and/or derivatives thereof. In some embodiments, a conjugated polymer or oligomer of the light emitting polymeric or oligomeric phase comprises one or more species of polythiophenes, polythiophene copolymers and/or derivatives thereof.

In some embodiments, a conjugated polymer or oligomer of the light emitting polymeric or oligomeric phase comprises a species selected from the group consisting of poly(2,5-di(3,7-dimethyloctyloxy)cyanoterephthalylidene), poly(2,5-di(hexyloxy)cyanoterephthalylidene), poly(5-(2-ethylhexyloxy)-2-methoxy-cyanoterephthalylidene), poly(5-(3,7-dimethyloctyloxy)-2-methoxy-cyanoterephthalylidene), poly(9,9-dioctylfluorenyl-2,7-yleneethynylene), poly(9,9-didodecylfluoroenyl-2,7-yleneethylnylene), poly

[9,9-di(2'-ethylhexyl)fluoren-2,7-yleneethynylene], poly[9,9-di(3',7'-dimethyloctyl)fluoren-2,7-yleneethynylene], poly(2,5-dicyclohexylphenylene-1,4-ethynylene), poly(2,5-didodecylphenylene-1,4-ethynylene), poly(2,5-dioctylphenylene-1,4-ethynylene), poly(2,5-di(2'-ethylhexyl)-1,4-ethynylene), poly(2,5-di(3',7'-dimethyloctyl)phenylene-1,4-ethynylene), poly(3-butylthiophene-2,5-diyl) (regiorandom or regioregular), poly(3-cyclohexyl-4-methylthiophene-2,5-diyl), poly(3-cyclohexylthiophene-2,5-diyl), poly(3-decyloxythiophene-2,5-diyl), poly(3-decylthiophene-2,5-diyl) (regiorandom or regioregular), poly(3-dodecylthiophene-2,5-diyl) (regiorandom or regioregular), poly(3-hexylthiophene-2,5-diyl) (regiorandom or regioregular), poly(3-octylthiophene-2,5-diyl) (regiorandom or regioregular), poly(3-octylthiophene-2,5-diyl-co-3-decyloxythiophene-2,5-diyl), poly(thiophene-2,5-diyl), poly[(2,5-didecyloxy-1,4-phenylene)-alt-(2,5-thienylene)], poly(2,6-naphthalenevinylene), poly(p-xylene tetrahydrothiophenium chloride), poly(2,5 pyridine), poly(3,5 pyridine), poly(2,5-bis(3-sulfonatopropoxy)-1,4-phenylene, disodium salt-alt-1,4-phenylene), poly[(2,5-bis(2-(N,N-diethylammonium bromide)ethoxy)-1,4-phenylene)-alt-1,4-phenylene], poly[5-methoxy-2-(3-sulfopropoxy)-1,4-phenylenevinylene]potassium salt, poly{[2,5-bis(2-(N,N-diethylamino)ethoxy)-1,4-phenylene]-alt-1,4-phenylene} and mixtures thereof.

In some embodiments, a light emitting composite organic layer further comprises a triplet emitter phase in addition to the light emitting polymeric or oligomeric phase and the nanoparticle phase. A triplet emitter phase can comprise any phosphorescent compound not inconsistent with the objectives of the present invention. In some embodiments, phosphorescent compounds comprise transition metal complexes, including organometallic complexes. In some embodiments, a transition metal complex comprises an iridium or platinum metal center. A phosphorescent transition metal complex, in some embodiments, is tris(2-phenylpyridine)iridium [Ir(ppy)$_3$] or platinum octaethylporphine (PtOEP). In some embodiments, a triplet emitter phase comprises one or more phosphorescent transition metal complexes selected from Table II:

TABLE II

Transition Metal Complexes of Triplet Emitter Phase

[Os(bpy)$_3$]$^{2+}$
[Os(phen)$_3$]$^{2+}$
Ir(ppy)$_3$
Ir(4,6-dFppy)$_2$(pic)
Ir(piq)$_2$(acac)
[Os(phen)$_2$(dppee)]$^{2+}$
[Ru(bpy)$_3$]$^{2+}$
Re(phen)(CO)$_3$(Cl)
Pt(bhq)$_2$
Ir(piq)$_3$
Pt(ppy)$_2$
Pt(ph-salen)
Ir(btp)$_2$(acac)
Pt(ONN-t-Bu)Cl
Pt(dphpy)(CO)
Pt(Me$_4$-salen)
Pt(thpy)$_2$
Pt(4,6-dFppy)(acac)
Pt(ppy)(CO)(Cl)
Pt(thpy)(CO)(Cl)
Ir(ppy)$_2$(CO)(CL)
Pt(qtl)$_2$
Re(phbt)(CO)$_4$
Pt(qol)$_2$
Pd(thpy)$_2$ TABLE II-continued Transition Metal Complexes of Triplet Emitter Phase Pd(qol)$_2$
[Pt(bpy)$_2$]$^{2+}$
[Rh(bpy)$_3$]$^{3+}$ In some embodiments, a transition metal complex of a triplet emitter phase is operable to participate in energy transfer with one or more components of the light emitting composite organic layer. In some embodiments, for instance, a phosphorescent transition metal complex of the triplet emitter phase is operable to receive energy from the light emitting polymeric or oligomeric phase of the composite organic layer, such as through resonant energy transfer. Resonant energy transfer, in some embodiments, can include Förster energy transfer and/or Dexter energy transfer. In some embodiments, a phosphorescent transition metal complex of the triplet emitter phase is operable to receive triplet excited states from the singlet emitter polymeric or oligomeric phase for subsequent radiative relaxation of the received triplet excited states to the ground state. Moreover, in some embodiments, a phosphorescent transition metal complex of the triplet emitter phase is also operable to receive singlet excited states from the singlet emitter polymeric or oligomeric phase for subsequent radiative relaxation of the received singlet excited states to the ground state. In some embodiments, relaxation of the received singlet excited state occurs through a phosphorescent pathway.

In some embodiments, the triplet emitter phase comprises phosphors. In some embodiments, phosphors of a triplet emitter phase comprise one or more of Lanthanide and/or Actinide series elements (rare earth emitters) such as erbium, ytterbium, dysprosium, or holmium; metals such as transition metals; metal oxides; metal sulfides; or combinations thereof. In some embodiments, phosphors comprise doped yttrium oxides (Y$_2$O$_3$) including Y$_2$O$_3$:Eu, Y$_2$O$_3$:Zn, and Y$_2$O$_3$:Ti. In some embodiments phosphors comprise doped zinc sulfides including ZnS:Cu, ZnS:Mn, ZnS:Ga or ZnS:Gd or mixtures thereof. In another embodiment, phosphors comprise doped calcium sulfides including CaS:Er, CaS:Tb, CaS:Eu or mixtures thereof. In a further embodiment, phosphors comprise doped zinc oxides including ZnO:Eu. In one embodiment, phosphors comprise doped strontium sulfides including SrS:Ca, SrS:Mn, SrS:Cu or mixtures thereof. In some embodiments, a triplet emitter phase comprises any mixture of phosphorescent transition metal complexes and phosphors described herein.

A triplet emitter phase can be combined with the light emitting polymeric or oliogmeric phase in any manner not inconsistent with the objectives of the present invention. In some embodiments, the triplet emitter phase is dispersed throughout the light emitting polymeric or oligomeric phase. In one embodiment, for example, one or more phosphorescent transition metal complexes of the triplet emitter phase are blended with one or more light emitting conjugated polymers or oligomers to disperse the transition metal complexes throughout the conjugated polymers or oligomers.

In some embodiments, a triplet emitter phase is present in the light emitting composite organic layer in any desired amount not inconsistent with the objectives of the present invention. In some embodiments, a triplet emitter phase is present in the light emitting composite organic layer in any amount in accordance with Table III:

TABLE III

Weight Percent of Triplet Emitter Phase in Composite Organic Layer
Triplet Emitter Phase (Wt. %)

| |
|---|
| 0.01-25 |
| 0.05-30 |
| 0.1-15 |
| 0.1-10 |
| 0.5-5 |
| 1-30 |
| 5-30 |
| 7-30 |
| 8-30 |
| 9-30 |
| 10-30 |
| ≥6 |
| ≥7 |
| ≥8 |
| ≥9 |
| ≥10 |
| ≥11 |
| ≥12 |
| ≥15 |

In some embodiments, the light emitting polymeric or oligomeric phase and the nanoparticle phase of the composite organic layer are disposed in a dielectric host material. When present, the triplet emitter phase, in some embodiments, is also disposed in the dielectric host material. In some embodiments, the dielectric host material is radiation transmissive.

A dielectric host material for the light emitting polymeric or oligomeric phase, the nanoparticle phase and optionally the triplet emitter phase, in some embodiments, comprises a dielectric polymeric material. In some embodiments, use of a dielectric polymeric host permits light emitting composite layers to achieve increased thicknesses leading to device processing advantages without sacrificing efficiency or other performance characteristics. Surprisingly, in some embodiments, use of a dielectric polymeric host permits the formation of thicker light emitting composite layers having suitable light emission properties without the concomitant use of additional light emitting polymeric or oligomeric phase and/or nanoparticle phase.

In some embodiments, a dielectric host comprises a polystyrene (PS), polyacrylate (PAA), polymethacrylate (PMA), polymethylmethacryalte (PMMA), polycarbonate (PC) or mixtures thereof. In some embodiments, a dielectric host comprises a polyolefin, such as polyethylene, polypropylene or mixtures thereof. In some embodiments, a dielectric host comprises polyethylene terephthalate (PET). Additionally, in some embodiments, a dielectric host comprises a fluoropolymer, including perfluorocyclobutyl (PFCB) polymers, polyvinyl fluoride (PVF) or polyvinylidene fluoride (PVDF) or mixtures thereof.

The dielectric polymeric host can be present in the light emitting composite organic layer in any desired amount not inconsistent with the objectives of the present invention. In some embodiments, the dielectric polymeric host is present in an amount of at least about 50 weight percent or at least about 70 weight percent. The dielectric polymeric host, in some embodiments, is present in an amount ranging from about 30 weight percent to about 80 weight percent or from about 40 weight percent to about 75 weight percent. In some embodiments, the dielectric polymeric host is present in an amount ranging from about 50 weight percent to about 70 weight percent.

In some embodiments, the ratio of dielectric polymeric host to the light emitting polymeric or oligomeric phase in a light emitting composite organic layer ranges from about 1:5 to about 5:1. In some embodiments, the ratio of dielectric polymeric host to light emitting polymeric or oligomeric phase in a light emitting composite organic layer ranges from about 1:4 to about 4:1, from about 1:3 to about 3:1, or from about 1:2 to about 2:1. In some embodiments, the ratio of dielectric polymeric host to light emitting polymeric or oligomeric phase in a light emitting composite organic layer ranges from about 1:1 to about 4:1.

A light emitting composite organic layer can have any desired thickness not inconsistent with the objectives of the present invention. In some embodiments, for instance, a light emitting composite organic layer has, a thickness ranging from about 10 nm to about 30 µm. In some embodiments, a light emitting composite organic layer has a thickness ranging from about 10 nm to about 10 µm. In some embodiments, a light emitting composite organic layer has a thickness ranging from about 80 nm to about 1 µm, from about 100 nm to about 500 nm or from about 150 nm to about 400 nm. In some embodiments, a light emitting composite organic layer has a thickness ranging from about 50 nm to about 300 nm, from about 40 nm to about 200 nm or from about 80 nm to about 150 nm. In some embodiments, a light emitting composite organic layer has a thickness of at least about 300 nm or at least about 400 nm. A light emitting composite organic layer, in some embodiments, has a thickness ranging from about 300 nm to about 5 µm or from about 400 nm to about 10 µm. In some embodiments, a light emitting composite organic layer has a thickness ranging from about 1 µm to about 30 µm.

(ii) Alternatively, a light emitting composite organic layer of a FIPEL described herein, in some embodiments, comprises a singlet emitter phase and a triplet emitter phase. In some embodiments, a singlet emitter phase comprises a conjugated polymer. Suitable conjugated polymers for a singlet emitter phase can comprise any of the conjugated polymers recited in Section I(C)(i) herein. In some embodiments, for example, a singlet emitter phase comprises one or more conjugated polymers selected from the group consisting of poly(9,9-di-n-octylfluorenyl-2,7-diyl), poly[(9,9-di-n-octylfluorenyl-2,7-diyl)-alt-(benzo[2,1,3]thiadiazol-4,8-diyl)], poly(9,9-di-n-dodecylfluorenyl-2,7-diyl), poly(9,9-di-n-hexylfluorenyl-2,7-diyl), poly(9,9-n-dihexyl-2,7-fluorene-alt-9-phenyl-3,6-carbazole), poly[(9,9-dihexylfluoren-2,7-diyl)-alt-(2,5-dimethyl-1,4-phenylene)], poly[(9,9-dihexylfluoren-2,7-diyl)-co-(9-ethylcarbazol-2,7-diyl)], poly[(9,9-dihexylfluoren-2,7-diyl)-co-(anthracen-9,10-diyl)], poly[(9,9-dioctylfluorenyl-2,7-diyl)-co-bithiophene], poly[9,9-bis-(2-ethylhexyl)-9H-fluorene-2,7-diyl], poly((9,9-dihexyl-9H-fluorene-2,7-vinylene)-co-(1-methoxy-4-(2-ethylhexyloxy)-2,5-phenylenevinylene)) (e.g., 90:10 or 95:5 mole ratio), poly(9,9-di-(2-ethylhexyl)-9H-fluorene-2,7-vinylene), poly(9,9-di-n-hexylfluorenyl-2,7-vinylene), poly[(9,9-di-(2-ethylhexyl)-9H-fluorene-2,7-vinylene)-co-(1-methoxy-4-(2-ethylhexyloxy)-2,5-phenylenevinylene)] (e.g., 90:10 or 95:5 mole ratio), and mixtures thereof.

In some embodiments, a singlet emitter phase of an optoelectronic device described herein comprises a polymer or oligomer comprising a structural unit of Formula (V):

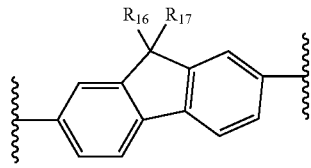

wherein ⌇ represents points of attachment in the polymer or oligomer chain and $R_{16}$ and $R_{17}$ are independently selected from the group consisting of hydrogen, $C_{1-20}$ alkyl, $C_{2-20}$ alkenyl, $C_{8-12}$ alkyl and $C_{8-12}$ alkenyl and wherein the alkyl and alkenyl of $R_{16}$ and $R_{17}$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

In some embodiments, a singlet emitter phase comprises one or more poly(phenyl vinylene)s, poly(phenyl vinylene) copolymers and/or derivatives thereof. In some embodiments, a singlet emitter phase comprises a conjugated polymer selected from the group consisting of poly[2-methoxy-5-(2-ethylhexyloxy)-1,4-phenylenevinylene], poly(1-methoxy-4-(3-propyloxy-heptaisobutyl-PSS)-2,5-phenylenevinylene)-co-(1-methoxy-4-(2-ethylhexyloxy)-2,5-phenylenevinylene) (60:40), poly(1-methoxy-4-(O-disperse Red 1))-2,5-phenylenevinylene, poly(2,5-bis(1,4,7,10-tetraoxaundecyl)-1,4-phenylenevinylene), poly(2,5-dioctyl-1,4-phenylenevinylene), poly[(m-phenylenevinylene)-alt-(2,5-dihexyloxy-p-phenylenevinylene)], poly[(m-phenylenevinylene)-alt-(2-methoxy-5-(2-ethylhexyloxy)-p-phenylenevinylene)], poly[(m-phenylenevinylene)-co-(2,5-dioctoxy-p-phenylenevinylene)], poly[(o-phenylenevinylene)-alt-(2-methoxy-5-(2-ethylhexyloxy)-p-phenylenevinylene)], poly[(p-phenylenevinylene)-alt-(2-methoxy-5-(2-ethylhexyloxy)-p-phenylenevinylene)], poly[1-methoxy-4-(3-propyloxy-heptaisobutyl-PSS)-2,5-phenylenevinylene], poly[1-methoxy-4-(3-propyloxy-heptaisobutyl-PSS)-2,5-phenylenevinylene]-co-[1-methoxy-4-(2-ethylhexyloxy)-2,5-phenylenevinylene] (30:70), poly[2,5-bisoctyloxy)-1,4-phenylenevinylene], poly[2,5-bis(3',7'-dimethyloctyloxy)-1,4-phenylenevinylene], poly[2-(2',5'-bis(2"-ethylhexyloxy)phenyl)-1,4-phenylenevinylene], poly[2-methoxy-5-(2-ethylhexyloxy)-1,4-phenylenevinylene], poly[2-methoxy-5-(3',7'-dimethyloctyloxy)-1,4-phenylenevinylene], poly[5-methoxy-2-(3-sulfopropoxy)-1,4-phenylenevinylene], poly[tris(2,5-bis(hexyloxy)-1,4-phenylenevinylene)-alt-(1,3-phenylenevinylene)], poly{[2-[2',5'-bis(2"-ethylhexyloxy)phenyl]-1,4-phenylenevinylene]-co-[2-methoxy-5-(2'-ethylhexyloxy)-1,4-phenylenevinylene]}, and mixtures thereof.

Moreover, in some embodiments, a singlet emitter phase comprises one or more poly(naphthalene vinylene)s, poly(naphthalene vinylene) copolymers and/or derivatives thereof. A singlet emitter phase, in some embodiments, comprises one or more cyano-poly(phenylene vinylene)s, cyano-poly(phenylene vinylene) copolymers and/or derivatives thereof. In some embodiments, a singlet emitter phase comprises one or more species of poly(fluorenylene ethynylene)s, poly(fluorenylene ethynylene) copolymers and/or derivatives thereof. In some embodiments, a singlet emitter phase comprises one or more poly(phenylene ethynylene)s, poly(phenylene ethynylene) copolymers and/or derivatives thereof. In some embodiments, a singlet emitter phase comprises one or more polythiophenes, polythiophene copolymers and/or derivatives thereof.

A singlet emitter phase of a light emitting composite organic layer, in some embodiments, comprises a conjugated polymer selected from the group consisting of poly(2,5-di(3,7-dimethyloctyloxy)cyanoterephthalylidene), poly(2,5-di(hexyloxy)cyanoterephthalylidene), poly(5-(2-ethylhexyloxy)-2-methoxy-cyanoterephthalylidene), poly(5-(3,7-dimethyloctyloxy)-2-methoxy-cyanoterephthalylidene), poly(9,9-dioctylfluorenyl-2,7-yleneethynylene), poly(9,9-didodecylfluoroenyl-2,7-yleneethylnylene), poly[9,9-di(2'-ethylhexyl)fluoren-2,7-yleneethynylene], poly[9,9-di(3',7'-dimethyloctyl)fluoren-2,7-yleneethynylene], poly(2,5-dicyclohexylphenylene-1,4-ethynylene), poly(2,5-didodecylphenylene-1,4-ethynylene), poly(2,5-dioctylphenylene-1,4-ethynylene), poly(2,5-di(2'-ethylhexyl)-1,4-ethynylene), poly(2,5-di(3',7'-dimethyloctyl)phenylene-1,4-ethynylene), poly(3-butylthiophene-2,5-diyl) (regiorandom or regioregular), poly(3-cyclohexyl-4-methylthiophene-2,5-diyl), poly(3-cyclohexylthiophene-2,5-diyl), poly(3-decyloxythiophene-2,5-diyl), poly(3-decylthiophene-2,5-diye (regiorandom or regioregular), poly(3-dodecylthiophene-2,5-diyl) (regiorandom or regioregular), poly(3-hexylthiophene-2,5-diyl) (regiorandom or regioregular), poly(3-octylthiophene-2,5-diyl) (regiorandom or regioregular), poly(3-octylthiophene-2,5-diyl-co-3-decyloxythiophene-2,5-diyl), poly(thiophene-2,5-diyl), poly[(2,5-didecyloxy-1,4-phenylene)-alt-(2,5-thienylene)], poly(2,6-naphthalenevinylene), poly(p-xylene tetrahydrothiophenium chloride), poly(2,5 pyridine), poly(3,5 pyridine), poly(2,5-bis(3-sulfonatopropoxy)-1,4-phenylene, disodium salt-alt-1,4-phenylene), poly[(2,5-bis(2-(N,N-diethylammonium bromide)ethoxy)-1,4-phenylene)-alt-1,4-phenylene], poly[5-methoxy-2-(3-sulfopropoxy)-1,4-phenylenevinylene]potassium salt, poly{[2,5-bis(2-(N,N-diethylamino)ethoxy)-1,4-phenylene]-alt-1,4-phenylene}, and mixtures thereof.

Further, in some embodiments, a singlet emitter phase comprises a conjugated polymer or oligomer described in Patent Cooperation Treaty Application No. PCT/US2011/043690 filed on Jul. 12, 2011, which is incorporated herein by reference in its entirety.

In some embodiments, a singlet emitter phase of a light emitting composite organic layer described herein comprises a fluorescent small molecule. In some embodiments, for instance, a fluorescent small molecule comprises a metal chelate species, a fluorescent dye, a conjugated dendrimer, or mixtures or combinations thereof. In some embodiments, a fluorescent small molecule comprises one or more of perylene, rubrene, quinacridone and mixtures, combinations and/or derivatives thereof. A fluorescent small molecule, in some embodiments, comprises anthracene or related compounds or a coumarin. In some embodiments, a fluorescent small molecule comprises tris(8-hydroxyquinoline) aluminum ($Alq_3$).

Moreover, in some embodiments, a singlet emitter phase can comprise one or more conjugated polymers or oligomers and one or more fluorescent small molecules. A conjugated polymer or oligomer can be combined with a fluorescent small molecule in a light emitting composite organic layer in any manner not inconsistent with the objectives of the present invention. In some embodiments, for example, one or more fluorescent small molecules are blended with one or more conjugated polymers or oligomers to provide a singlet emitter phase. Combining a plurality of polymeric, oligomeric, and/or small molecule singlet emitters can, in some embodiments, permit tuning of the emissive properties of a luminescent organic phase of a composite organic layer described herein.

As described herein, the light emitting composite organic layer also comprises a triplet emitter phase. A triplet emitter phase can comprise any phosphorescent compound not inconsistent with the objectives of the present invention. In some embodiments, the triplet emitter phase can comprise any of the triplet chemical species described in Section I(C)(i) hereinabove.

A triplet emitter phase can be combined with a singlet emitter phase of a light emitting composite organic layer described herein in any manner not inconsistent with the objectives of the present invention. In some embodiments, the triplet emitter phase is dispersed throughout the singlet emitter phase. In one embodiment, for example, one or more phosphorescent transition metal complexes of the triplet emitter phase are blended with one or more conjugated polymers or oligomers of the singlet emitter phase to disperse the transition metal complexes throughout the conjugated polymers or oligomers.

The triplet emitter phase can be present in the light emitting composite organic layer in any desired amount not inconsistent with the objectives of the present invention. In some embodiments, the triplet emitter phase is present in the light emitting composite organic layer in an amount in accordance with Table III hereinabove.

In some embodiments, the light emitting composite organic layer further comprises a nanoparticle phase disposed in the composite layer. In some embodiments, a nanoparticle phase is disposed in the singlet emitter phase. In other embodiments, a nanoparticle phase is disposed in the triplet emitter phase. One or more nanoparticle phases can also, in some embodiments, be disposed in both the singlet emitter phase and the triplet emitter phase. Moreover, a nanoparticle phase can comprise any nanoparticle phase described in Section I herein. Further, the nanoparticle phase can be present in the composite organic layer in any amount not inconsistent with the objectives of the present invention. In some embodiments, the nanoparticle phase is present in the composite organic layer in an amount consistent with Table I herein.

In some embodiments, the singlet emitter phase, the triplet emitter phase, and/or a nanoparticle phase of the light emitting composite layer are disposed in a dielectric host material. A dielectric host material for the singlet emitter phase and the triplet emitter phase, in some embodiments, is radiation transmissive.

In some embodiments, a dielectric host material for the singlet emitter phase and the triplet emitter phase is a polymeric material. In some embodiments, use of a dielectric polymeric host permits light emitting organic composite layers to achieve increased thicknesses leading to device processing advantages without sacrificing efficiency or other performance characteristics. Surprisingly, in some embodiments, use of a dielectric polymeric host permits the formation of thicker light emitting composite layers having suitable light emission properties without the concomitant use of additional singlet emitter phase, triplet emitter phase and/or nanoparticle phase.

In some embodiments, a dielectric host comprises a polystyrene (PS), polyacrylate (PAA), polymethacrylate (PMA), polymethylmethacryalte (PMMA), polycarbonate (PC) or mixtures thereof. In some embodiments, a dielectric host comprises a polyolefin, such as polyethylene, polypropylene or mixtures thereof. In some embodiments, a non-conjugated host comprises polyethylene terephthalate (PET). Additionally, in some embodiments, a dielectric host comprises a fluoropolymer, including perfluorocyclobutyl (PFCB) polymers, polyvinyl fluoride (PVF) or polyvinylidene fluoride (PVDF) or mixtures thereof.

The dielectric polymeric host can be present in the light emitting composite organic layer in any desired amount not inconsistent with the objectives of the present invention. In some embodiments, the dielectric polymeric host is present in an amount of at least about 50 weight percent or at least about 70 weight percent. The dielectric polymeric host, in some embodiments, is present in an amount ranging from about 30 weight percent to about 80 weight percent or from about 40 weight percent to about 75 weight percent. In some embodiments, the dielectric polymeric host is present in an amount ranging from about 50 weight percent to about 70 weight percent.

In some embodiments, the ratio of dielectric polymeric host to singlet emitter phase in a light emitting composite organic layer ranges from about 1:5 to about 5:1. In some embodiments, the ratio of dielectric polymeric host to singlet emitter phase in a light emitting composite organic layer ranges from about 1:4 to about 4:1, from about 1:3 to about 3:1, or from about 1:2 to about 2:1. In some embodiments, the ratio of dielectric polymeric host to singlet emitter phase in a light emitting composite organic layer ranges from about 1:1 to about 4:1.

A light emitting composite organic layer comprising a singlet emitter phase and a triplet emitter phase can have any desired thickness not inconsistent with the objectives of the present invention. In some embodiments, for instance, a light emitting composite organic layer has a thickness ranging from about 10 nm to about 30 µm. In some embodiments, a composite organic layer has a thickness ranging from about 10 nm to about 10 µm. In some embodiments, a composite organic layer has a thickness ranging from about 80 nm to about 1 µm, from about 100 nm to about 500 nm, or from about 150 nm to about 400 nm. In some embodiments, a composite organic layer has a thickness ranging from about 50 nm to about 300 nm, from about 40 nm to about 200 nm, or from about 80 nm to about 150 nm. In some embodiments, a composite organic layer has a thickness of at least about 300 nm or at least about 400 nm. A composite organic layer, in some embodiments, has a thickness ranging from about 300 nm to about 5 µm or from about 400 nm to about 10 µm. In some embodiments, a composite organic layer has a thickness ranging from about 1 µm to about 30 µm.

In some embodiments, a FIPEL described herein comprises a plurality of light emitting composite layers positioned between the first and second electrodes. For example, in some embodiments, a plurality of light emitting layers, each having a construction described in Section(s) I(C)(i)-(ii) herein, are positioned between the first and second electrodes. The light emitting layers can have various emission profiles that, when combined, provide the desired emission profile characteristics from the FIPEL.

Further, in some embodiments, a FIPEL described herein comprises one or more charge generation layers. Charge generation layers, in some embodiments, are positioned at the interface of a light emitting composite organic layer and dielectric or electrically insulating layer. In some embodiments wherein a plurality of light emitting composite organic layers are present, charge generation layers are positioned between the light emitting composite organic layers. For example, in some embodiments, a charge generation layer is positioned at one or more interfaces of light emitting composite organic layers.

A charge generation layer can have any desired construction operable to generate charge during operation of the FIPEL. In some embodiments, a charge generation layer is metallic, semi-metallic or semiconducting. A charge generation layer, in some embodiments, comprises metal nanoparticles, semiconducting nanoparticles or conductive small molecules. In some embodiments, metal nanoparticles comprise transition metal nanoparticles, semiconducting nanoparticles comprise inorganic semiconductors and small molecules comprise one or more porphyrins or alkali metal salts, such a LiF. In some embodiments, a charge generation layer comprises a conducting or semiconducting polymer. In one embodiment, for example, a charge generation layer comprises PEDOT.

A charge generation layer can have any desired thickness not inconsistent with the objectives of the present invention. In some embodiments, a charge generation layer has a thickness ranging from about 1 nm to about 20 nm. A charge generation layer, in some embodiments, has a thickness ranging from about 2 nm to about 15 nm or from about 1 nm to about 10 nm. In some embodiments, a charge generation layer has a thickness less than 1 nm or greater than 20 nm.

D. Dielectric or Electrically Insulating Layer(s)

As described herein, an optoelectronic device having a FIPEL architecture comprises an electrically insulating layer between the light emitting composite layer and the first electrode or second electrode. Moreover, in some embodiments, a first dielectric layer is positioned between the first electrode and the light emitting composite layer, and a second dielectric layer is positioned between the second electrode and the light emitting composite layer. The light emitting composite layer can comprise any light emitting composite layer described in Section I(C)(i)-(ii) herein.

A dielectric layer of an optoelectronic device having a FIPEL architecture described herein can comprise any insulating material not inconsistent with the objectives of the present invention. For example, in some embodiments, a dielectric layer comprises one or more inorganic oxides. In some embodiments, an inorganic oxide comprises a transition metal oxide, alumina ($Al_2O_3$), silica ($SiO_2$) or mixtures thereof.

In some embodiments, a dielectric layer comprises one or more polymeric materials. In some embodiments, suitable polymers for use in a dielectric layer comprise fluorinated polymers such as polyvinylidene fluoride (PVDF), poly(vinylidene fluoride-trifluoroethylene) (PVDF-TrFE), poly(vinyl fluoride) (PVF), polytetrafluoroethylene (PTFE), perfluoropropylene, polychlorotrifluoroethylene (PCTFE), or copolymers and combinations thereof. In some embodiments, a dielectric polymeric material comprises one or more polyacrylates such as polyacrylic acid (PAA), poly(methacrylate) (PMA), poly(methylmethacrylate) (PMMA), or copolymers and combinations thereof. In some embodiments, a dielectric polymeric material comprises polyethylenes, polypropylenes, polystyrenes, poly(vinylchloride)s, polycarbonates, polyamides, polyimides, or copolymers and combinations thereof. Polymeric dielectric materials described herein can have any molecular weight ($M_w$) and polydispersity not inconsistent with the objectives of the present invention.

In some embodiments, a dielectric layer further comprises nanoparticles. In some embodiments, nanoparticles of a dielectric layer can comprise any nanoparticles described in Section I herein. In some embodiments, nanoparticles are present in the dielectric layer in an amount less than about 0.5 weight percent or less than about 0.1 weight percent. In some embodiments, nanoparticles are present in the dielectric layer in an amount ranging from about 0.01 weight percent to about 0.1 weight percent.

Moreover, in some embodiments, an electrically insulating material of a dielectric layer is selected based on its dielectric constant and/or breakdown voltage. For instance, in some embodiments, an insulating material of a dielectric layer has a high dielectric constant and/or a high breakdown voltage. In addition, a dielectric layer described herein can have any thickness not inconsistent with the objectives of the present invention.

An electrically insulating layer or dielectric layer of a FIPEL architecture can have any desired thickness not inconsistent with the objectives of the present invention. In some embodiments, an electrically insulating or dielectric layer has a thickness ranging from about 1 μm to about 50 μm. In some embodiments, an electrically insulating layer has a thickness ranging from about 10 μm to about 30 μm. In some embodiments, an electrically insulating layer has a thickness less than about 1 μm or greater than about 50 μm.

In some embodiments, an optoelectronic device having a FIPEL architecture described herein comprises a plurality of light emitting composite organic layers having one or more constructions. In some embodiments, one or more of the light emitting composite organic layers has a construction described in Section I herein. In some embodiments, the light emitting composite organic layers are separated from one another by one or more dielectric layers. Moreover, in some embodiments, the light emitting composite organic layers can be constructed with reference to one another or independently of one another. For example, in some embodiments, light emitting composite organic layers can have overlapping or partially overlapping emission profiles. In some embodiments, light emitting composite organic layers do not have overlapping emission profiles. In some embodiments, the emission profiles of the light emitting composite organic layers can be chosen to produce a desired color emitted from the FIPEL.

In addition, an optoelectronic device having a FIPEL architecture described herein, in some embodiments, has an operating voltage of 120 VAC+/−10%. In some embodiments, a FIPEL has an operating voltage ranging from about 10 VAC to about 220 VAC. In some embodiments, a FIPEL has an operating voltage ranging from about 20 VAC to about 440 VAC. In some embodiments, a FIPEL has an operating voltage ranging from about 5 VAC to about 1000 VAC. In some embodiments, the operating voltage of a FIPEL described herein is selected with reference to the thickness of one or more layers of the FIPEL, including the thickness of one or more dielectric layers present in the architecture.

Moreover, in some embodiments, the frequency of the electric field applied to a FIPEL having a construction described herein ranges from about 10 Hz to about 1 GHz or from about 50 Hz to about 1 MHz. In some embodiments, the frequency of the applied electric field ranges from about 100 Hz to about 100 kHz or from about 500 Hz to about 50 kHz. In some embodiments, the frequency of the applied electric field ranges from about 1 kHz to about 10 kHz. Further, in some embodiments, an optoelectronic device described herein of a FIPEL architecture has a luminance demonstrating a non-linear response to changes in the frequency of an alternating electric field applied by the first and second electrodes. For example, in some embodiments, a FIPEL has a luminance displaying a quadratic response to changes in the frequency of the applied alternating electric field.

II. Organic Light Emitting Diodes

In another aspect, optoelectronic devices described herein demonstrate an OLED architecture. In some embodiments, an OLED comprises a first electrode, a second electrode and a light emitting composite organic layer disposed between the first electrode and the second electrode, the light emitting composite organic layer comprising a singlet emitter phase, a triplet emitter phase and a nanoparticle phase. In some embodiments, the singlet emitter phase, the triplet emitter phase and/or nanoparticle phase of an OLED can comprise any of the compositional constructions recited for the same in Section I(C) hereinabove and have any of the properties described for the same recited in Section I(C) hereinabove. In some embodiments, for example, the singlet emitter phase can comprise any conjugated polymeric species described in Section I(C)(i)-(ii) hereinabove, the triplet emitter phase can comprise any triplet species described in Section I(C)(i)-(ii) hereinabove, and the nanoparticle phase can comprise any nanoparticle species described in Section I(C)(i)-(ii) hereinabove.

In some embodiments, an OLED described herein comprises a plurality of light emitting composite layers positioned between the first and second electrodes. For example, in some embodiments, a plurality of light emitting layers, each having a construction described in Section(s) I(C)(i)-(ii) herein, are positioned between the first and second electrodes. The light emitting layers can have various emission profiles that, when combined, provide the desired emission profile characteristics from the OLED.

In some embodiments, the first electrode and/or second electrode of an OLED is radiation transmissive. The first electrode and/or the second electrode, in some embodiments, can have any construction and/or properties recited for a first and second electrode in Section I(A)-(B) hereinabove.

Moreover, in some embodiments, OLEDs described herein further comprise one or more hole transport, hole blocking, electron transport and/or electron blocking layers. As described herein, in some embodiments, nanoparticles of the nanoparticle phase are associated with phosphorescent transition metal complexes of the triplet emitter phase. In some embodiments, for example, nanoparticles are bonded to phosphorescent transition metal complexes of the triplet emitter phase.

Figure 4:
FIG. 4 illustrates a cross-sectional view of an optoelectronic device according to one embodiment described herein.

FIG. 4 illustrates a cross-sectional view of an optoelectronic device having an OLED architecture according to one embodiment described herein. As illustrated in FIG. 4, the OLED (40) comprises a radiation transmissive first electrode (41) and a second electrode (42). A light emitting composite organic layer (43) is disposed between the radiation transmissive first electrode (41) and the second electrode (42).

III. Lighting Properties of Optoelectronic Devices

In some embodiments, an optoelectronic device having a FIPEL or OLED architecture described herein has an efficiency of at least about 10 lumens per watt (LPW). In some embodiments, a FIPEL and/or OLED described herein has an efficiency of at least about 50 LPW or at least about 100 LPW. A FIPEL and/or OLED described herein, in some embodiments, has an efficiency of at least about 150 LPW or 200 LPW. In some embodiments, a FIPEL and/or OLED described herein has an efficiency ranging from about 10 LPW to about 200 LPW or from about 50 LPW to about 100 LPW. In some embodiments, a FIPEL and/or OLED described herein has an efficiency ranging from about 50 LPW to about 150 LPW or from about 100 LPW to 150 LPW. In some embodiments, a FIPEL and/or OLED described herein has an efficiency ranging from about 100 LPW to about 200 LPW or from about 150 LPW to about 200 LPW. Moreover, in some embodiments, an optoelectronic device having a FIPEL or OLED architecture described herein can have a lifetime enhanced by about 10 percent to about 1000 percent.

Further, in some embodiments, a FIPEL and/or OLED described herein has a luminance of at least about 10 $cd/m^2$ or at least about 50 $cd/m^2$. In some embodiments, a FIPEL and/or OLED described herein has a luminance of at least about 100 $cd/m^2$ or at least about 200 $cd/m^2$. In some embodiments, a FIPEL and/or OLED described herein has a luminance of at least about 300 $cd/m^2$, at least about 500 $cd/m^2$, at least about 1000 $cd/m^2$ or at least about 1500 $cd/m^2$. In some embodiments, a FIPEL and/or OLED described herein has a luminance ranging from about 200 $cd/m^2$ to about 1000 $cd/m^2$, from about 500 $cd/m^2$ to about 1500 $cd/m^2$, from about 500 $cd/m^2$ to about 10,000 $cd/m^2$, or from about 1000 $cd/m^2$ to about 40,000 $cd/m^2$.

Moreover, FIPEL and/or OLED optoelectronic devices described herein, in some embodiments, can have any electroluminescent emission profile not inconsistent with the objectives of the present invention. In some embodiments, for instance, a device has an electroluminescent emission having coordinates substantially in the white light region of the 1931 CIE Chromaticity Diagram. In some embodiments, a FIPEL and/or OLED has an electroluminescent emission having coordinates substantially in other color regions of the 1931 CIE Chromaticity Diagram, such as the red light region, the blue light region, the green light region, the orange light region, or the yellow light region.

Further, in some embodiments, a FIPEL and/or OLED optoelectronic device described herein comprising a singlet emitter phase and a triplet emitter phase demonstrates singlet and triplet emission in the emission profile. In some embodiments, the singlet emission and triplet emission from a light emitting composite layer described herein is substantially equal or substantially balanced. In some embodiments, for example, a light emitting layer comprising a singlet emitter phase and a triplet emitter phase in any amount provided in Table III hereinabove, demonstrates singlet emission and triplet emission in the emission profile. In one embodiment, a light emitting composite layer comprising a triplet emitter phase in an amount greater than or equal to about 10 weight percent demonstrates singlet emission and triplet emission in the emission profile. As described further herein, in such embodiments, the singlet and triplet emission can be substantially balanced.

IV. Methods of Making Optoelectronic Devices

In another aspect, methods of making optoelectronic devices are described herein. In some embodiments, a method of making an optoelectronic device comprises providing a first electrode, providing a second electrode and disposing a composite light emitting layer between the first electrode and the second electrode. As described further herein, the light emitting composite layer can demonstrate a variety of constructions. In some embodiments, for example, the light emitting composite layer can have any construction and/or properties recited for a light emitting composite layer in Section I(C)(i)-(ii) hereinabove.

In some embodiments, the first electrode and/or the second electrode is radiation transmissive. Additionally, in some embodiments, a method described herein further comprises disposing a dielectric layer between the first electrode and the light emitting composite layer, or disposing a dielectric layer between the second electrode and the light emitting composite layer. In some embodiments, a first dielectric layer is disposed between the light emitting composite layer and the first electrode, and a second dielectric layer is disposed between the second electrode and the light emitting composite layer. Dielectric layers suitable for use in methods described herein, in some embodiments, can have any construction and/or properties recited in Section I(D) hereinabove.

In some embodiments, a method of making an optoelectronic device comprises disposing a luminescent phase in a dielectric or electrically insulating host to provide a light emitting composite layer and disposing the light emitting composite layer between a first electrode and a second electrode. In some embodiments, the first electrode and/or the second electrode is radiation transmissive. The luminescent phase, in some embodiments, comprises a conjugated polymer, a semiconducting polymer, small molecules or nanoparticles or mixtures thereof. Additionally, in some embodiments, a dielectric layer or electrically insulating layer is positioned between the light emitting composite layer and first and/or second electrode.

Some embodiments described herein are further illustrated in the following non-limiting examples.

EXAMPLE 1

Purified Single-Walled Carbon Nanotubes (SWNTs)

Purified SWNTs having a controlled length for use in an optoelectronic device described herein were prepared as follows.

Metal catalyst was removed from raw SWNTs as follows. A mixture of HiPC®-SWNTs (High Pressure CO Conversion SWNTs, 100 mg, Rice University), nitric acid (70 wt %, 200 mL), DI water (>18M ohm, 400 mL), and surfactant (Triton X-100, 0.05 mL) was refluxed at 100° C. for 6 hours. The mixture was refluxed in a round-bottom flask equipped with a reflux tower and a heating mantle (Glas-Col, 115 V 270 W, equipped with Staco Energy Products power supply, Model 3PN1010B). After refluxing, DI water (400 mL) was added to the mixture, and the mixture was quickly placed in a refrigerator to cool the mixture below room temperature. The cooled mixture was then filtered by vacuum filtration using a 47 mm diameter, 0.2 μm pore size PTFE (polytetrafluoroethylene) membrane. The filtrand residue (hereinafter "A6-SWNT") was rinsed with DI water (1000 mL) and dried, while still on the filter, at 70° C. for 4 hours or more. The A6-SWNT was then removed from the filter and dried at 100° C. under $N_2$ for 1 hour.

The length of the tubes was controlled as follows. First, A6-SWNTs (5 mg) and DI water (>18M ohm, 10 mL) were added to a flask and mixed for 15 minutes. Nitric acid (70 wt %, 20 mL) and sulfuric acid (98 wt %, 60 mL) were then added to the mixture. The mixture was then ultrasonicated in a sonicator (Cole Parmer Model 08849-00) for 24 hours at 30-40° C. to cut the A6-SWNTs. To maintain the flask temperature during ultrasonication, the flask was cooled by a continuous flow of water through the sonicator bath. The mixture of cut A6-SWNTs was then transferred to a flat bottom flask equipped with a stirrer. To the flask, $H_2O_2$ (30 wt %, 12 mL) was added, and the mixture was stirred on a stir plate for 20 minutes. The mixture was then filtered by vacuum filtration using a 47 mm diameter, 0.2 μm pore size PTFE membrane. The filtrand residue was rinsed with DI water (1000 mL) and dried, while still on the filter, at 70° C. for 4 hours or more. The SWNT filtrand was then removed from the filter and combined with DI water (1000 mL). This mixture was then ultrasonicated for 20 minutes and again filtered by vacuum filtration using a 47 mm diameter, 0.2 μm pore size PTFE membrane. The SWNT filtrand was dried, while still on the filter, at 70° C. for 4 hours or more, then removed from the filter, and further dried at 100° C. under $N_2$ for 1 hour, producing purified SWNTs having a length reduced to less than about 200 nm.

EXAMPLE 2

Optoelectronic Devices of a FIPEL Architecture

A series of optoelectronic devices having a FIPEL architecture according to some embodiments described herein was fabricated as follows.

First, an ITO-glass substrate was prepared for each device. The ITO-glass substrate consisted of a square substrate (25.4 mm×25.4 mm) of 0.7 mm thick soda lime glass partially coated with a 150 nm thick layer of ITO (indium tin oxide). The ITO layer covered a 25.4 mm×15.9 mm portion of the glass substrate. The uncoated, "glass" portion of the substrate was polished to a surface roughness of <5 nm $R_a$. The coated, "ITO" portion of the substrate was polished to a surface roughness of <3 nm $R_a$. The ITO portion had a resistivity of less than 10 ohm/sq. The ITO-glass substrate had a transparency greater than 95% at 555 nm.

Second, the ITO-glass substrate was cleaned as follows. A stream of high purity (>99.99%) $N_2$ gas was blown onto the substrate from a tank equipped with a CGA 580 regulator. The substrate was then placed in a polypropylene substrate carrier. The substrate and substrate carrier were placed in a glass dish. The glass dish was placed in an ultrasonicator (Branson 3510). Acetone was then added to the glass dish, covering the substrate. Ultrasonic cleaning was then carried out for 15 minutes or longer. The acetone solvent in the dish was then replaced with methanol, and ultrasonic cleaning was carried out for an additional period of 15 minutes or longer. The methanol solvent in the dish was then replaced with IPA (isopropylalcohol, High Performance Liquid Chromatography (HPLC) grade), and ultrasonic cleaning was carried out for an additional period of 15 minutes or longer. The substrate was then removed from the dish, and a stream of high purity (>99.99%) $N_2$ gas at a pressure of 30 psi or more was used to dry the substrate. The dried substrate was then placed flat in a UV-ozone cleaner (UVOCS Inc., Model T16X16/OES), with the functional side of the substrate facing upwards, and cleaned for 60 minutes or longer.

Third, a light emitting composite organic layer was coated onto each cleaned ITO-glass substrate. The light emitting composite organic layer was spin coated from a solution of polystyrene (PS) and polyfluorene (PFO) in chlorobenzene (8 mg/mL). PFO was obtained from American Dye Source of Quebec, Canada. To form a series of optoelectronic devices, the ratio of PS to PFO was varied. For each device, the ratio was 4:1, 3:1, 2:1, 1:1, 1:2, 1:3 or 1:4. Prior to spin coating, each PS:PFO solution was filtered through a 13 mm diameter, 0.2 μm pore size nylon syringe filter. Spin coating was carried out using a spin coater (Chemat Technology KW-4A) operating at 2000 rpm for 60 seconds. Each coated substrate was placed in a petri dish on a hot plate and cured at 90° C. for 60 minutes under dry $N_2$.

Fourth, a dielectric layer or electrically insulating layer was coated onto the light emitting composite organic layer of each device. The dielectric layer was spin coated from a solution of PVDF-TrFE in dimethylformamide (DMF). For each device, the concentration of the PVDF-TrFE in DMF was 10%, 15% or 20% by weight. Spin coating was carried out using a spin coater operating at 1500 rpm for 60 seconds for PVDF-TrFE concentrations of 10, 15, and 20%.

Fifth, a metal cathode layer was deposited on the dielectric layer. The substrate was placed in a vacuum evaporator for deposition of Al (150-250 nm thick). Aluminum (>99.999%) was deposited at 0.4 to 0.7 nm/sec at a pressure of $5 \times 10^{-5}$ to $5 \times 10^{-6}$ Torr.

Sixth, each device was sealed with a glass cap. The glass cap (0.7-1.1 mm thick) was first cleaned with ultrasonic cleaning in acetone for 15 minutes or more followed by ultrasonic cleaning in methanol for 15 minutes or more. The glass cap was then pre-assembled by applying (1) a dry chemical layer (CaO GDO, SAES Getters, 18 mm×10 mm×0.3-0.4 mm) to the inside surface of the glass cap and (2) a curable sealing glue (Three Bond, 30Y-436) to the bottom edge of the glass cap. The pre-assembled glass cap was then placed over the cathode on the substrate, and the sealing glue was cured by UV light (>6000 mJ/cm$^2$ emitted from an EFO UV light).

Table 4 shows the luminance of a series of optoelectronic devices fabricated as described above with a PS:PFO ratio of 1:1 and different amounts of PVDF-TrFE. The luminance was measured at turn-on voltages ($V_{pp}$) ranging from 0 to 8 V and frequencies ranging from 1 to 130 kHz. Blue light emission was induced at low frequency, and blue-green and green light emission was induced at high frequency.

TABLE 4

| PVDF-TrFE (%) | Luminance (cd/m$^2$) |
|---|---|
| 10 | 10 |
| 15 | 30 |
| 20 | 20 |

Table 5 shows the luminance and turn-on voltage for devices with a dielectric layer formed from 15% PVDF-TrFE and different ratios of PS:PFO in the composite organic layer.

TABLE 5

| | PS:PFO | | | | | | |
|---|---|---|---|---|---|---|---|
| | 1:1 | 2:1 | 3:1 | 4:1 | 1:2 | 1:3 | 1:4 |
| Luminance (cd/m$^2$) | 30 | 20 | 17 | 15 | 13 | 10 | 8 |
| Turn-on Voltage ($V_{pp}$) | 0.8 | 1.5 | 1.9 | 2 | 1.8 | 1.6 | 1.5 |

EXAMPLE 3

Optoelectronic Devices of a FIPEL Architecture

A series of optoelectronic devices having a FIPEL architecture according to some embodiments described herein was fabricated as follows.

An ITO-glass substrate was prepared and cleaned for each device as described in Example 2, Next, a light emitting composite organic layer was coated onto the ITO-glass substrate. The light emitting composite organic layer was spray coated from a solution of PS and PFO (1:1) in chlorobenzene (8 mg/mL). The solution also contained purified SWNTs of Example 1, providing a light emitting composite organic layer comprising 0.01 weight percent SWNTs. The coated substrate was placed in a petri dish on a hot plate and cured at 90° C. for 60 minutes under dry N$_2$.

Next, a dielectric layer was coated onto the light emitting organic layer. The dielectric layer was spin coated from a solution of 15% PVDF-TrFE in DMF. To obtain a series of devices having different dielectric layer thicknesses, spin coating was carried out using a spin coater operating at different speeds, ranging from 1000 rpm to 1500 rpm. An aluminum cathode layer was then deposited on the dielectric layer as described in Example 2, followed by sealing of the device with a glass cap.

Figure 5:
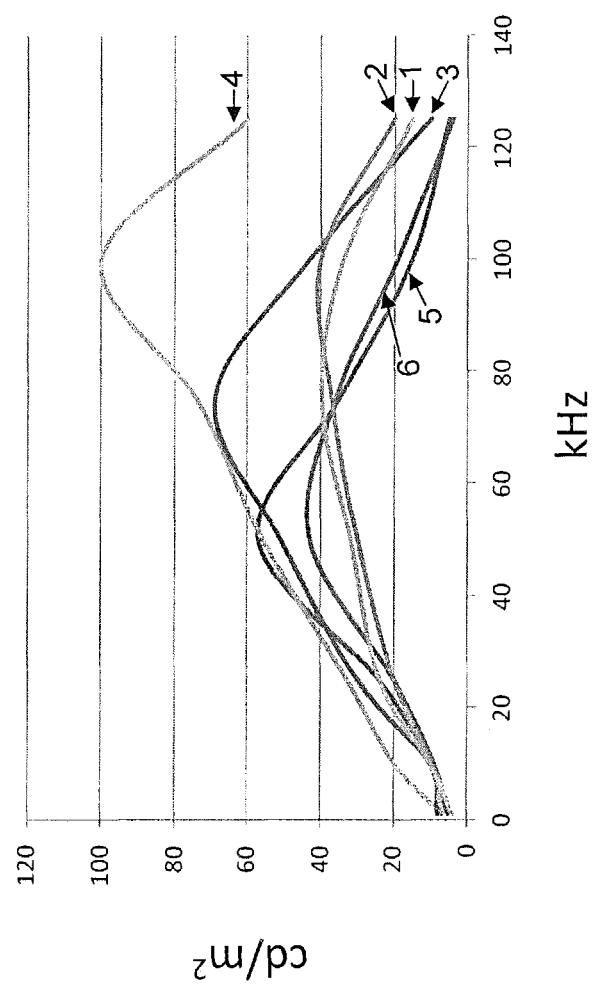
FIG. 5 illustrates the frequency-dependent luminance of a series of optoelectronic devices having different dielectric layer thicknesses according to some embodiments described herein.

FIG. 5 illustrates the frequency-dependent luminance of a series of optoelectronic devices having different dielectric layer thicknesses. The dielectric layer of the device associated with curve 1 was spin coated at 1000 rpm. The dielectric layers of the devices associated with curves 2, 3, 4, 5 and 6 were spin coated at 1100 rpm, 1200 rpm, 1300 rpm, 1400 rpm and 1500 rpm, respectively.

EXAMPLE 4

Optoelectronic Devices of a FIPEL Architecture

A series of optoelectronic devices having a FIPEL architecture according to some embodiments described herein was fabricated as follows.

An ITO-glass substrate was prepared and cleaned for each device as described in Example 2. Then, a light emitting composite organic layer was coated onto the ITO-glass substrate of each device as described in Example 3.

Next, a dielectric layer was coated onto the light emitting organic layer. The dielectric layer was spin coated from a solution of 15% PVDF-TrFE in DMF. The solution also contained purified SWNTs of Example 1, providing a dielectric layer comprising 0.01 weight percent purified SWNTs. To obtain a series of devices having different dielectric layer thicknesses, spin coating was carried out using a spin coater operating at different speeds, ranging from 1000 rpm to 1500 rpm. An aluminum cathode layer was then deposited on the dielectric layer as described in Example 2, followed by sealing of the device with a glass cap.

Figure 6:
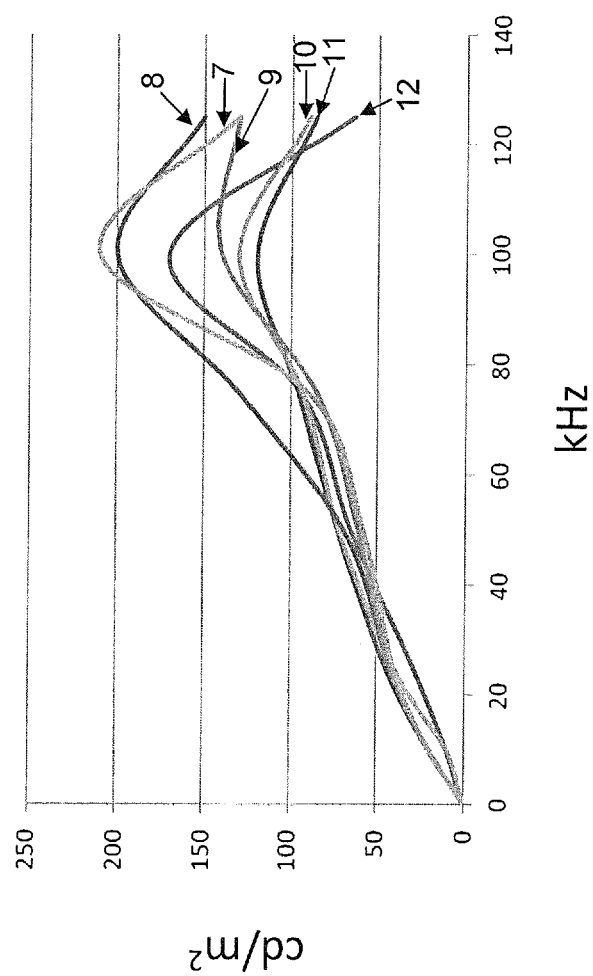
FIG. 6 illustrates the frequency-dependent luminance of a series of optoelectronic devices having different dielectric layer thicknesses according to some embodiments described herein.

FIG. 6 illustrates the frequency-dependent luminance of a series of optoelectronic devices having different dielectric layer thicknesses. The dielectric layer of the device associated with curve 7 was spin coated at 1000 rpm. The dielectric layers of the devices associated with curves 8, 9, 10, 11 and 12 were spin coated at 1100 rpm, 1200 rpm, 1300 rpm, 1400 rpm and 1500 rpm, respectively.

EXAMPLE 5

Optoelectronic Device of a FIPEL Architecture

An optoelectronic device having a FIPEL architecture according to an embodiment described herein was fabricated as follows.

An ITO-glass substrate was prepared and cleaned for the device as described in Example 2. Next, a dielectric layer was coated onto the cleaned ITO substrate. The dielectric layer was spin coated from a solution of 15% PVDF-TrFE in DMF at 1500 rpm for 60 seconds. A light emitting composite organic layer was subsequently spin coated onto the dielectric layer at 1500 rpm for 60 seconds using a solution of PS and conjugated polymer [PF-BT-QL] described in PCT/US2011/043690 (1:1) in chlorobenzene (6 mg/mL). The solution also contained purified SWNTs of Example 1 to provide 0.1 weight percent of the SWNTs in the deposited light emitting composite organic layer. The resulting architecture was placed in a petri dish on a hot plate and cured at 90° C. for 60 minutes under dry $N_2$. An aluminum cathode layer was then deposited on the light emitting organic layer under conditions described in Example 2, followed by sealing of the FIPEL device with a glass cap.

Figure 7:
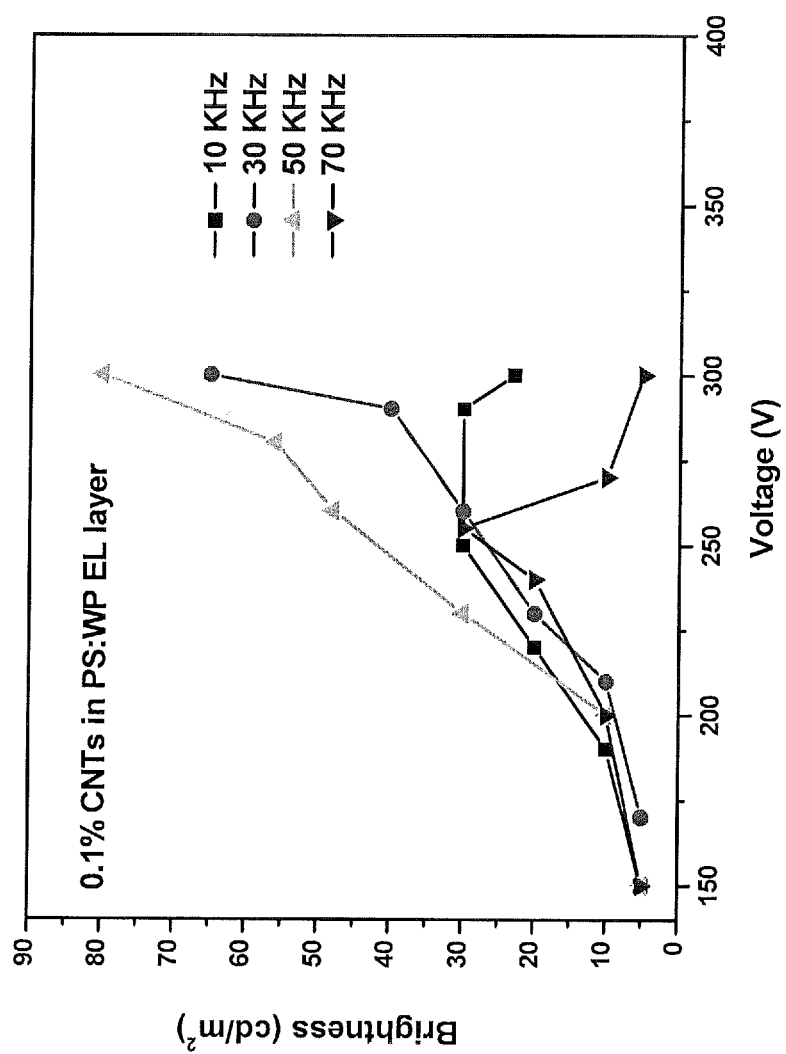
FIG. 7 illustrates luminance of a FIPEL device according to varied operating voltages and electric field frequencies in one embodiment described herein.

FIG. 7 illustrates luminance of the resulting FIPEL device according to varied operating voltages and electric field frequencies.

EXAMPLE 6

Optoelectronic Device of a FIPEL Architecture

An optoelectronic device having a FIPEL architecture according to an embodiment described herein was fabricated as follows.

An ITO-glass substrate was prepared and cleaned for the device as described in Example 2. Next, a dielectric layer was coated onto the cleaned ITO substrate. The dielectric layer was spin coated from a solution of 15% PVDF-TrFE in DMF at 1500 rpm for 60 seconds. The solution also contained purified SWNTs of Example 1 to provide 0.01 weight percent of the SWNTs in the deposited dielectric layer.

A light emitting composite organic layer was subsequently spin coated onto the dielectric layer at 1500 rpm for 60 seconds using a solution of PS and conjugated polymer [PF-BT-QL] described in PCT/US2011/043690 (1:1) in chlorobenzene (6 mg/mL). The solution also contained purified SWNTs of Example 1 to provide 0.1 weight percent of the SWNTs in the deposited light emitting composite organic layer. The solution also contained Ir(ppy)$_3$ in an amount to provide 10 weight percent of the Ir(ppy)$_3$ in the deposited light emitting composite organic layer. The resulting architecture was placed in a petri dish on a hot plate and cured at 90° C. for 60 minutes under dry $N_2$. An aluminum cathode layer was then deposited on the light emitting organic layer under conditions described in Example 2, followed by sealing of the FIPEL device with a glass cap.

Figure 8:
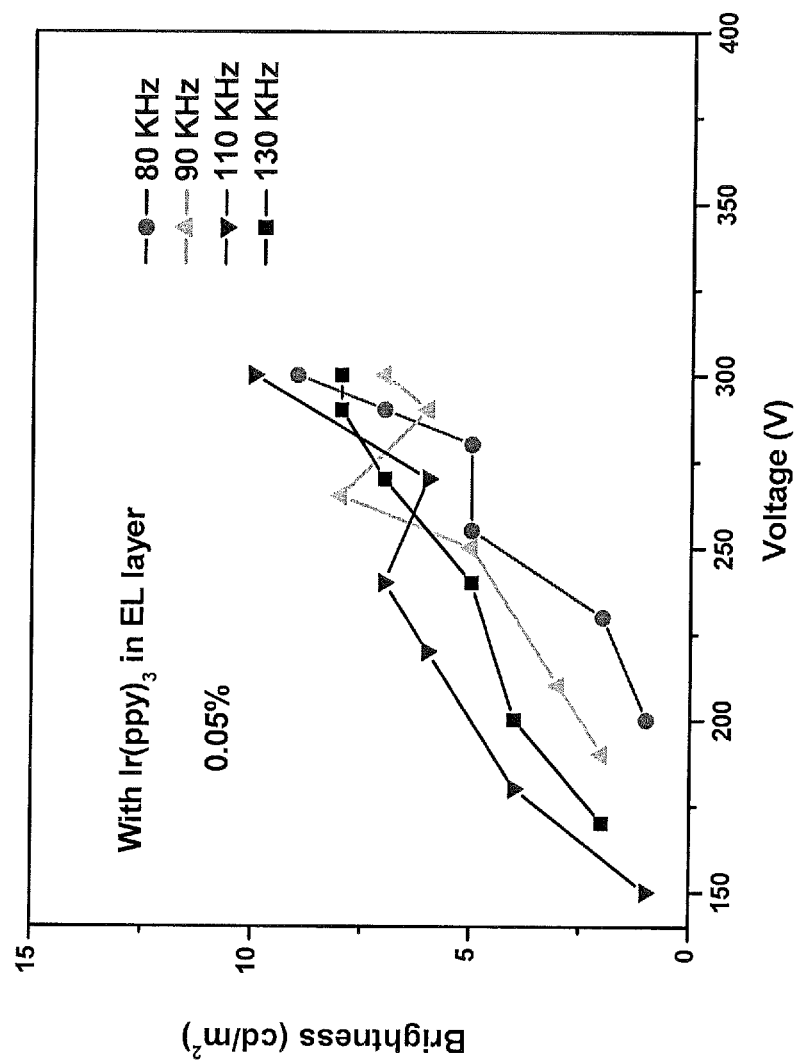
FIG. 8 illustrates luminance of a FIPEL device according to varied operating voltages and electric field frequencies in one embodiment described herein.

FIG. 8 illustrates luminance of the resulting FIPEL device according to varied operating voltages and electric field frequencies.

EXAMPLE 7

Optoelectronic Device of a FIPEL Architecture

An optoelectronic device having a FIPEL architecture according to an embodiment described herein was fabricated as follows.

An ITO-glass substrate was prepared and cleaned as described in Example 2. Next, a PEDOT buffer layer was coated onto the cleaned ITO-glass substrate. The buffer layer was spin coated from a solution of 6 parts (by volume) PEDOT/PSS (poly(3,4-ethylenedioxythiophene)poly(styrenesulfonate), Baytron #8000) and 4 parts (by volume) deionized (DI) water (>18M ohm). For spin coating, the solution was filtered through a 13 mm diameter, 0.2 μm pore size nylon syringe filter. Spin coating was carried out using a spin coater (Chemat Technology KW-4A) operating at 4000 rpm for 15 seconds, for a target layer thickness of 40 nm. The coated substrate was placed in a petri dish on a hot plate (Corning) and cured at 200° C. for 5 minutes in air. The petri dish and substrate were then placed in a desiccator with a dry $N_2$ atmosphere to cool to room temperature to complete the annealing process.

A PFO/SWNT emitting layer was coated onto the buffer layer by spin coating from a solution of purified SWNTs and PFO. The SWNTs were purified in accordance with Example 1. The solution of purified SWNTs and PFO for spin coating was prepared as follows. In a dry $N_2$ atmosphere glove box, 1,2-dicholorbenzene (anhydrous, HPLC grade) solvent, PFO (0.015 wt %), and purified SWNTs (0.0015 wt %) were combined and ultrasonicated for 60 minutes. Additional PFO was then added to the mixture to increase the total amount of PFO to 1.5 wt %. To weigh the PFO, a balance specialized for use under varying pressures (Mettler Toledo SAG204) was used. The mixture was then stirred in a vial equipped with a magnetic stir bar at 50° C. for 30 minutes. The PFO/SWNT mixture was then cooled to room temperature and filtered through a 0.45 μm teflon syringe filter for spin coating.

Spin coating was carried out in the glove box using a spin coater (Specialty Coating Systems, Inc., Model P6700) operating at 4000 rpm for 15 seconds, for a target layer thickness of 80 nm. The coated substrate was placed in a petri dish on a hot plate and cured at 90° C. for 60 minutes under dry $N_2$.

A metal cathode layer was subsequently deposited on the emitting layer. The substrate was placed in a vacuum evaporator for sequential deposition of LiF (up to 0.5 nm thick) and Al (150-250 nm thick). Lithium fluoride (>99.999%) was deposited at 0.02 nm/sec at a pressure of $5\times10^{-5}$ to $5\times10^{-6}$ Torr. Aluminum (>99.999%) was deposited at 0.4 to 0.7 nm/sec at a pressure of $5\times10^{-5}$ to $5\times10^{-6}$ Torr.

The device was sealed with a glass cap. The glass cap (0.7-1.1 mm thick) was first cleaned with ultrasonic cleaning in acetone for 15 minutes or more followed by ultrasonic cleaning in methanol for 15 minutes or more. The glass cap was then pre-assembled by applying (1) a dry chemical layer (CaO GDO, SAES Getters, 18 mm×10 mm×0.3-0.4 mm) to the inside surface of the glass cap and (2) a curable sealing glue (Three Bond, 30Y-436) to the bottom edge of the glass cap. The pre-assembled glass cap was then placed over the cathode on the substrate, and the sealing glue was cured by UV light (>6000 mJ/cm$^2$ emitted from an EFO UV light).

EXAMPLE 8

Optoelectronic Device of a FIPEL Architecture

An optoelectronic device having a FIPEL architecture according to an embodiment described herein was fabricated as follows.

An ITO-glass substrate was prepared and cleaned for the device as described in Example 2. A light emitting composite organic layer was subsequently spin coated onto the ITO-glass substrate using a solution of conjugated polymer [PF-BT-QL] described in PCT/US2011/043690 in chlorobenzene (6 mg/mL) to provide a layer thickness of 100-200 nm. The solution also contained purified SWNTs of Example 1 to provide 0.07 weight percent of the SWNTs in the deposited light emitting composite organic layer. The solution also contained Ir(ppy)$_3$ in an amount to provide 10 weight percent of the Ir(ppy)$_3$ in the deposited light emitting composite organic layer. The resulting architecture was placed in a petri dish on a hot plate and cured at 90° C. for 60 minutes under dry $N_2$.

Next, a dielectric layer was coated onto the light emitting organic layer. The dielectric layer was spin coated from a solution of 15% PVDF-TrFE in DMF using a spin coater operating at 1500 rpm for 60 seconds. An aluminum cathode layer was then deposited on the dielectric layer as described in Example 2, followed by sealing of the device with a glass cap.

Figure 9:
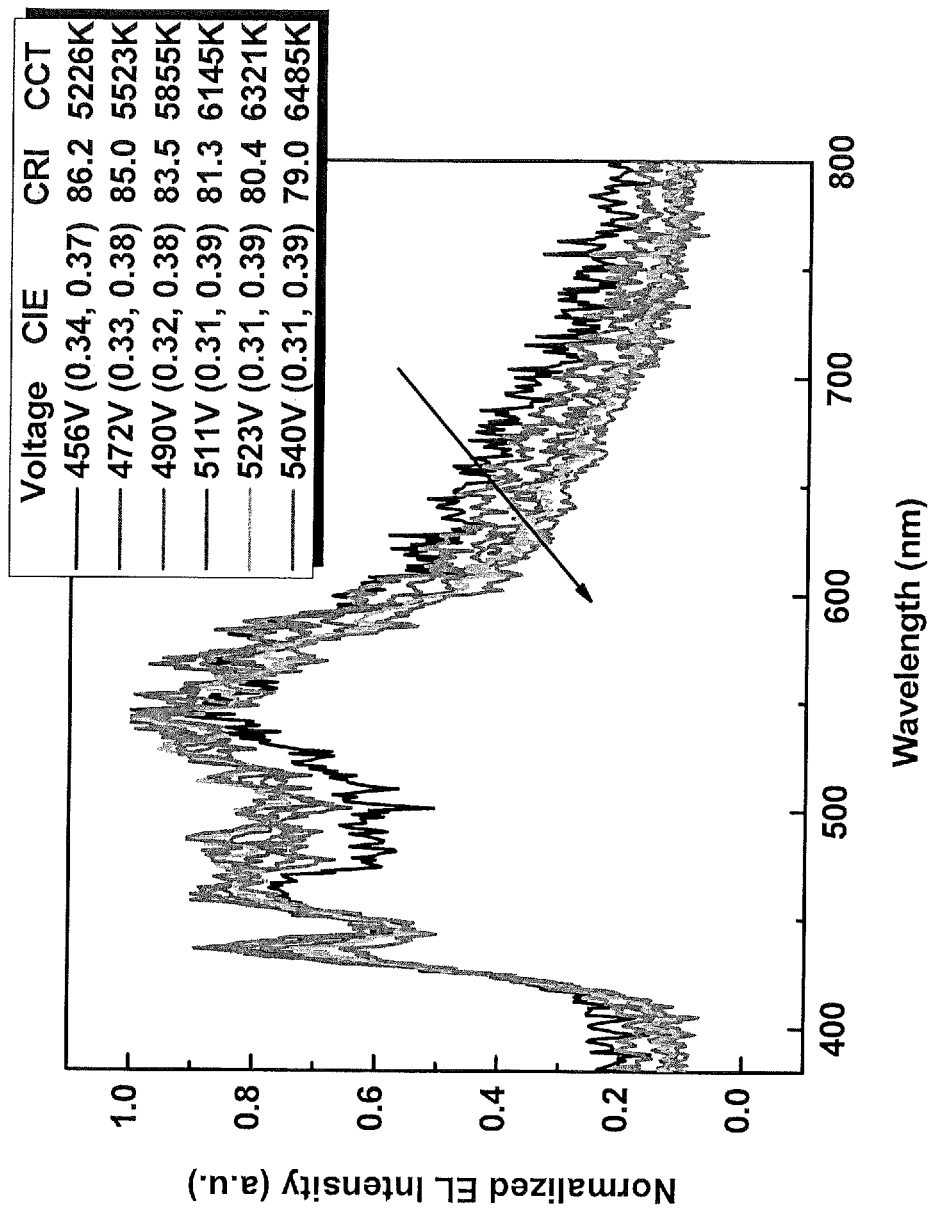
FIG. 9 illustrates electroluminescent emission properties of a FIPEL device according to one embodiment described herein.

FIG. 9 illustrates electroluminescent properties of the optoelectronic device having the foregoing architecture. As illustrated in FIG. 9, the optoelectronic device provides emission from the singlet conjugated polymer phase ([PF-BT-QL]) and the triplet phase Ir(ppy)$_3$. Emission from the singlet and triplet phases is substantially balanced. FIG. 9 additionally provides the CIE coordinates, color rendering index (CRI) and correlated color temperature (CCT) of the optoelectronic device at various operating voltages.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. An optoelectronic device comprising:
   a first electrode;
   a second electrode;
   a light emitting composite organic layer disposed between the first electrode and the second electrode, the light emitting composite organic layer comprising a singlet emitter phase, a triplet emitter phase, and a nanoparticle phase; and
   a first dielectric layer disposed between the light emitting composite organic layer and the first electrode or the second electrode,
wherein the nanoparticle phase comprises carbon nanotubes, fullerenes, graphene or mixtures thereof.

2. The optoelectronic device of claim 1, wherein the singlet emitter phase comprises one or more conjugated polymers or oligomers, small molecules or mixtures thereof.

3. The optoelectronic device of claim 2, wherein the one or more conjugated polymers or oligomers comprise a conjugated polymer or oligomer comprising at least two repeat units selected from the group consisting of repeating units A, B and C:

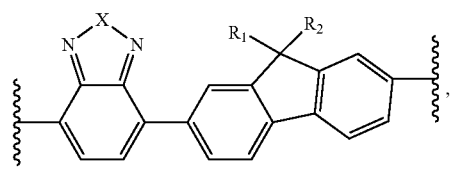
(A)

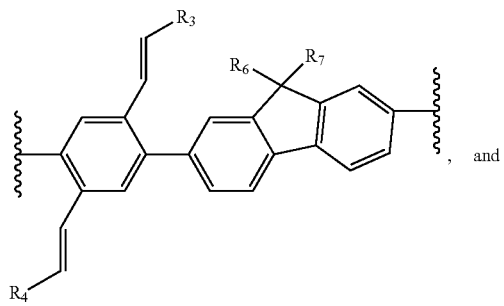
(B)

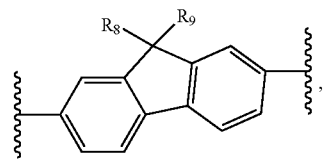
(C)

wherein ⸳ represents points of attachment in the polymer chain or oligomer chain, X is selected from the group consisting of S, O, Se and NR$_5$ and R$_1$, R$_2$, R$_5$, R$_6$, R$_7$, R$_8$ and R$_9$ are independently selected from the group consisting of hydrogen, C$_{1-20}$ alkyl, C$_{2-20}$ alkenyl, C$_{8-12}$ alkyl and C$_{8-12}$ alkenyl and R$_3$ and R$_4$ are independently selected from the group consisting of aryl and heteroaryl, wherein the alkyl and alkenyl of R$_1$, R$_2$, R$_5$, R$_6$, R$_7$, R$_8$ and R$_9$ and the aryl and heteroaryl of R$_3$ and R$_4$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

4. The optoelectronic device of claim 3, wherein R$_3$ and R$_4$ are independently selected from the group consisting of pyridyl, pyranyl, pyridinyl, bipyridinyl, phenylpyridinyl, thienyl, furanyl, selenophenyl, fluorenyl, carbazolyl, pyrrolyl, quinolinyl, isoquionolinyl, purinyl, oxazolyl and isoxazolyl and oligomers thereof.

5. The optoelectronic device of claim 3, wherein the conjugated polymer or oligomer is of Formula (I):

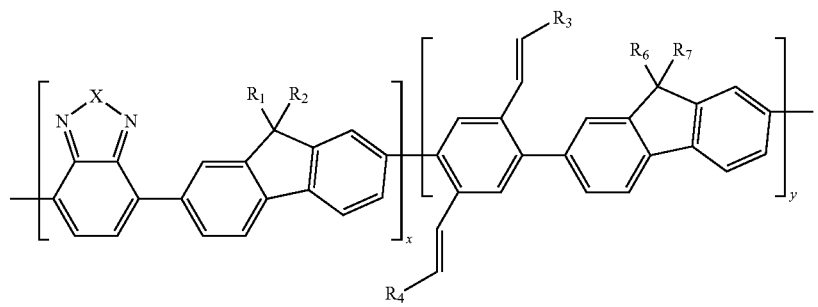

wherein x and y are integers independently ranging from 1 to 10,000.

6. The optoelectronic device of claim 3, wherein the conjugated polymer or oligomer is of Formula (II):

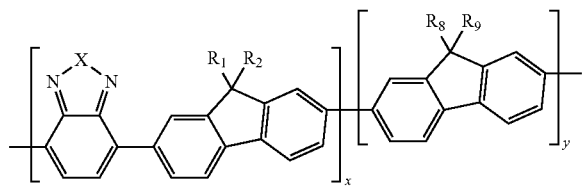

wherein x and y are integers independently ranging from 1 to 10,000.

7. The optoelectronic device of claim 3, wherein the conjugated polymer or oligomer is of Formula (III):

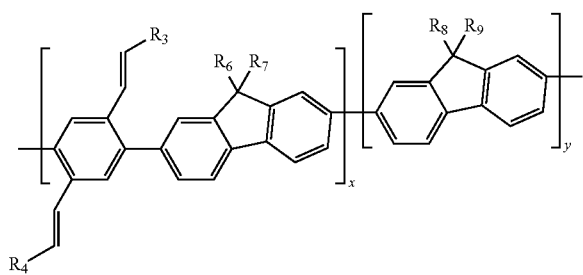

wherein x and y are integers independently ranging from 1 to 10,000.

8. The optoelectronic device of claim 3, wherein the conjugated polymer or oligomer is of Formula (IV):

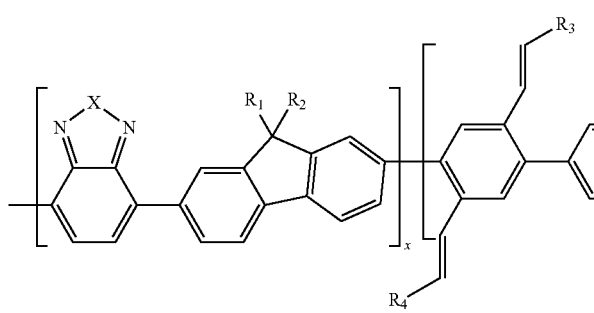

wherein x, y, and z are integers independently ranging from 1 to 10,000.

9. The optoelectronic device of claim 2, wherein the one or more conjugated polymers or oligomers comprises a structural unit of Formula (V):

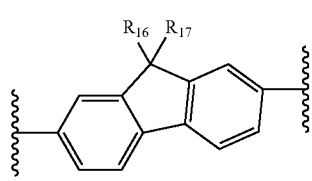

wherein $\xi$ represents points of attachment in the polymer chain or oligomer chain and $R_{16}$ and $R_{17}$ are independently selected from the group consisting of hydrogen, $C_{1-20}$ alkyl, $C_{2-20}$ alkenyl, $C_{8-12}$ alkyl and $C_{8-12}$ alkenyl and wherein the alkyl and alkenyl of $R_{16}$ and $R_{17}$ are optionally independently substituted one or more times with a substituent selected from the group consisting of -alkyl, -alkenyl, -aryl, -heteroaryl, -alkyl-aryl, -alkyl-heteroaryl, -alkenyl-aryl and -alkenyl-heteroaryl.

10. The optoelectronic device of claim 1, wherein the triplet emitter phase comprises a phosphorescent transition metal complex.

11. The optoelectronic device of claim 10, wherein the triplet emitter phase is dispersed in the singlet emitter phase.

12. The optoelectronic device of claim 1, wherein the light emitting composite organic layer comprises a dielectric host for the singlet emitter phase and the triplet emitter phase.

13. The optoelectronic device of claim 12, wherein the dielectric host is polymeric.

14. The optoelectronic device of claim 1, wherein the first electrode is radiation transmissive, and the second electrode is metal.

15. The optoelectronic device of claim 14, wherein the first dielectric layer is positioned between the second electrode and the light emitting composite organic layer.

16. The optoelectronic device of claim 15 further comprising a second dielectric layer positioned between the radiation transmissive first electrode and the light emitting composite organic layer.

17. The optoelectronic device of claim 1, wherein the emission profile of the device comprises emission from the singlet emitter phase and emission from the triplet emitter phase.

18. The optoelectronic device of claim 17, wherein the triplet emitter phase is present in the light emitting composite organic layer in an amount of at least about 10 percent by weight.

19. The optoelectronic device of claim 17, wherein the emission from the singlet emitter phase is substantially equal in intensity to emission from the triplet emitter phase.

* * * * *